(12) United States Patent
Mariani et al.

(10) Patent No.: US 11,695,072 B2
(45) Date of Patent: Jul. 4, 2023

(54) INTEGRATED ASSEMBLIES AND METHODS OF FORMING INTEGRATED ASSEMBLIES

(71) Applicant: Micron Technology, Inc., Boise, ID (US)

(72) Inventors: Marcello Mariani, Milan (IT); Giorgio Servalli, Fara Gera d'Adda (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/371,506

(22) Filed: Jul. 9, 2021

(65) Prior Publication Data

US 2023/0010846 A1 Jan. 12, 2023

(51) Int. Cl.
*H01L 29/78* (2006.01)
*H01L 21/82* (2006.01)
(Continued)

(52) U.S. Cl.
CPC .. *H01L 29/7827* (2013.01); *H01L 21/823487* (2013.01); *H01L 27/088* (2013.01);
(Continued)

(58) Field of Classification Search
CPC ......... H01L 29/7827; H01L 21/823487; H01L 27/088; H01L 29/41741; H01L 29/42392; H01L 29/516; H01L 29/78391
(Continued)

(56) References Cited

U.S. PATENT DOCUMENTS

| 8,344,517 B2 | 1/2013 | Kim et al. |
| 9,608,077 B1 | 3/2017 | Kye et al. |

(Continued)

FOREIGN PATENT DOCUMENTS

| JP | 2009-010424 | 1/2009 |
| KR | 2017-0028666 | 3/2017 |

(Continued)

OTHER PUBLICATIONS

Mariani, Marcello, et al., "Methods of Incorporating Leaker Devices into Capacitor Configurations to Reduce Cell Disturb, and Capacitor Configurations Incorporating Leaker Devices", U.S. Appl. No. 16/933,134, filed Jul. 20, 2020, 30 pages.

(Continued)

*Primary Examiner* — Sheikh Maruf
(74) *Attorney, Agent, or Firm* — Wells St. John P.S.

(57) ABSTRACT

Some embodiments include an integrated assembly having first and second pillars of semiconductor material laterally offset from one another. The pillars have source/drain regions and channel regions vertically offset from the source/drain regions. Gating structures pass across the channel regions, and extend along a first direction. An insulative structure is over regions of the first and second pillars, and extends along a second direction which is crosses the first direction. Bottom electrodes are coupled with the source/drain regions. Leaker-device-structures extend upwardly from the bottom electrodes. Ferroelectric-insulative-material is laterally adjacent to the leaker-device-structures and over the regions of the bottom electrodes. Top-electrode-material is over the ferroelectric-insulative-material and is directly against the leaker-device-structures. Some embodiments include methods of forming integrated assemblies.

40 Claims, 50 Drawing Sheets

(51) Int. Cl.
*H01L 29/423* (2006.01)
*H01L 21/8234* (2006.01)
*H01L 29/51* (2006.01)
*H01L 27/088* (2006.01)
*H01L 29/417* (2006.01)

(52) U.S. Cl.
CPC .. *H01L 29/41741* (2013.01); *H01L 29/42392* (2013.01); *H01L 29/516* (2013.01); *H01L 29/78391* (2014.09)

(58) Field of Classification Search
USPC ........................................................ 257/295
See application file for complete search history.

(56) References Cited

U.S. PATENT DOCUMENTS

| | | | |
|---|---|---|---|
| 10,062,745 | B2 | 8/2018 | Ramaswamy |
| 10,388,658 | B1 | 8/2019 | Ramaswamy |
| 10,622,366 | B2 | 4/2020 | Chavan et al. |
| 11,127,744 | B2 | 9/2021 | Servalli |
| 11,170,834 | B2 | 11/2021 | Mutch et al. |
| 2005/0164454 | A1 | 7/2005 | Leslie |
| 2006/0054958 | A1* | 3/2006 | Weis ................ H01L 27/10891 257/E21.651 |
| 2006/0113587 | A1 | 6/2006 | Thies |
| 2007/0228434 | A1 | 10/2007 | Shimojo |
| 2008/0035958 | A1* | 2/2008 | Asao ................ H01L 29/66666 257/E27.005 |
| 2008/0093644 | A1 | 4/2008 | Forbes |
| 2008/0296671 | A1* | 12/2008 | Takaishi ................ H01L 27/24 257/E21.654 |
| 2009/0242972 | A1* | 10/2009 | Cho ................ H01L 27/10876 257/329 |
| 2010/0052029 | A1* | 3/2010 | Huang .............. H01L 27/10876 257/E27.084 |
| 2011/0241170 | A1* | 10/2011 | Haeberlen ............. H01L 23/495 257/532 |
| 2012/0153371 | A1 | 6/2012 | Chen |
| 2012/0241826 | A1* | 9/2012 | Satoh ................ H01L 29/7827 257/295 |
| 2013/0302966 | A1 | 11/2013 | Oh et al. |
| 2014/0042535 | A1* | 2/2014 | Darwish ........... H01L 29/66727 257/334 |
| 2015/0041873 | A1* | 2/2015 | Karda ............... H01L 29/40111 257/295 |
| 2015/0123067 | A1 | 5/2015 | Lee |
| 2015/0171143 | A1* | 6/2015 | Park ........................ H01L 43/08 257/295 |
| 2015/0214278 | A1* | 7/2015 | Satoh ................ H01L 45/1233 257/295 |
| 2016/0020251 | A1* | 1/2016 | Kim ...................... H01L 27/228 257/295 |
| 2016/0049397 | A1* | 2/2016 | Chang ................. H01L 27/092 257/329 |
| 2016/0093611 | A1* | 3/2016 | Cheng .............. H01L 29/78642 257/329 |
| 2016/0276433 | A1* | 9/2016 | Holland ........... H01L 21/02609 |
| 2017/0222045 | A1* | 8/2017 | Leobandung ..... H01L 29/78642 |
| 2017/0236828 | A1 | 8/2017 | Karda et al. |
| 2017/0309322 | A1 | 10/2017 | Ramaswamy et al. |
| 2018/0122816 | A1 | 5/2018 | Ramaswamy |
| 2018/0197864 | A1 | 7/2018 | Silis |
| 2018/0197870 | A1 | 7/2018 | Balakrishnan et al. |
| 2019/0074363 | A1* | 3/2019 | Zhu .................... H01L 27/10873 |
| 2019/0148372 | A1* | 5/2019 | Miao .................. H01L 29/66666 257/329 |
| 2019/0148390 | A1* | 5/2019 | Frank .................. H01L 21/0228 257/295 |
| 2019/0189357 | A1 | 6/2019 | Chavan |
| 2019/0198667 | A1* | 6/2019 | Liu ......................... H01L 29/78 |
| 2019/0333917 | A1 | 10/2019 | Rarnaswamy |
| 2020/0111800 | A1 | 4/2020 | Ramaswamy |
| 2020/0203357 | A1 | 6/2020 | Chhajed et al. |
| 2020/0243267 | A1 | 7/2020 | Chavan et al. |
| 2020/0381290 | A1 | 12/2020 | Ramaswamy |
| 2020/0388619 | A1 | 12/2020 | Sukekawa et al. |
| 2020/0395437 | A1 | 12/2020 | Ramaswamy |
| 2021/0134816 | A1 | 5/2021 | Caideroni et al. |
| 2021/0183873 | A1 | 6/2021 | Goodwin et al. |
| 2021/0210491 | A1 | 7/2021 | Servalli |

FOREIGN PATENT DOCUMENTS

| | | |
|---|---|---|
| TW | I645539 | 12/2018 |
| TW | I671884 | 9/2019 |
| TW | 202025400 | 1/2020 |
| TW | I715007 | 1/2021 |
| WO | WO 2021/006989 | 1/2004 |
| WO | WO PCT/US2020/066285 | 4/2021 |
| WO | WO PCT/US2021/040018 | 10/2021 |
| WO | WO PCT/US2022/015936 | 5/2022 |
| WO | WO PCT/US2020/066285 | 7/2022 |
| WO | WO PCT/US2022/033900 | 10/2022 |
| WO | WO PCT/US2022/037148 | 11/2022 |
| WO | WO PCT/US2022/036917 | 1/2023 |

OTHER PUBLICATIONS

Servalli, Giorgio, et al. "Memory Devices and Methods of Forming Memory Devices", U.S. Appl. No. 17/189.594, filed Mar. 2, 2021, 35 pages.

Ramaswamy el al., U.S. Appl. No. 17/391,040, filed Jul. 20, 2021, titled "integrated Assemblies and Methods of Forming Integrated Assemblies", 39 pages.

Servalli et al., U.S. Appl. No. 17/379,012, filed Jul. 19, 2021, titled "Integrated Assemblies and Methods of Forming Integrated Assemblies", 36 pages.

* cited by examiner

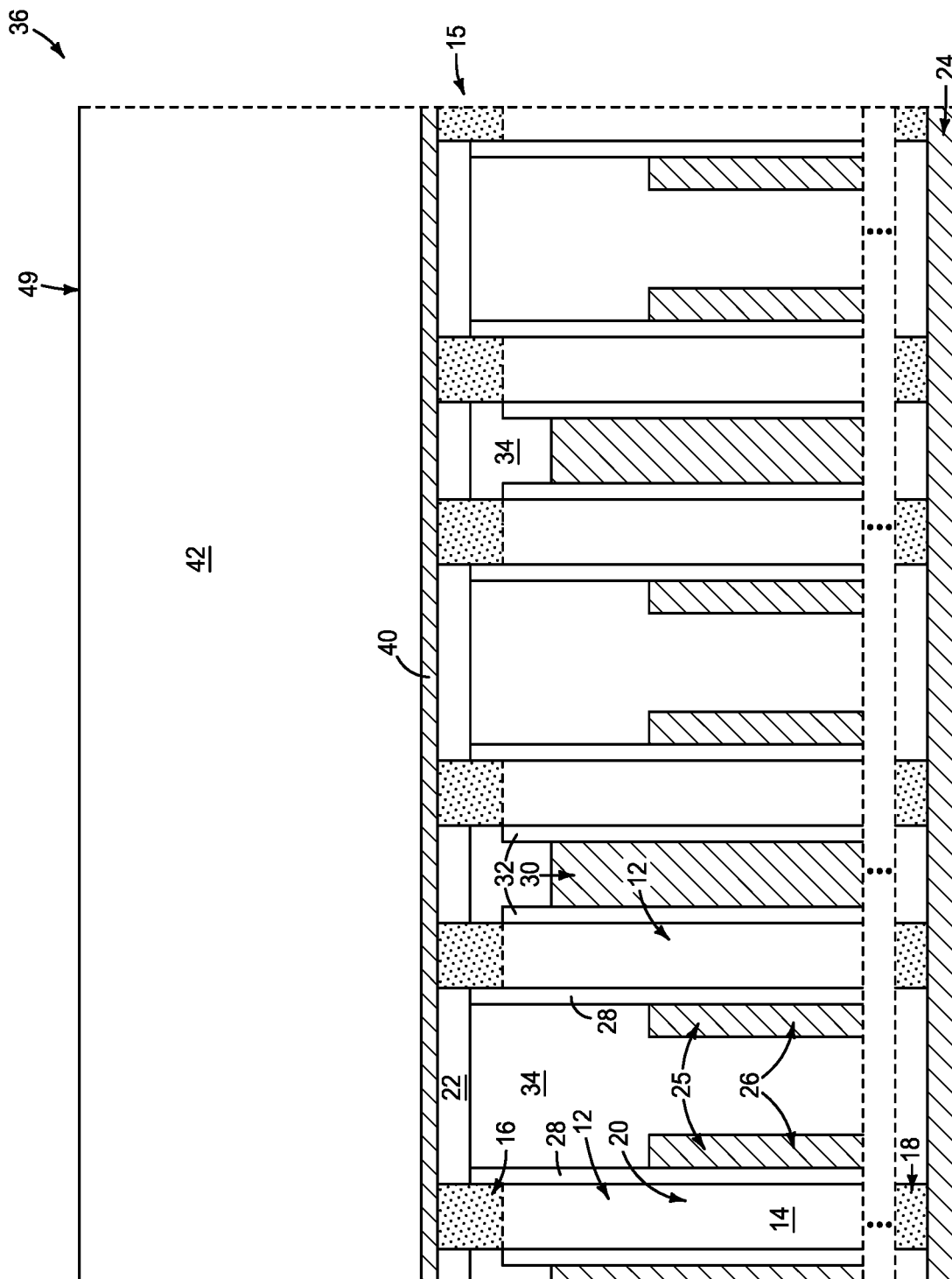

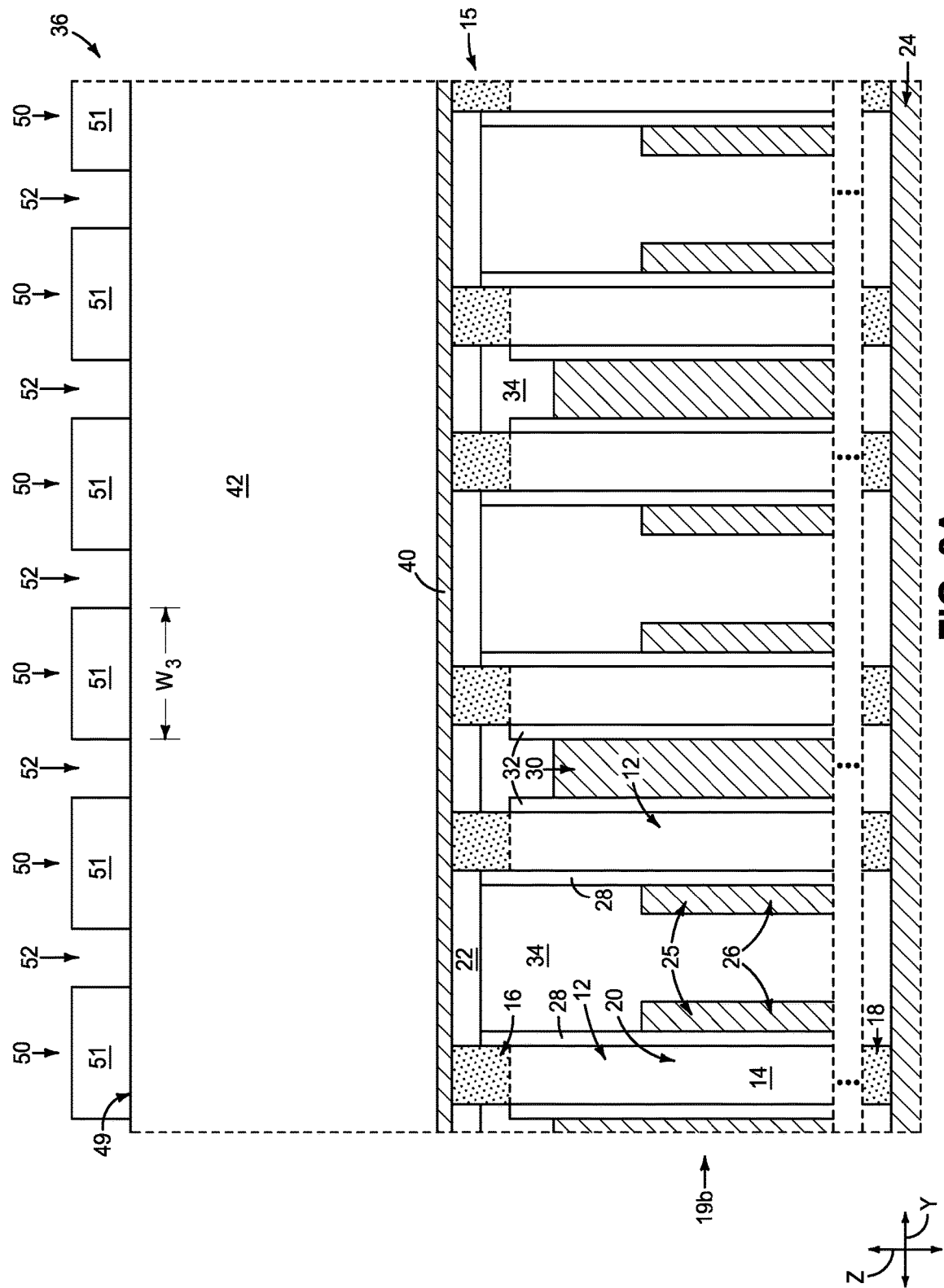

INTEGRATED ASSEMBLIES AND METHODS OF FORMING INTEGRATED ASSEMBLIES

TECHNICAL FIELD

Integrated assemblies. Methods of forming integrated assemblies. Memory devices (e.g., devices comprising FeRAM configurations). Methods of forming memory devices.

BACKGROUND

Memory devices may utilize memory cells which individually comprise an access transistor in combination with a capacitor. In some applications, the capacitor may be a ferroelectric capacitor and the memory may be ferroelectric random-access memory (FeRAM).

Computers and other electronic systems (for example, digital televisions, digital cameras, cellular phones, etc.), often have one or more memory devices to store information. Increasingly, memory devices are being reduced in size to achieve a higher density of storage capacity. Even when increased density is achieved, consumers often demand that memory devices also use less power while maintaining high speed access and reliability of data stored on the memory devices.

Leakage within (through) dielectric material of memory cells can be problematic for at least the reasons that such may make it difficult to reliably store data, and may otherwise waste power. Leakage may be become increasingly difficult to control as circuitry is scaled to increasingly smaller dimensions.

It would be desirable to develop architectures which alleviate, or even prevent, undesired leakage; and to develop methods for fabricating such architectures. It would be desirable to develop improved memory architecture, and improved methods of forming memory architecture. It would also be desirable for such methods to be applicable for fabrication of FeRAM.

BRIEF DESCRIPTION OF THE DRAWINGS

FIG. 1 is a top view. FIGS. 1A and 1B are cross-sectional side views along the lines A-A and B-B, respectively, of FIG. 1.

FIGS. 1A-1 and 1B-1 are diagrammatic cross-sectional side views along the lines A-A and B-B, respectively, of FIG. 1, and show materials that may be associated with a gap shown in FIGS. 1A and 1B.

FIG. 2 is a top view. FIGS. 2A and 2B are cross-sectional side views along the lines A-A and B-B, respectively, of FIG. 2.

FIG. 3 is a top view. FIGS. 3A and 3B are cross-sectional side views along the lines A-A and B-B, respectively, of FIG. 3.

FIG. 4 is a top view. FIGS. 4A and 4B are cross-sectional side views along the lines A-A and B-B, respectively, of FIG. 4.

FIG. 5 is a top view. FIGS. 5A and 5B are cross-sectional side views along the lines A-A and B-B, respectively, of FIG. 5.

FIG. 6 is a top view. FIGS. 6A and 6B are cross-sectional side views along the lines A-A and B-B, respectively, of FIG. 6.

FIG. 7 is a top view. FIGS. 7A and 7B are cross-sectional side views along the lines A-A and B-B, respectively, of FIG. 7.

FIG. 8 is a top view. FIGS. 8A and 8B are cross-sectional side views along the lines A-A and B-B, respectively, of FIG. 8.

FIG. 9 is a top view. FIGS. 9A and 9B are cross-sectional side views along the lines A-A and B-B, respectively, of FIG. 9.

FIG. 10 is a top view. FIG. 10C is a three-dimensional view.

FIG. 11 is a top view. FIGS. 11A and 11B are cross-sectional side views along the lines A-A and B-B, respectively, of FIG. 11.

FIG. 12 is a top view. FIGS. 12A and 12B are cross-sectional side views along the lines A-A and B-B, respectively, of FIG. 12.

FIG. 13 is a top view. FIGS. 13A and 13B are cross-sectional side views along the lines A-A and B-B, respectively, of FIG. 13.

FIG. 14 is a top view. FIGS. 14A and 14B are cross-sectional side views along the lines A-A and B-B, respectively, of FIG. 14.

FIG. 15 is a top view. FIGS. 15A and 15B are cross-sectional side views along the lines A-A and B-B, respectively, of FIG. 15. The construction of FIGS. 15-15B may be considered to be a region of an example integrated assembly or a region of an example memory device.

DETAILED DESCRIPTION OF THE ILLUSTRATED EMBODIMENTS

Some embodiments include methods of forming memory architecture (e.g., FeRAM, etc.) in which bottom electrodes are configured as angle plates (e.g., "L-shaped" plates) having vertically-extending legs joining to horizontally-extending legs. The angle plates may be supported by insulative structures (rails) that extend along the angle plates and are adjacent to the vertically-extending legs. The insulative structures may extend along a same direction as digit lines (e.g., a column direction). Ferroelectric material may be along the bottom electrodes, and top-electrode-material may be over the ferroelectric material. Leaker-device-structures may be provided to extend between the bottom electrodes and the top-electrode-material. One or more slits may pass through the top-electrode-material and may be aligned with the insulative structures to pattern the top-electrode-material into two or more plates. Voltage of the individual plates may be controlled during various operations associated with a memory array (e.g., READ/WRITE operations). Example embodiments are described with reference to FIGS. 1-17.

Figure 1:
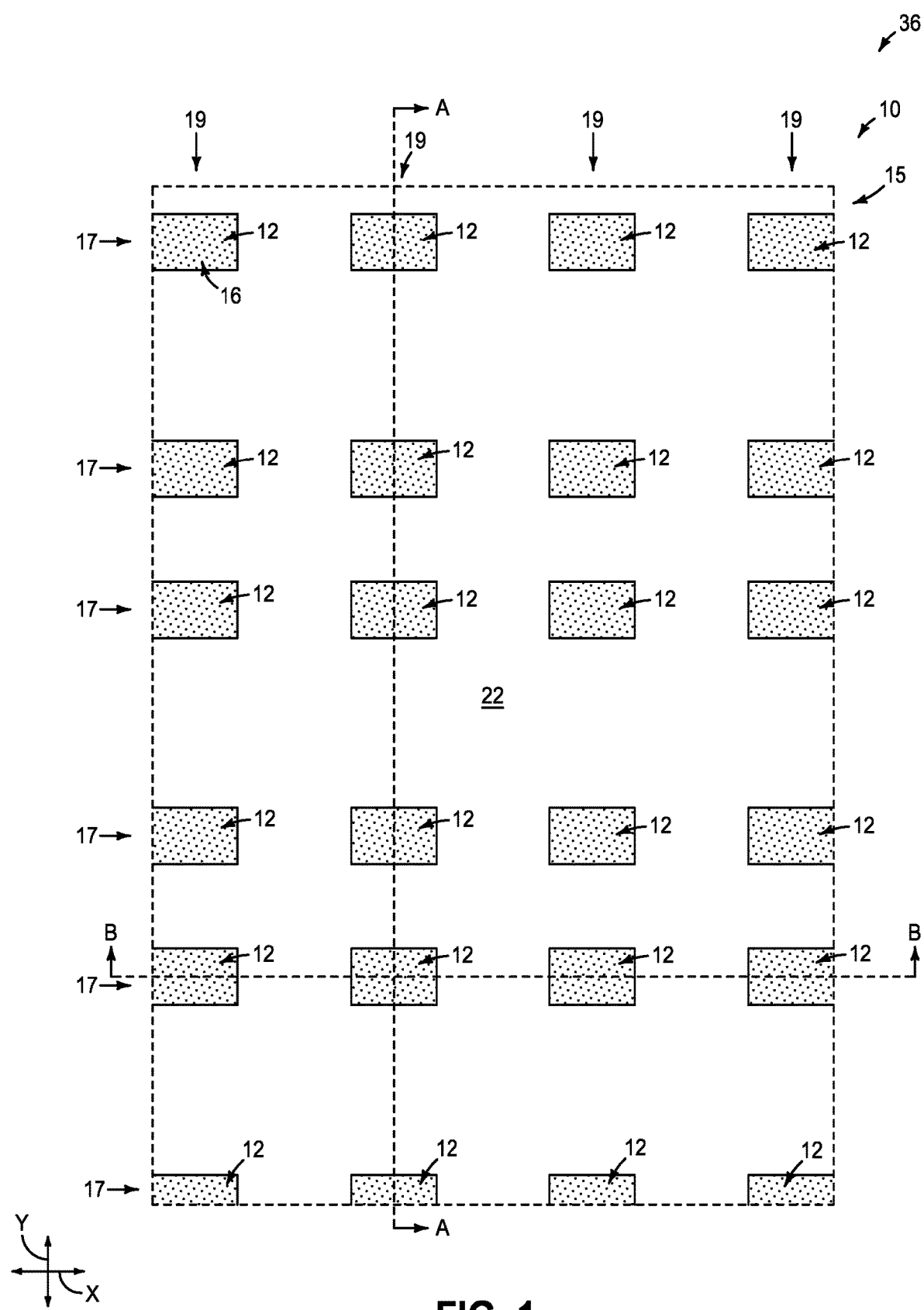
FIGS. 1-1B are diagrammatic views of a region of an example construction at an example process stage of an example method for forming an example integrated assembly.
Figure 1A:
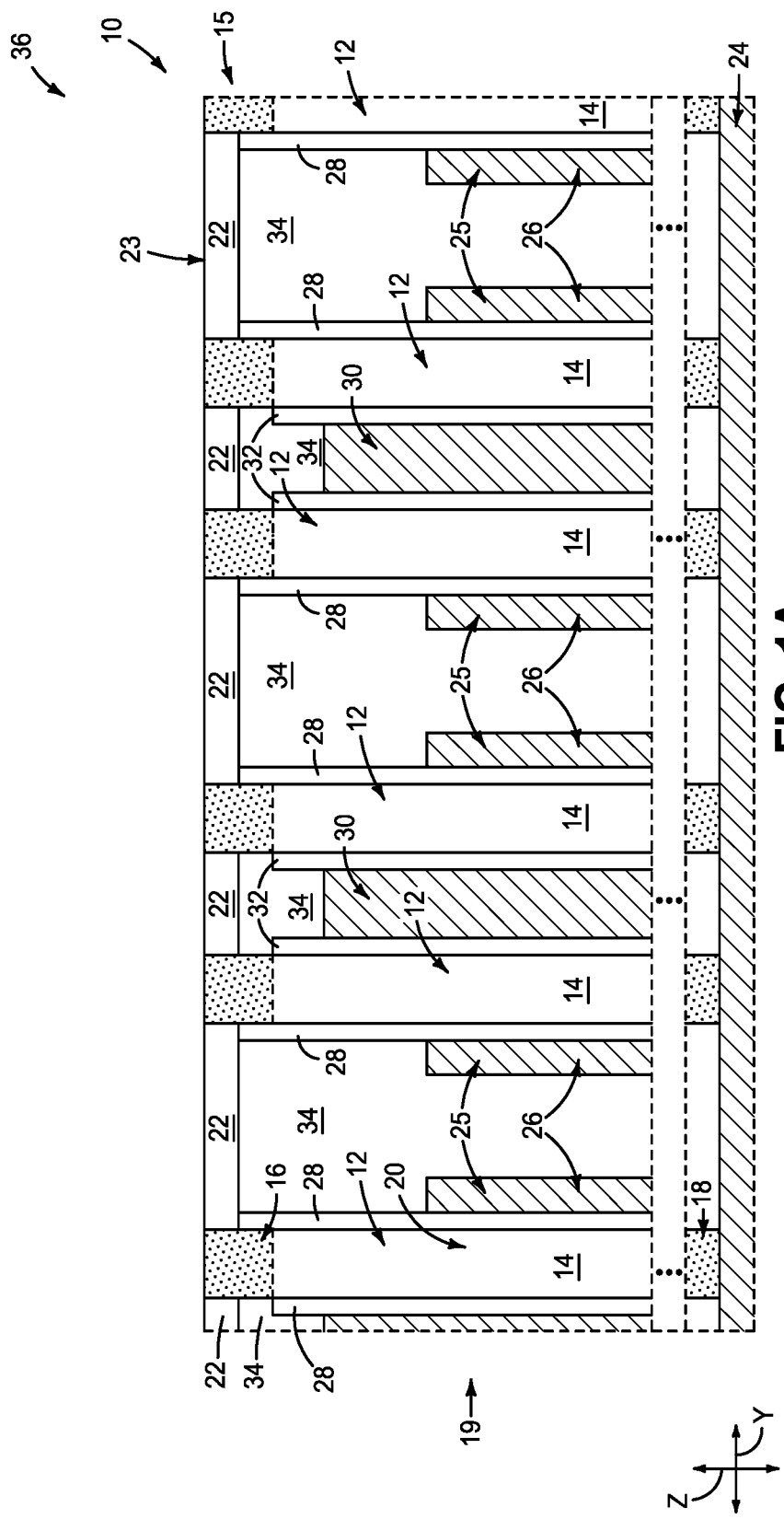
Figures 1, 1A:
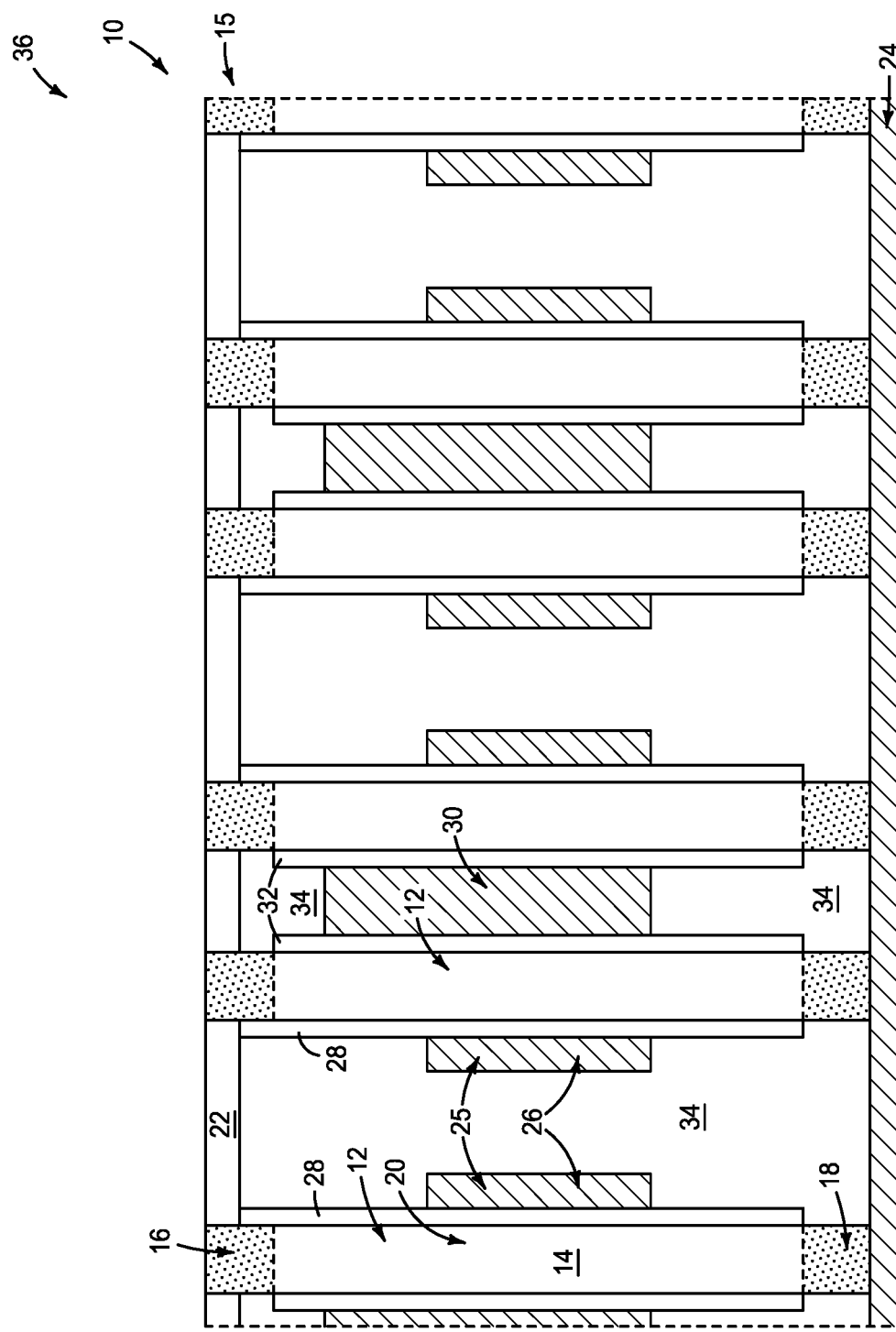
Figure 1B:
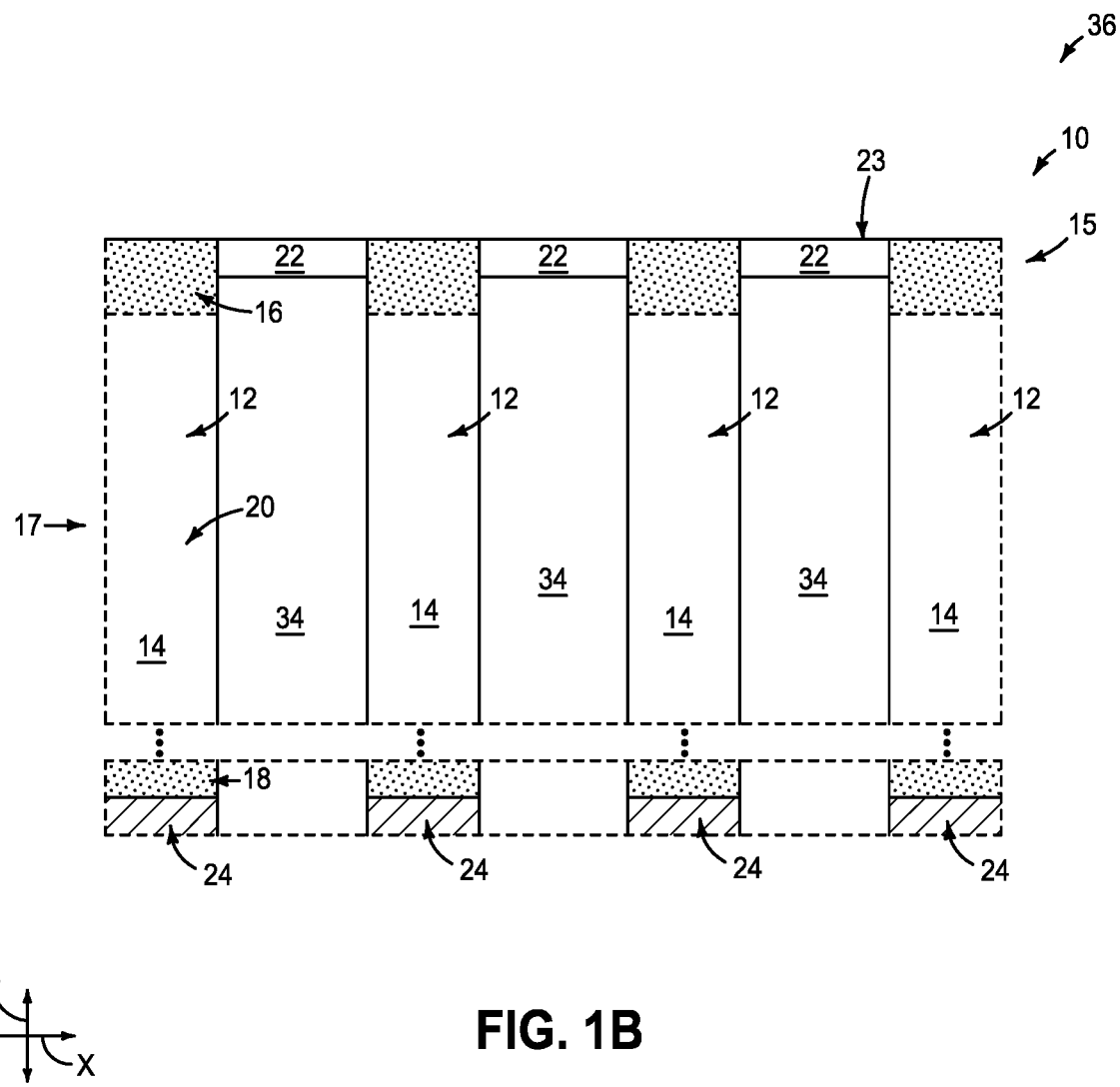
Figure 1B:
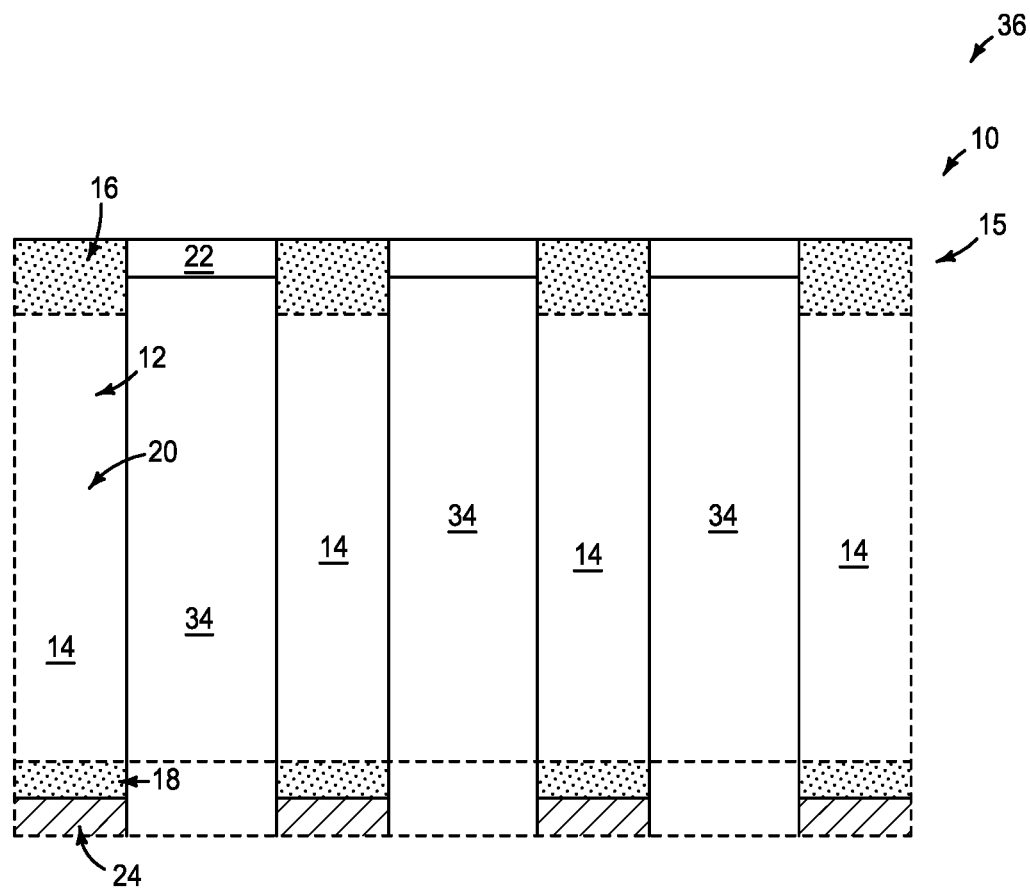
Figure 1:
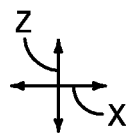

Referring to FIGS. 1-1B, a construction 10 includes vertically-extending pillars 12. The pillars 12 comprise semiconductor material 14. The pillars 12 are all substantially identical to one another, with the term "substantially identical" meaning identical to within reasonable tolerances of fabrication and measurement.

The semiconductor material 14 may comprise any suitable composition(s), and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 14 may comprise, consist essentially of, or consist of appropriately-doped silicon. The silicon may be in any suitable form, and in some embodiments may be monocrystalline, polycrystalline and/or amorphous.

Each of the pillars 12 includes a channel region 20 between an upper source/drain region 16 and a lower source/drain region 18. Stippling is utilized in the drawings to indicate that the source/drain regions 16 and 18 are heavily doped. In some embodiments, the source/drain regions 16 and 18 may be n-type doped by incorporating one or both of phosphorus and arsenic into the semiconductor material (e.g., silicon) 14 of the pillars 12. In some embodiments, one or both of the source/drain regions 16 and 18 may comprise additional conductive material besides the conductively-doped semiconductor material 14. For instance, one or both of the source/drain regions 16 and 18 may include metal silicide (e.g., titanium silicide, tungsten silicide, etc.) and/or other suitable conductive materials (e.g., titanium, tungsten, etc.). In some embodiments, the pillars 12 may be considered to be capped by the upper source/drain regions 16, with the term "capped" indicating that the upper source/drain regions may or may not include the semiconductor material 14 of the pillars 12.

The pillars 12 may be considered to be arranged in an array 15. The array may be considered to comprise rows 17 extending along an indicated x-axis direction, and to comprise columns 19 extending along an indicated y-axis direction.

Insulative material 22 extends between the upper source/drain regions 16. The insulative material 22 may comprise any suitable composition(s); and in some embodiments may comprise, consist essentially of, or consist of silicon nitride, silicon dioxide, aluminum oxide, etc. In some embodiments, the insulative material 22 may be referred to as a first insulative material.

A planarized upper surface 23 extends across the insulative material 22 and the source/drain regions 16. The planarized surface 23 may be formed utilizing chemical-mechanical polishing (CMP) and/or any other suitable process(es). In some embodiments, the surface 23 may be referred to as an upper surface of the construction 10.

The construction includes conductive structures (digit lines) 24 under the pillars 12. The digit lines 24 extend along the column direction (the illustrated y-axis direction) and are electrically coupled with the lower source/drain regions 18 of the pillars. The digit lines may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

In the illustrated embodiment, the digit lines are physically against the lower source/drain regions 18. In some embodiments, the digit lines may comprise metal (e.g., titanium, tungsten, etc.), the source/drain regions 18 may comprise conductively-doped silicon, and metal silicide be present where the silicon of the source/drain regions 18 interfaces with the digit lines 24.

Gating structures (wordlines) 25 are alongside the pillars 12 and comprise gates 26. The gates 26 are spaced from the pillars by dielectric material (also referred to as gate dielectric material) 28. The gating structures 25 extend along the row direction (i.e., along the illustrated x-axis direction), and thus extend in and out of the page relative to the cross-sectional view of FIG. 1A.

The gating structures 25 (and associated gates 26) may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The dielectric material 28 may comprise any suitable composition(s); and in some embodiments may comprise, consist essentially of, or consist of one or more of silicon nitride, silicon dioxide, aluminum oxide, hafnium oxide, etc.

The dielectric material 28 is provided between the gates 26 and the channel regions 20, and may extend to any suitable vertical dimension. In the shown embodiment the dielectric material 28 extends upwardly beyond the uppermost surfaces of the gates 26. In other embodiments the dielectric material 28 may or may not extend vertically beyond the gates 26.

The gates (transistor gates) 26 may be considered to be operatively adjacent to (operatively proximate to) the channel regions 20 such that a sufficient voltage applied to an individual gate 26 (specifically along a wordline 25 comprising the gate) will induce an electric field on a channel region near the gate which enables current flow through the channel region to electrically couple the source/drain regions on opposing sides of the channel region with one another. If the voltage to the gate is below a threshold level, the current will not flow through the channel region, and the source/drain regions on opposing sides of the channel region will not be electrically coupled with one another. The selective control of the coupling/decoupling of the source/ drain regions through the level of voltage applied to the gate may be referred to as gated coupling of the source/drain regions.

Shield lines 30 are alongside the pillars 12, and are spaced from the pillars by dielectric material 32. The shield lines may be electrically coupled with ground or any other suitable reference voltage. The shield lines 30 extend along the row direction (i.e., along the illustrated x-axis direction). The shield lines 30 may be considered to be within regions between the pillars 12 along the cross-sectional view of FIG. 1A.

The dielectric material 32 may comprise any suitable composition(s); and in some embodiments may comprise, consist essentially of, or consist of one or more of silicon dioxide, silicon nitride, aluminum oxide, hafnium oxide, etc. In the shown embodiment the dielectric material 32 extends vertically beyond the shield lines 30. In other embodiments the dielectric material 32 may or may not extend vertically beyond the shield lines 30.

The shield lines 30 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

In the shown embodiment, each of the pillars 12 shown along the cross-section of FIG. 1A has one side adjacent a gate 26, and has an opposing side adjacent a shield line 30.

In the shown embodiment, insulative material 34 is over the gates 26 and the shield lines 30. The insulative material 34 may comprise any suitable composition(s); and may, for example, comprise silicon dioxide, silicon nitride, aluminum oxide, etc. In some embodiments the material 34 may comprise a same composition as one or both of the dielectric materials 28 and 32, and in other embodiments the material 34 may comprise a different composition than at least one of the dielectric materials 28 and 32.

Each of the pillars 12 is coupled to one of the wordlines 25 and one of the digit lines 24; and accordingly each of the pillars 12 may be considered to be uniquely addressed by one of the wordlines and one of the digit lines.

The construction 10 may be supported by a semiconductor base (not shown). The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base may correspond to a semiconductor substrate containing one or more materials associated with integrated circuit fabrication. Such materials may include, for example, one or more of refractory metal materials, barrier materials, diffusion materials, insulator materials, etc.

In some embodiments, the construction 10 of FIGS. 1-1B may be considered to represent a portion of an integrated assembly 36.

In the embodiment of FIGS. 1A and 1B, a gap is provided within the construction 10 to break a region of the pillars 12 above the lower source/drain regions 18. The gap enables the view of construction 10 to be collapsed into a smaller area, which leaves more room for additional materials formed over the construction 10 at subsequent process stages. It is to be understood that the pillars 12 extend across the illustrated gap. FIGS. 1A-1 and 1B-1 show views along the same cross-sections as FIG. 1A and FIG. 1B, and show the construction 10 without the gap of FIGS. 1A and 1B. FIGS. 1A-1 and 1B-1 are provided to assist the reader in understanding the arrangement of construction 10. The views of FIGS. 1A and 1B (i.e., the views with the gaps in construction 10) will be used for the remaining figures of this disclosure.

Figure 2:
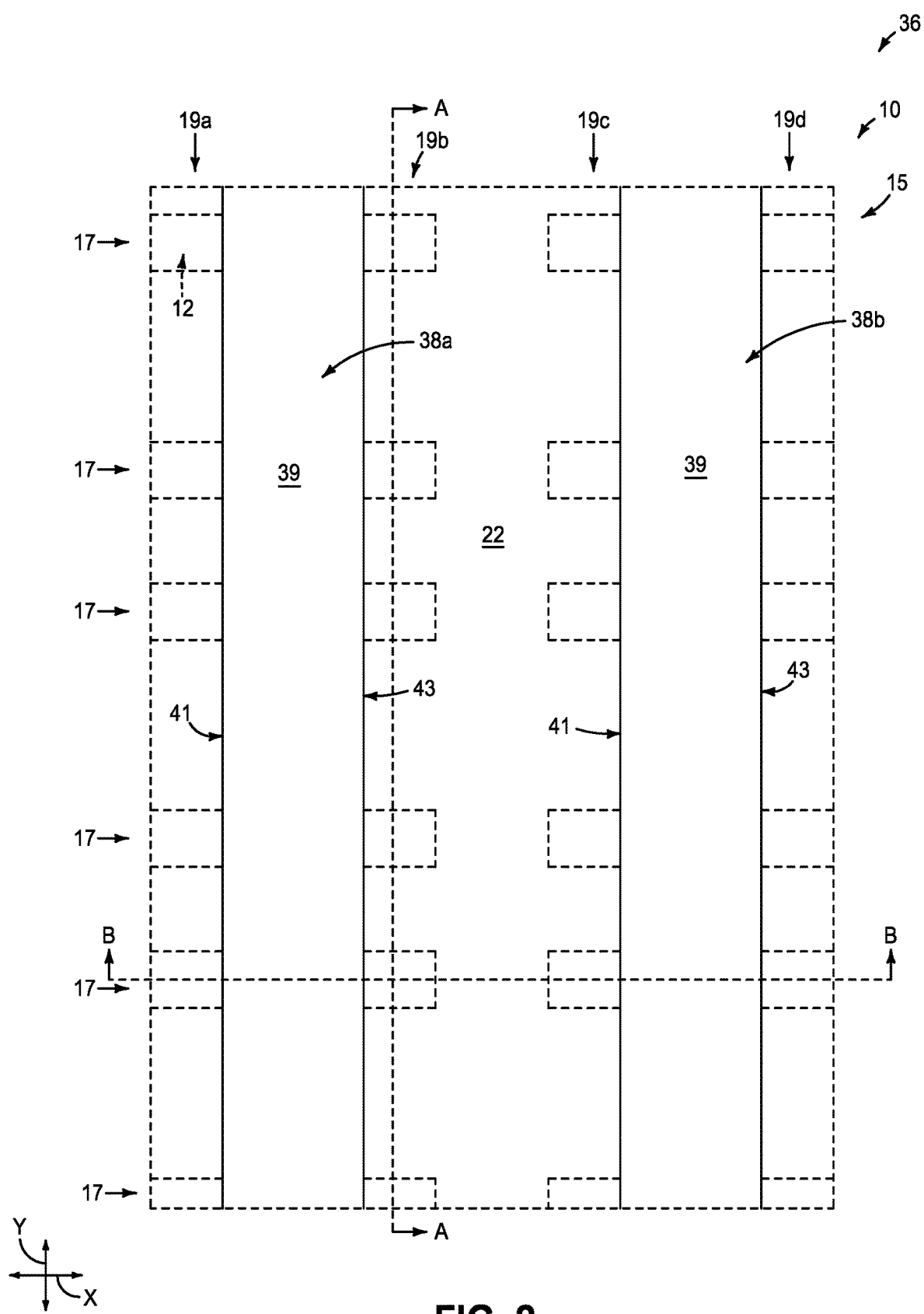
FIGS. 2-2B are diagrammatic views of the region of FIGS. 1-1B at an example process stage following that of FIGS. 1-1B.
Figure 2A:
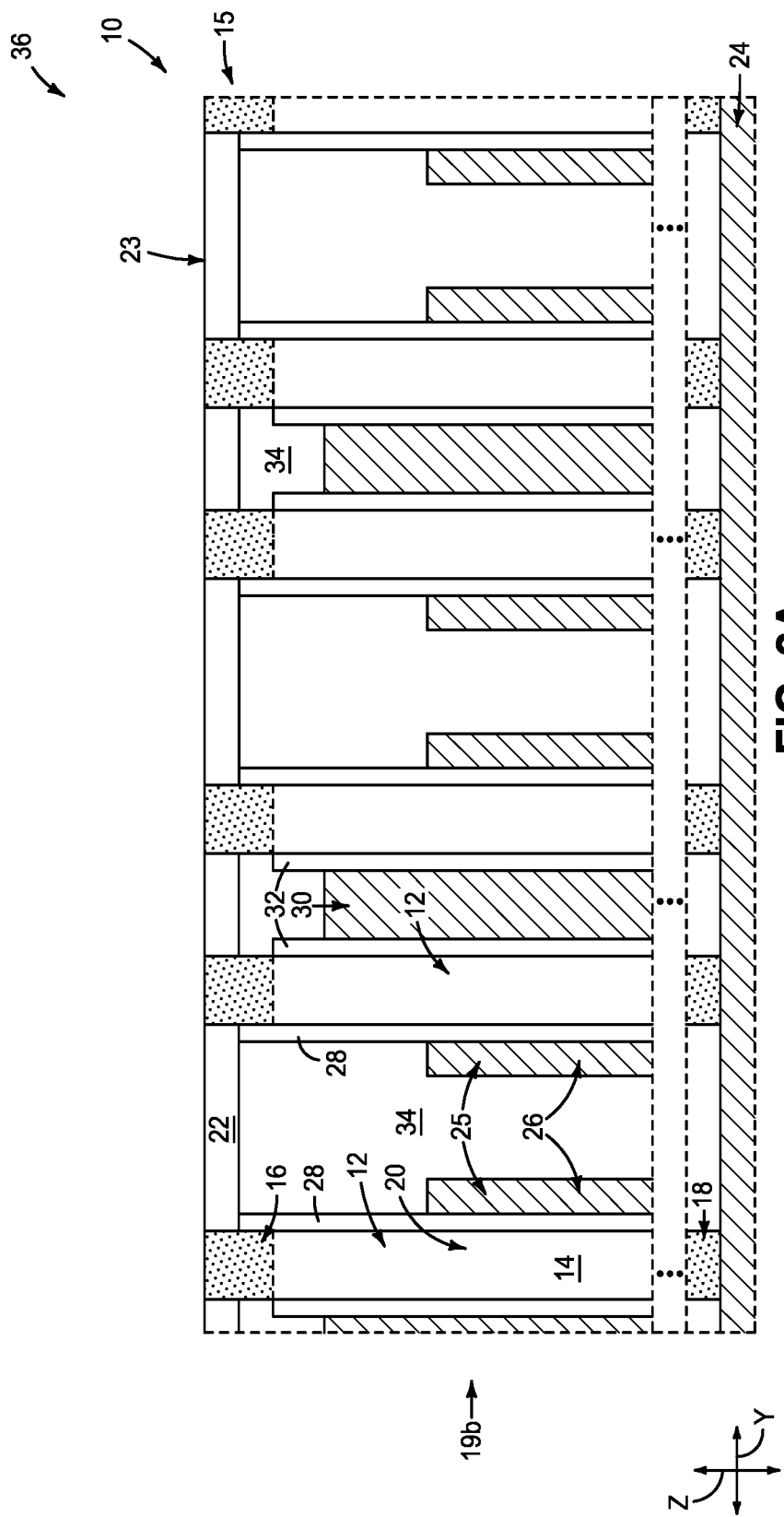
Figure 2B:
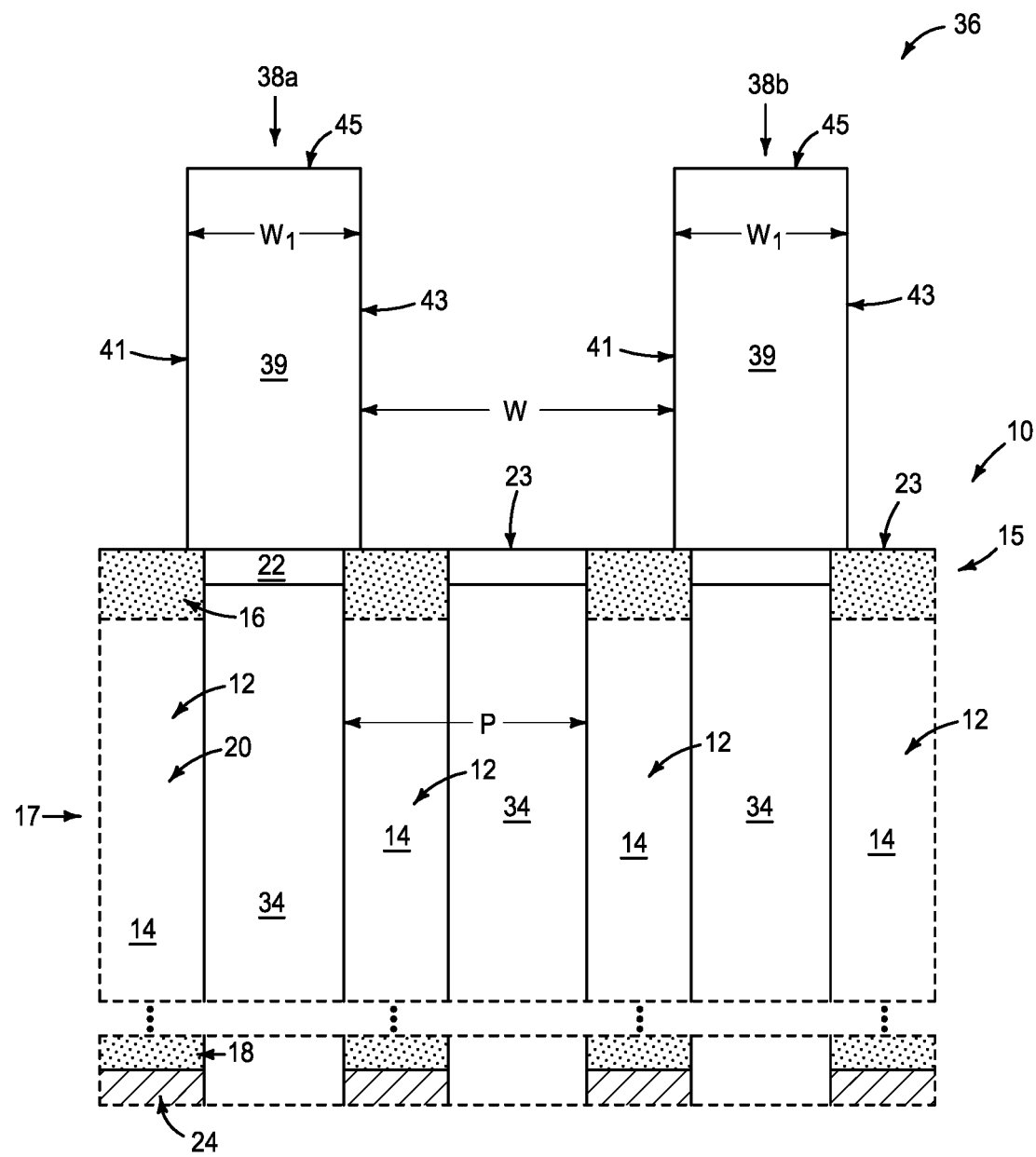

Referring to FIGS. 2-2B, the assembly 36 is shown at a process stage subsequent to that of FIGS. 1-1B. Linear insulative structures (rails, beams) 38 are formed over the upper surface 23 of construction 10. The structures 38 comprise insulative material 39. The material 39 may comprise any suitable composition(s); and in some embodiments may comprise, consist essentially of, or consist of silicon dioxide, silicon nitride, aluminum oxide, etc. It may be desirable for the material 39 to be a different composition than the material 22.

The illustrated linear structures 38 are labeled 38a and 38b so that they may be distinguished relative to one another.

The linear structures 38 extend along the column direction (the illustrated y-axis direction), and are formed to be between columns of the pillars 12. Each of the linear structures 38 has a pair of opposing lateral surfaces 41 and 43. The surfaces 41 and 43 may be referred to as first and second lateral sides, respectively, of the linear structures 38. Each of the linear structures also has a top surface 45.

Each of the linear structures 38 may be considered to be associated with a pair of the columns 19 of the pillars 12, with such associated columns being along the sides 41 and 43. For instance, the columns 19 of FIG. 2 are labeled as 19a-d. Columns 19a and 19b are along the sides 41 and 43 of the linear structure 38a and may be considered to be associated with such linear structure. Similarly, columns 19c and 19d are along the sides 41 and 43 of the linear structure 38b and may be considered to be associated with such linear structure.

In the shown embodiment, the linear structures 38 laterally overlap portions of the source/drain regions 16 of the associated columns 19, as shown in FIG. 2B. In other embodiments, the linear structures 38 may be formed between the associated columns and may not laterally overlap the source/drain regions 16 of the associated columns.

The linear structures 38 may be formed with any suitable processing. For instance, an expanse of the material 39 may be formed across the upper surface 23, and such expanse may be patterned utilizing a patterned mask (not shown) and one or more suitable etches.

In the illustrated embodiment, the sidewall surfaces 41 and 43 are substantially vertical and extend substantially orthogonally relative to the substantially horizontal upper surface 23. The term "substantially vertical" means vertical to within reasonable tolerances of fabrication and measurement, the term "substantially orthogonal" means orthogonal to within reasonable tolerances of fabrication and measurement, and the term "substantially horizontal" means horizontal to within reasonable tolerances of fabrication and measurement.

FIG. 2B shows the pillars 12 to be on a pitch P along the cross-section of the figure. The linear structures 38a and 38b are spaced from one another by a gap having width W. The width W may be any suitable dimension, and in some embodiments may be within a range of from about one-fourth of the pitch P to about one-half of the pitch P. In some embodiments, the width W may be within a range of from about 20 nanometers (nm) to about 60 nm. The structures 38a and 38b have widths $W_1$ along the cross-section of FIG. 2B. In some embodiments, a ratio of $W_1$:W may be within a range of from about 1:2 to about 1:1.

Figure 3:
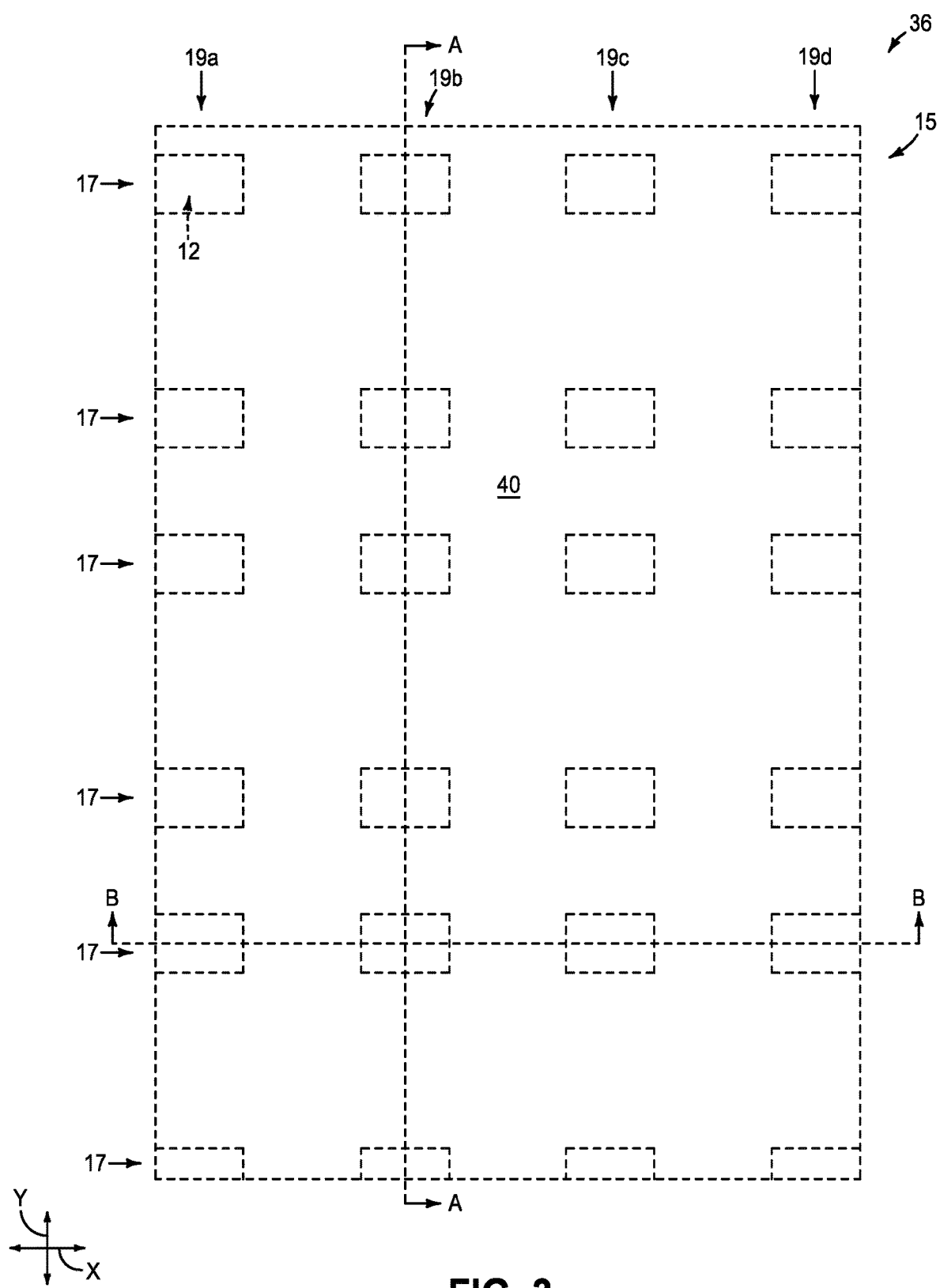
FIGS. 3-3B are diagrammatic views of the region of FIGS. 1-1B at an example process stage following that of FIGS. 2-2B.
Figure 3A:
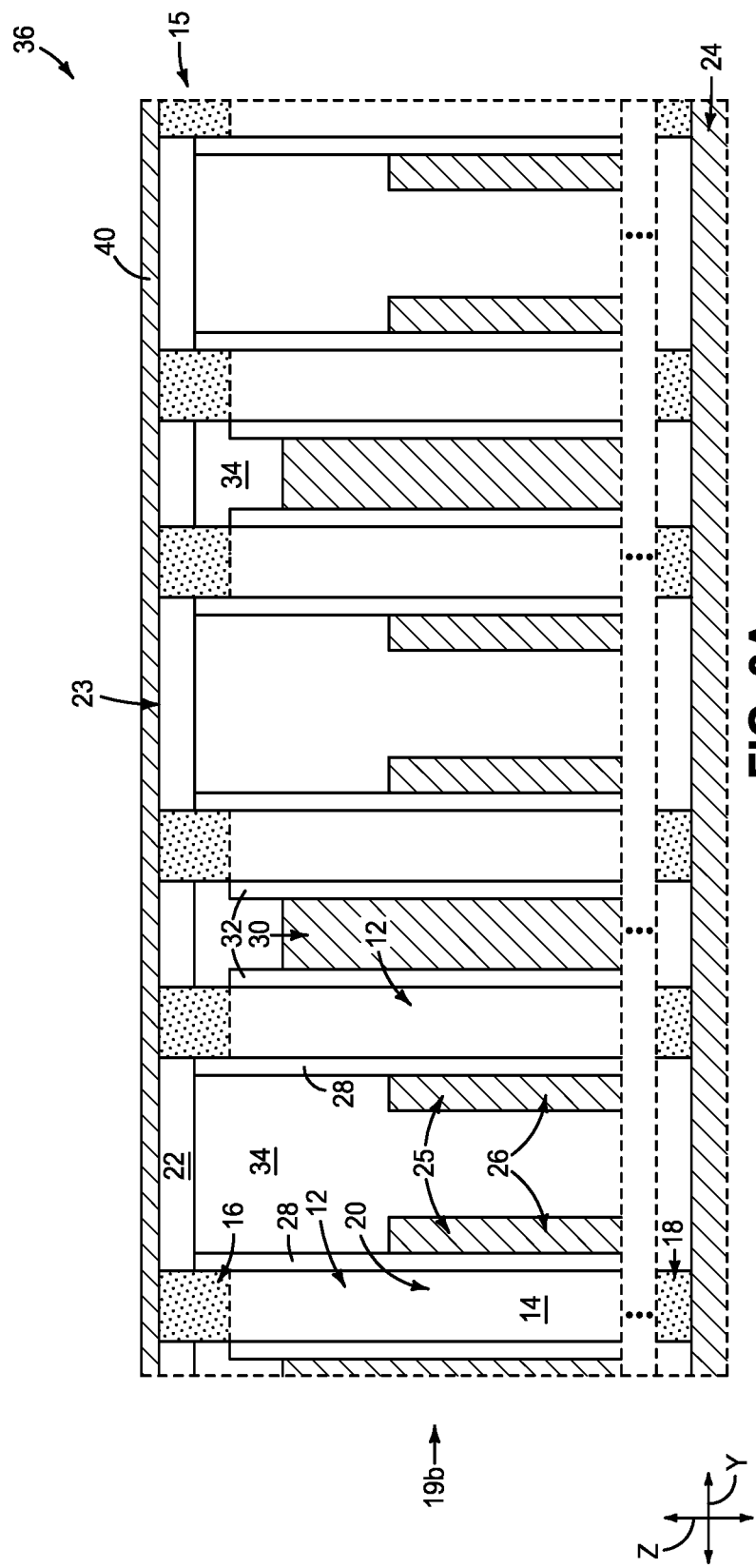
Figure 3B:
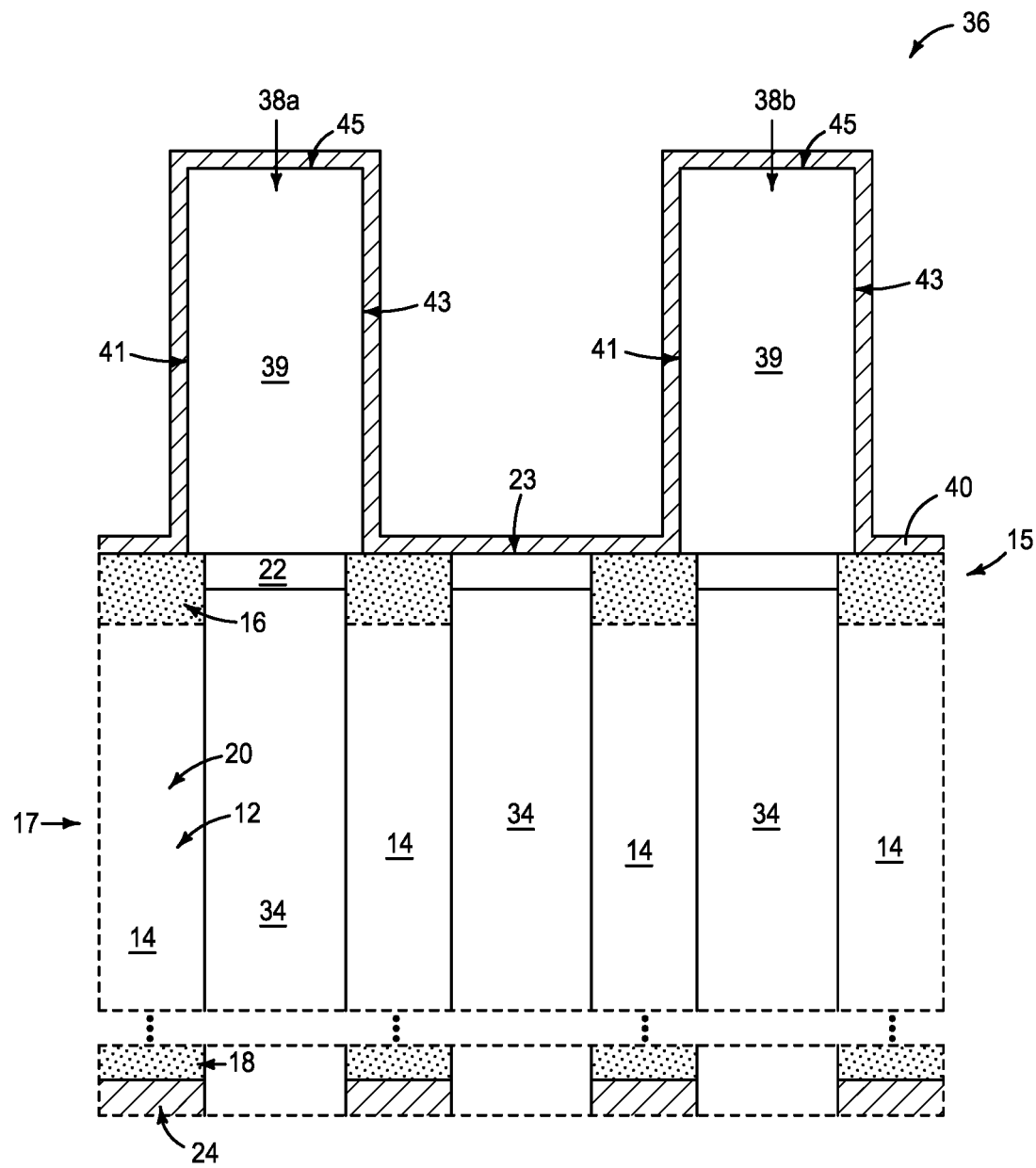

Referring to FIGS. 3-3B, bottom-electrode-material 40 is formed to extend conformally along the linear structures 38, and along regions of the upper surface 23 between the linear structures. The bottom-electrode-material 40 extends across the upper source/drain regions 16, and is electrically coupled with such source/drain regions. In the illustrated embodiment, the bottom-electrode-material 40 is directly against upper surfaces of the source/drain regions 16. The bottom-electrode-material 40 may have any suitable thickness. In some embodiments, the material 40 may have a thickness within a range of from about 1 nm to about 5 nm. The pillars 12 are shown in dashed-line (phantom) view in FIG. 3 to indicate that they are under other materials.

The bottom-electrode-material 40 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the bottom-electrode-material 40 may comprise, consist essentially of, or consist of titanium nitride.

Figure 4:
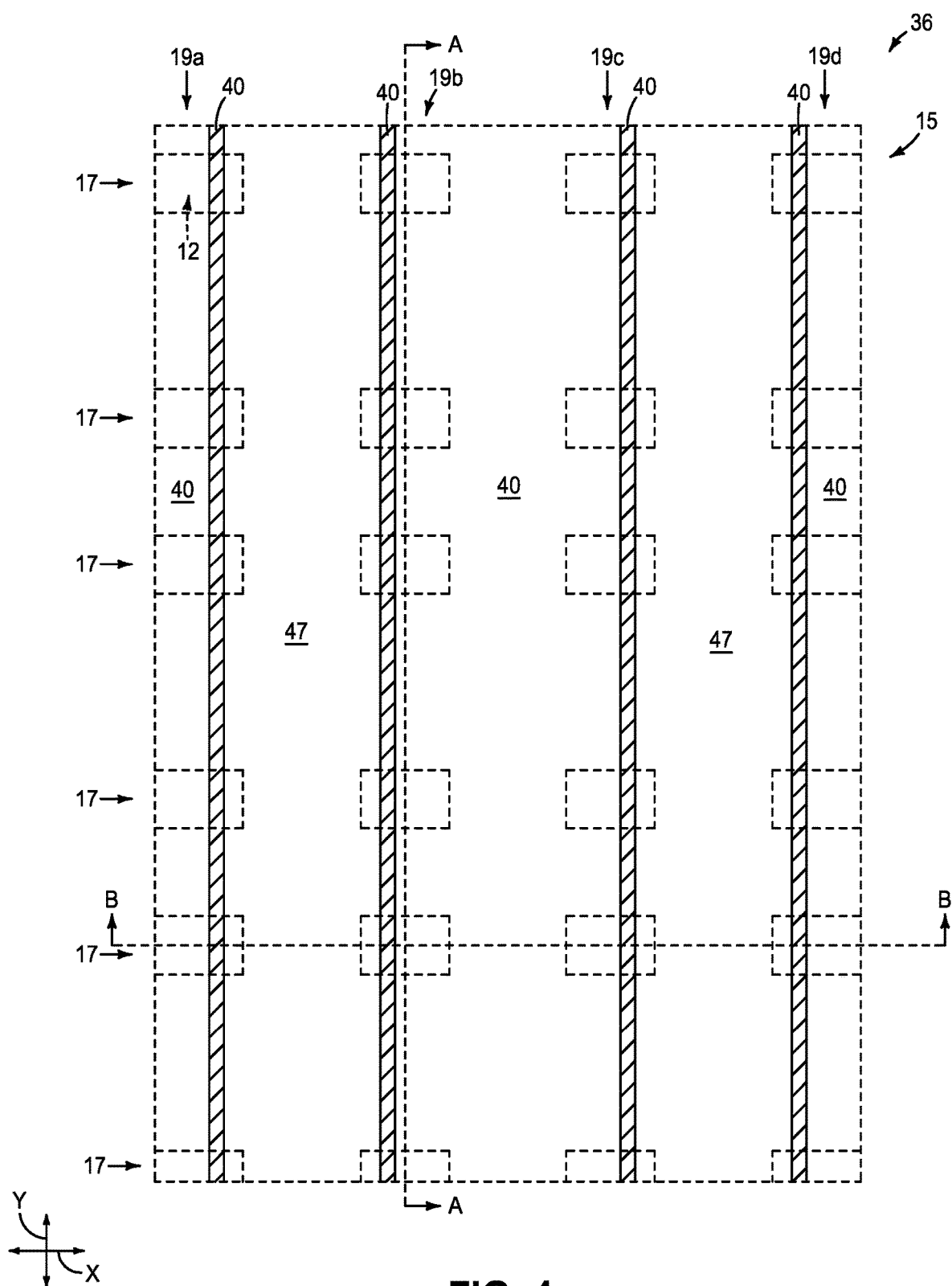
FIGS. 4-4B are diagrammatic views of the region of FIGS. 1-1B at an example process stage following that of FIGS. 3-3B.
Figure 4A:
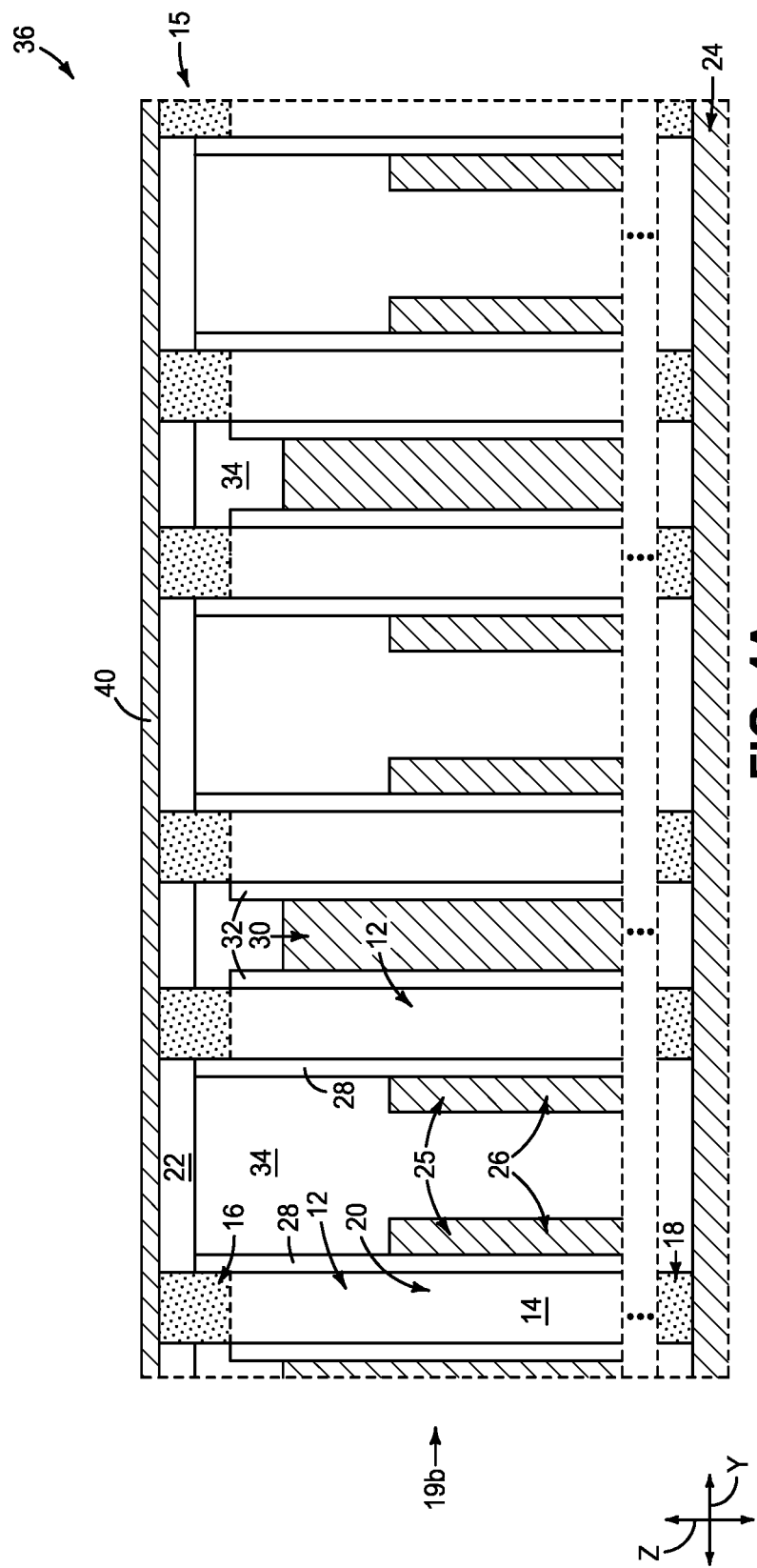
Figure 4B:
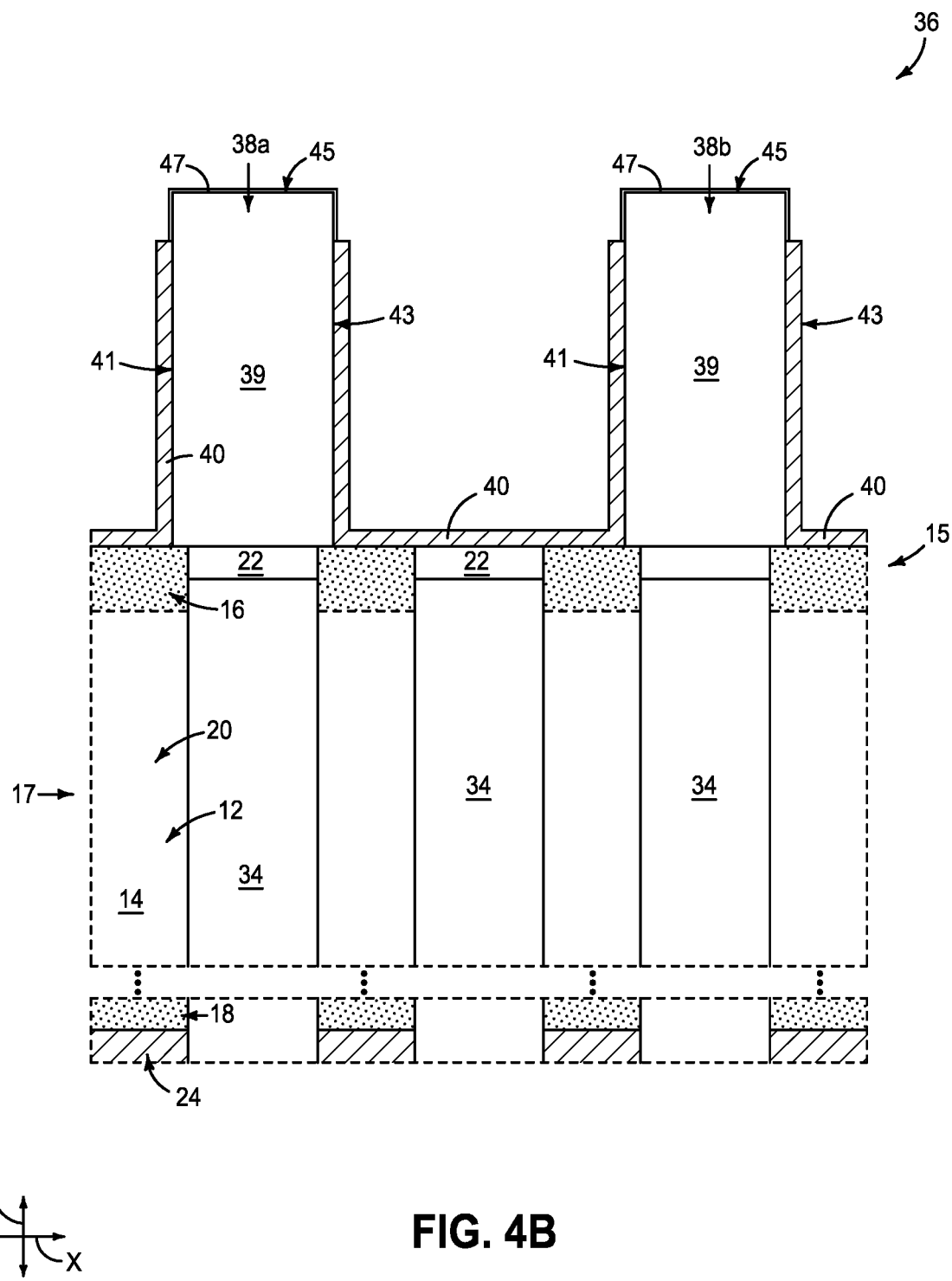

Referring to FIGS. 4-4B, the bottom-electrode-material 40 is etched back from upper portions of the linear structures 38 to expose the upper portions of the linear structures (bottom portions of the bottom-electrode-material may be protected with suitable protective material (not shown) during such etch-back). Subsequently, leaker-device-material 47 is formed along the top surfaces 45 and sidewall surfaces 41/43 of the exposed upper portions of the linear structures 38. The leaker-device-material 47 may be selectively deposited to be only along surfaces of the material 39 of the linear structures 38, or may be deposited over an entirety of the upper surface of the assembly 36 and then patterned to remain only along the upper portions of the linear structures 38.

The leaker-device-material 47 may comprise any suitable composition or combination of compositions. In some embodiments, the leaker-device-material 47 may comprise, consist essentially of, or consist of one or more of titanium, nickel and niobium in combination with one or more of germanium, silicon, oxygen, nitrogen and carbon. In some embodiments, the leaker device material may comprise, consist essentially of, or consist of one or more of Si, Ge, SiN, TiSiN, TiO, TiN, NiO, NiON and TiON, where the chemical formulas indicate primary constituents rather than particular stoichiometries. In some embodiments, the leaker-device-material may comprise, consist essentially of, or consist of titanium, oxygen and nitrogen. In some embodiments, the leaker-device-material may comprise amorphous silicon, niobium monoxide, silicon-rich silicon nitride, etc., either alone or in any suitable combination.

In some embodiments, the leaker-device-material 47 may be a continuous layer having a thickness within a range of from about 2 angstroms (Å) to about 20 Å. In some embodiments, the leaker-device-material may be a continuous layer having a thickness within a range of from about 6 Å to about 15 Å.

Figure 5:
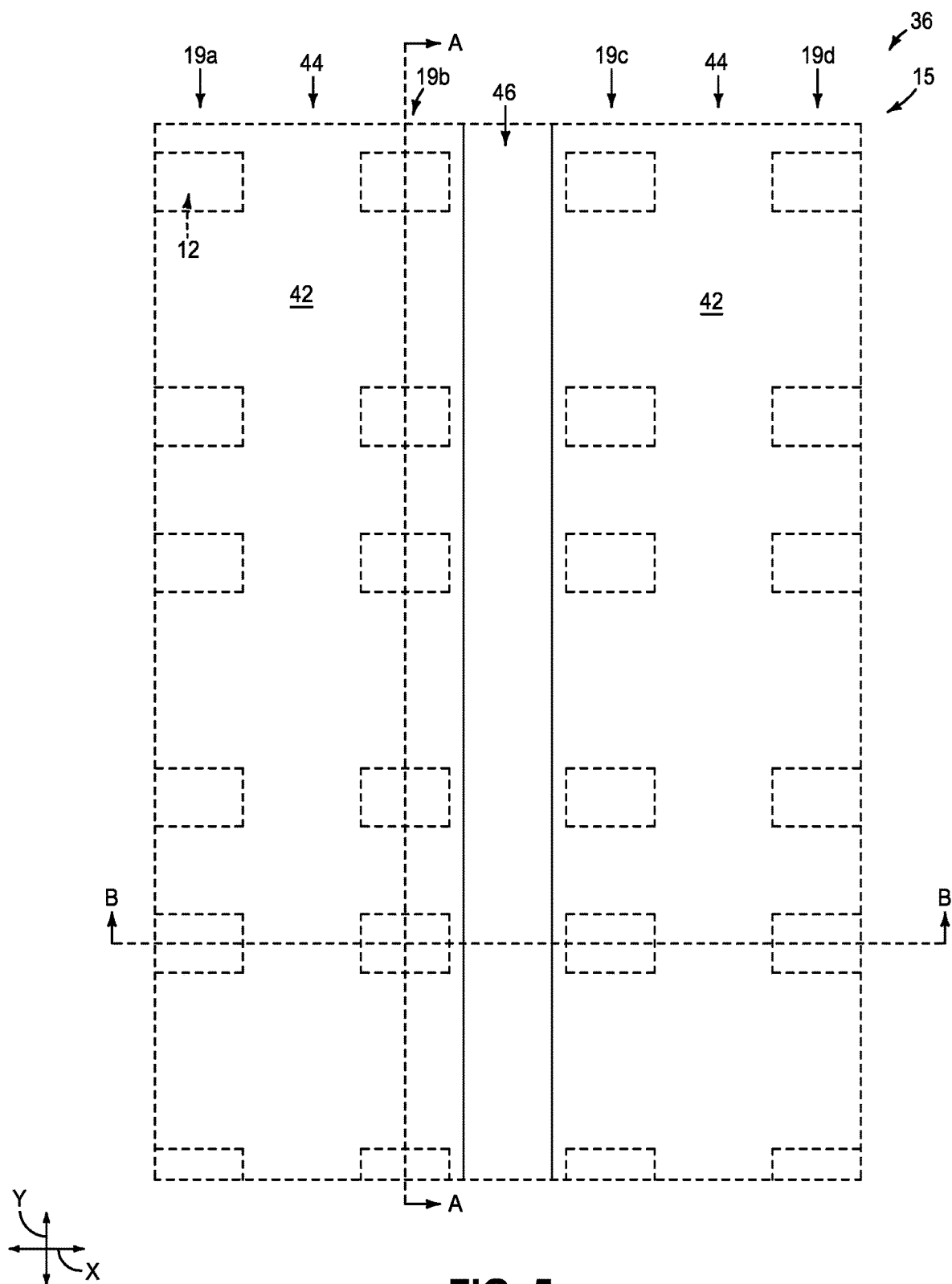
FIGS. 5-5B are diagrammatic views of the region of FIGS. 1-1B at an example process stage following that of FIGS. 4-4B.
Figure 5A:
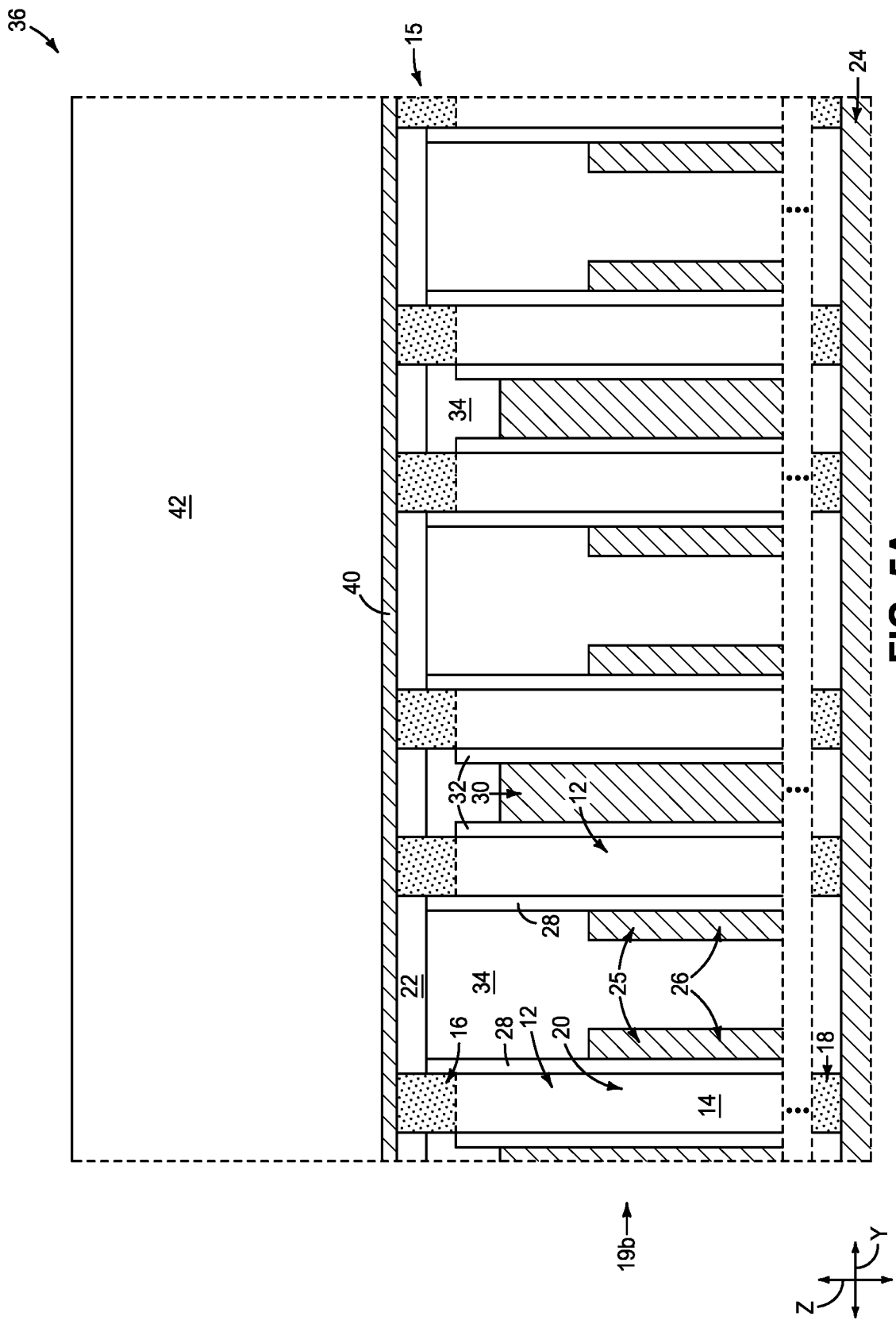
Figure 5B:
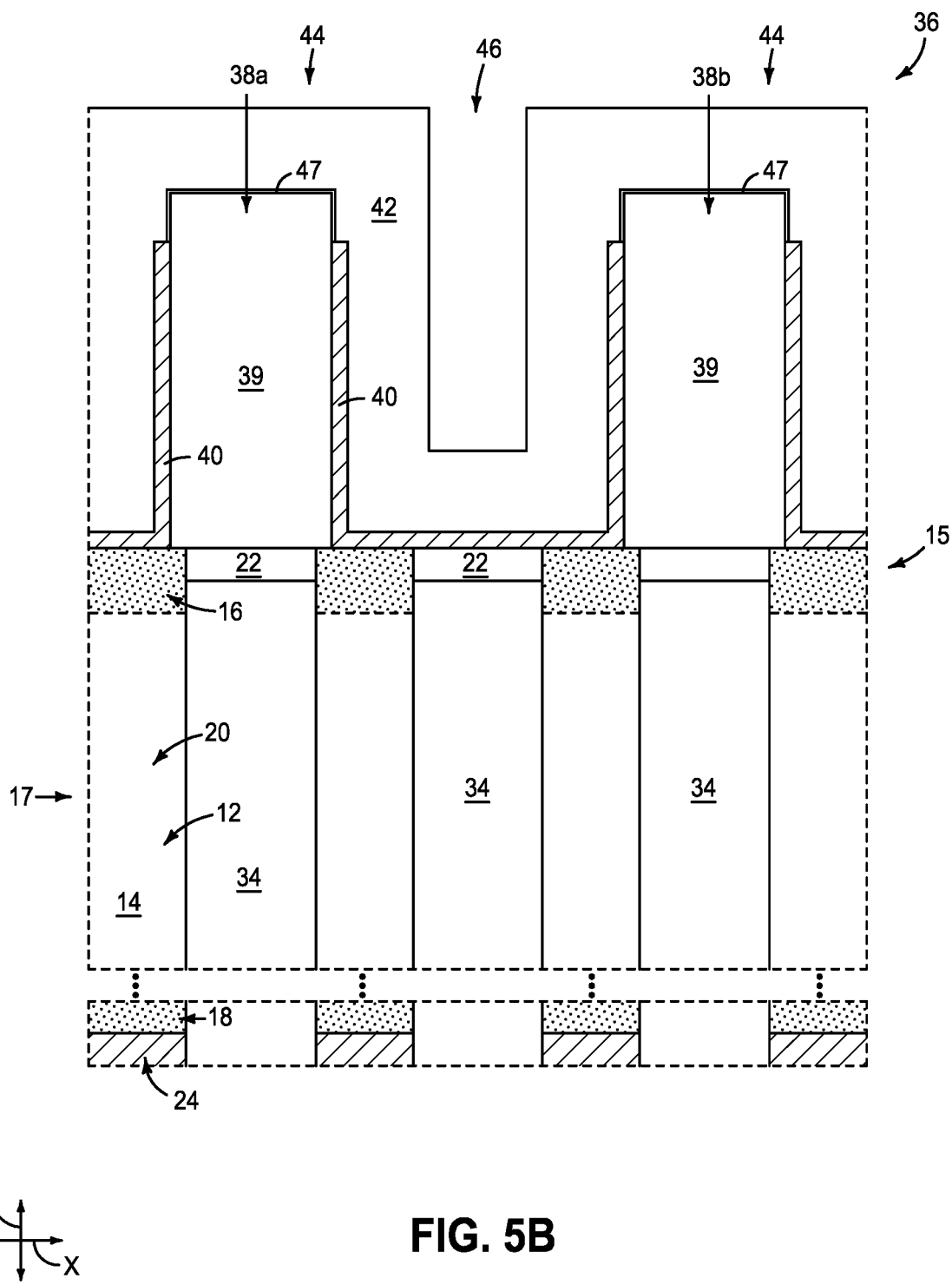

Referring to FIGS. 5-5B, a patterning material 42 is formed over the bottom-electrode-material 40. The patterning material 42 has an undulating topography which includes peaks 44 over the structures 38, and valleys 46 between the peaks. The material 42 may be formed to any suitable thickness (e.g., a thickness within a range of from about 10 nm to about 30 nm); and may comprise any suitable composition(s). In some embodiments, the material 42 may comprise, consist essentially of, or consist of one or more of silicon dioxide, silicon nitride and silicon oxynitride.

Figure 6:
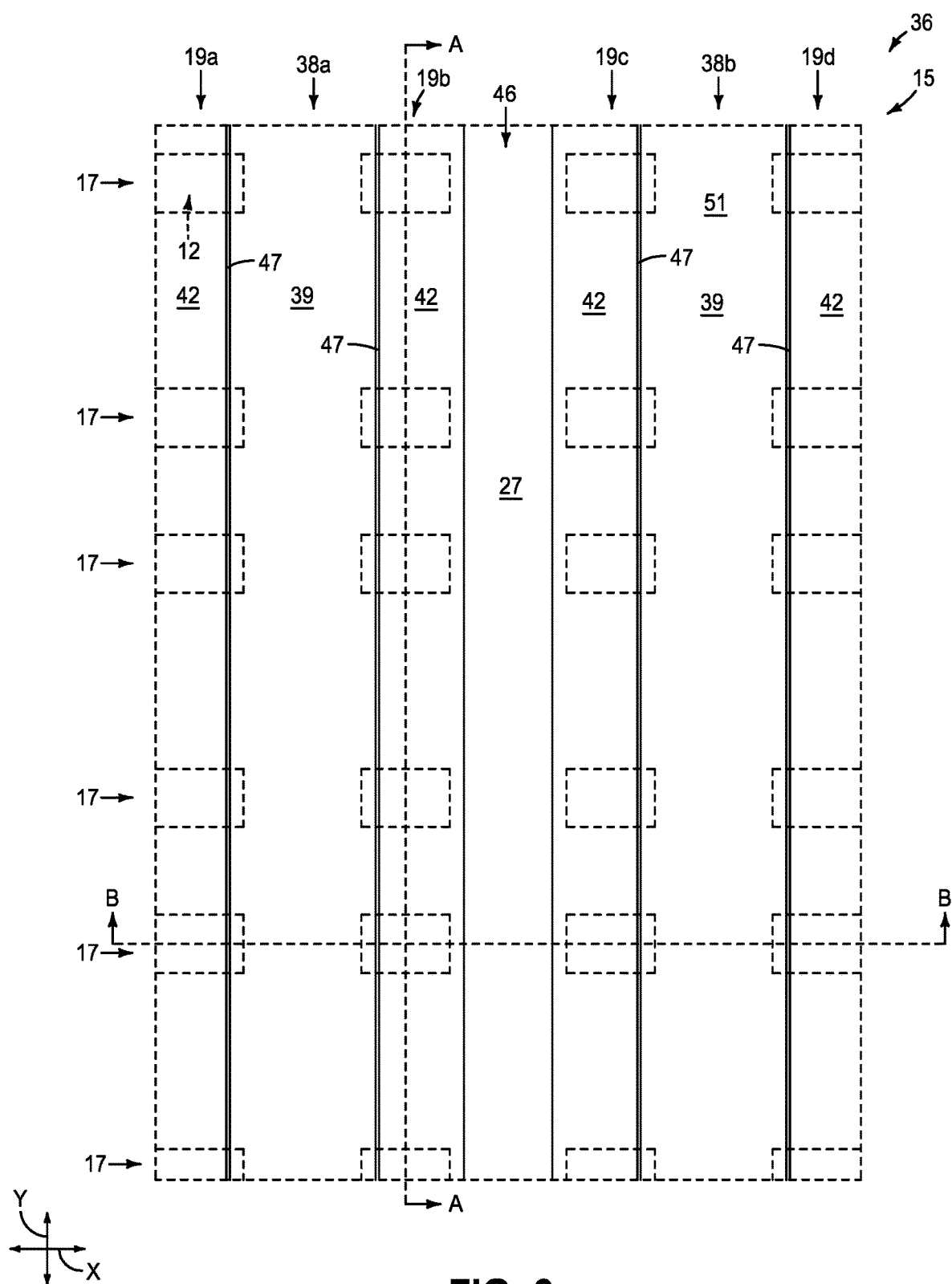
FIGS. 6-6B are diagrammatic views of the region of FIGS. 1-1B at an example process stage following that of FIGS. 5-5B.
Figure 6A:
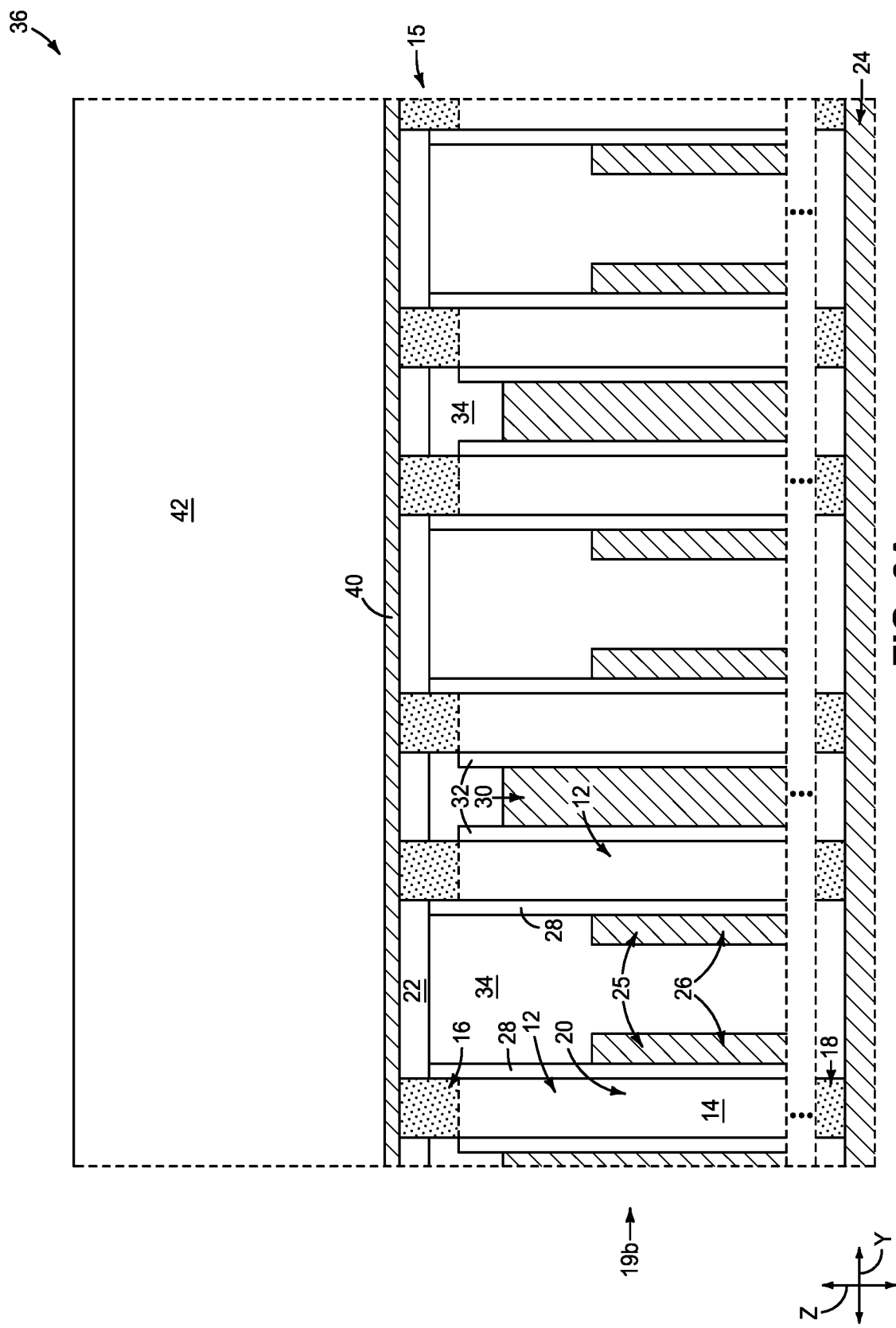
Figure 6B:
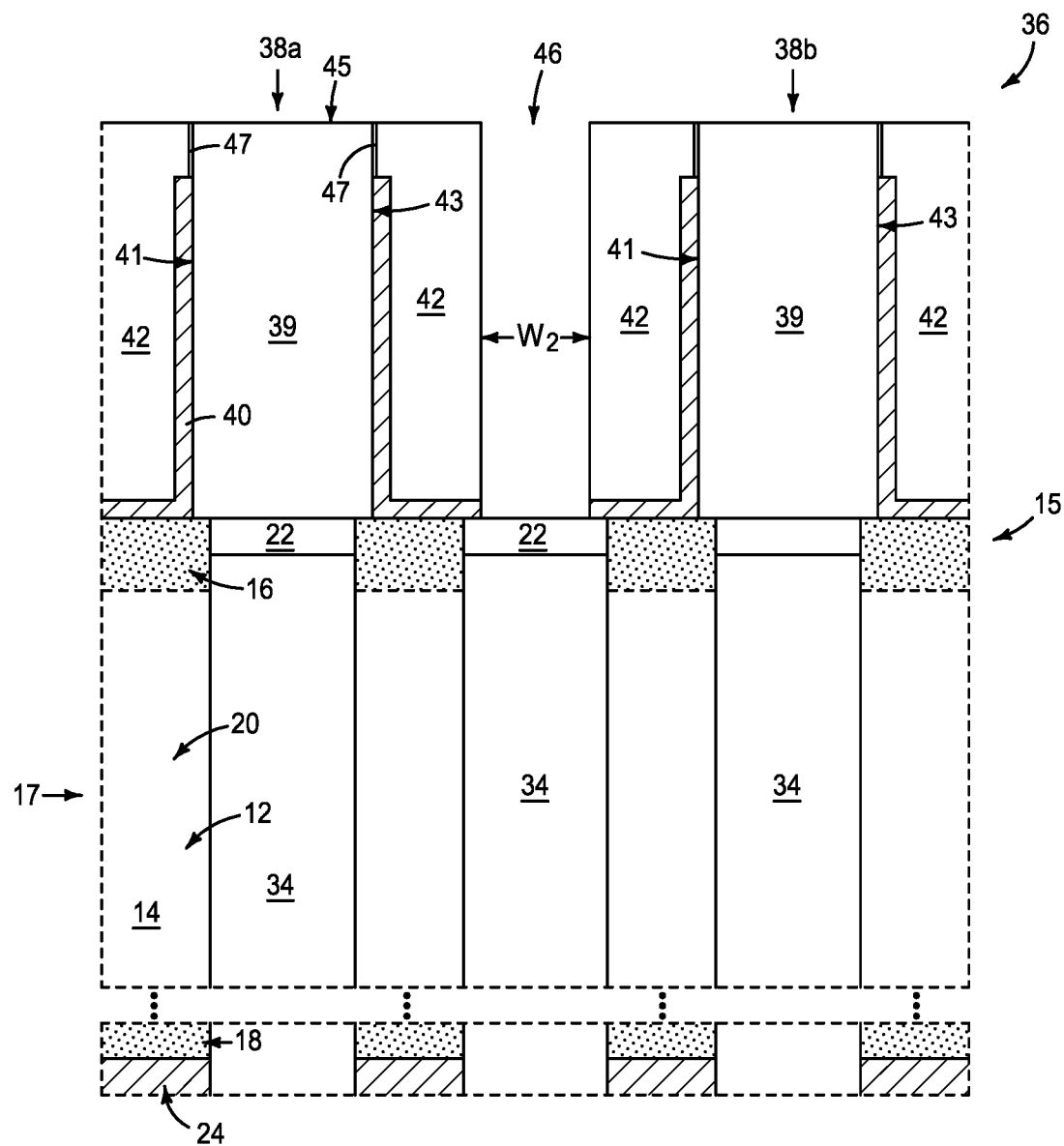

Referring to FIGS. 6-6B, the assembly 36 is subjected to one or more etches, and possibly also planarization, to remove the materials 47 and 42 from over the linear structures (insulative structures) 38; and to extend the valleys 46 through the materials 40 and 42, and to the insulative material 22. The valleys 46 thus become openings 46 which extend through the materials 42 and 40 to the material 22. In the illustrated embodiment, the openings 46 stop at an upper surface of the material 22. In other embodiments, the openings 46 may penetrate into the material 22 (or may even penetrate through the material 22 and stop at the underlying material 34).

The illustrated embodiment shows the upper surfaces of materials 39, 47 and 42 being substantially coplanar. In other embodiments at least one of such upper surfaces may be at a different elevational level relative to one or more of the others of such upper surfaces.

The illustrated opening 46 may, for example, have a width $W_2$ along the cross-section of FIG. 6B within a range of from about 10 nm to about 30 nm.

Figure 7:
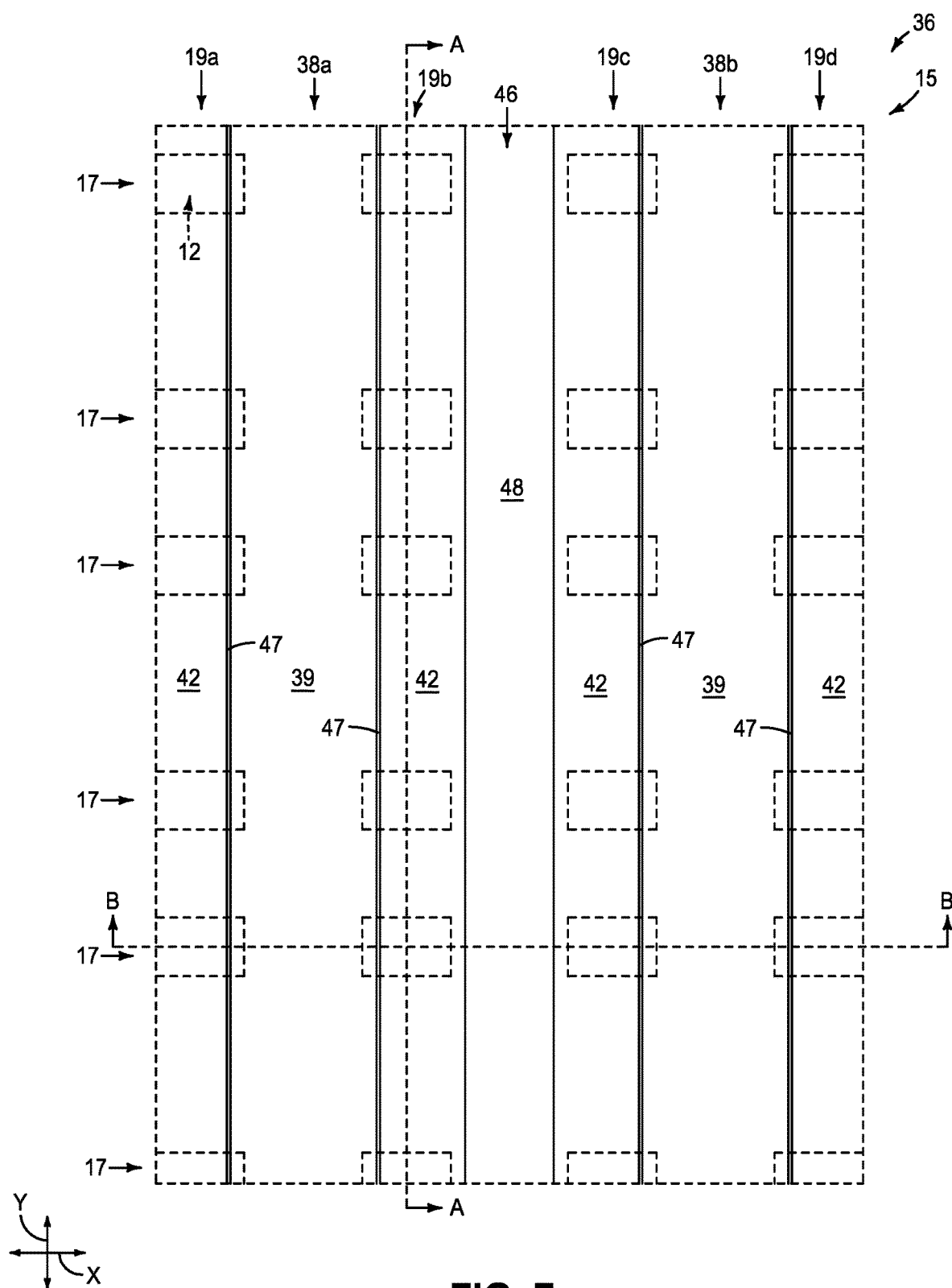
FIGS. 7-7B are diagrammatic views of the region of FIGS. 1-1B at an example process stage following that of FIGS. 6-6B.
Figure 7B:
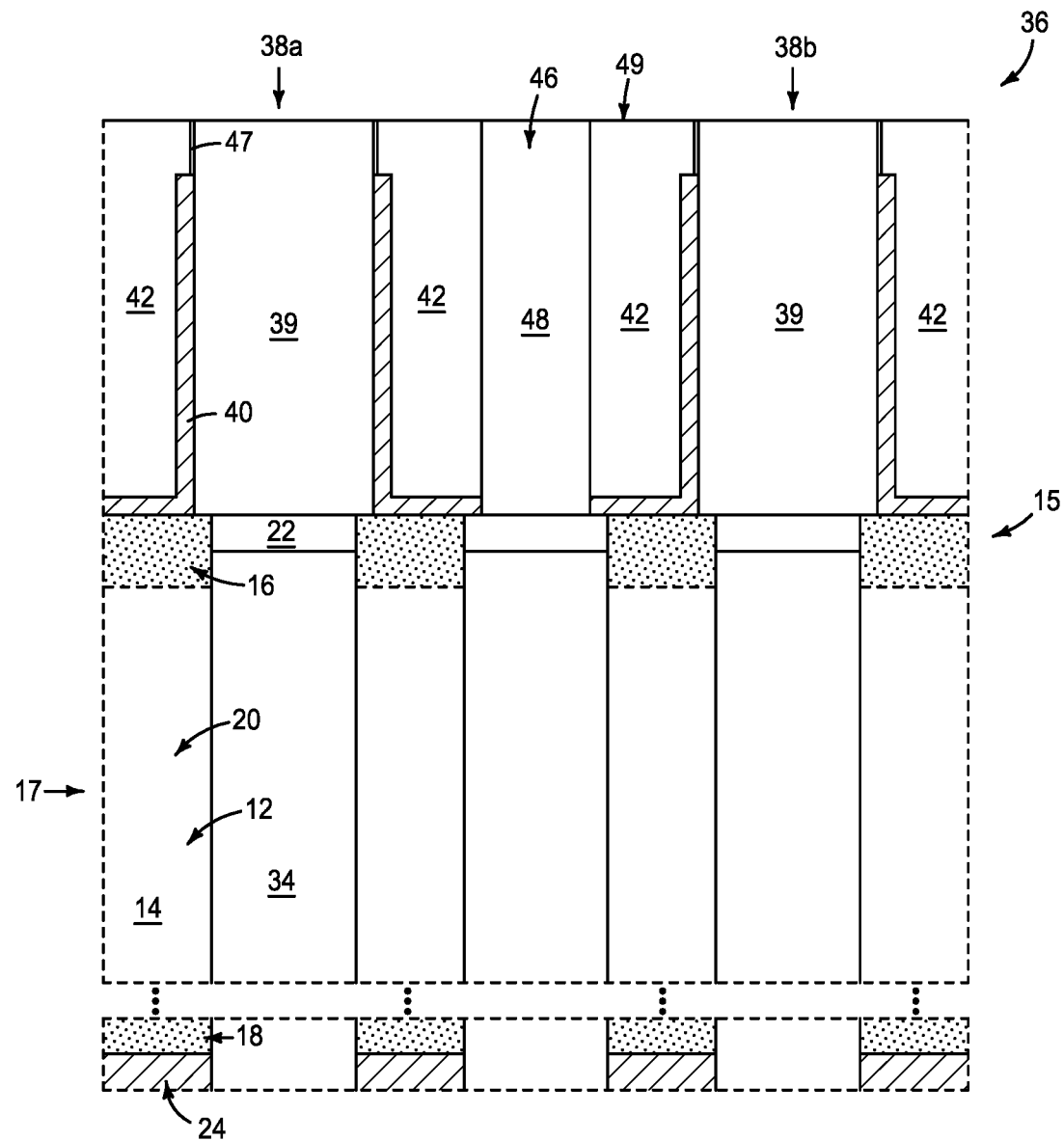

Referring to FIGS. 7-7B, fill material 48 is formed within the opening 46. Subsequently, CMP and/or other suitable planarization is utilized to form a planar surface 49 extending across the materials 39, 42, 47 and 48.

The fill material 48 may comprise any suitable composition(s); and in some embodiments may comprise, consist essentially of, or consist of one or more of silicon dioxide, silicon nitride and silicon oxynitride. Accordingly, the fill material 48 may or may not be a same composition as the patterning material 42.

Figure 8:
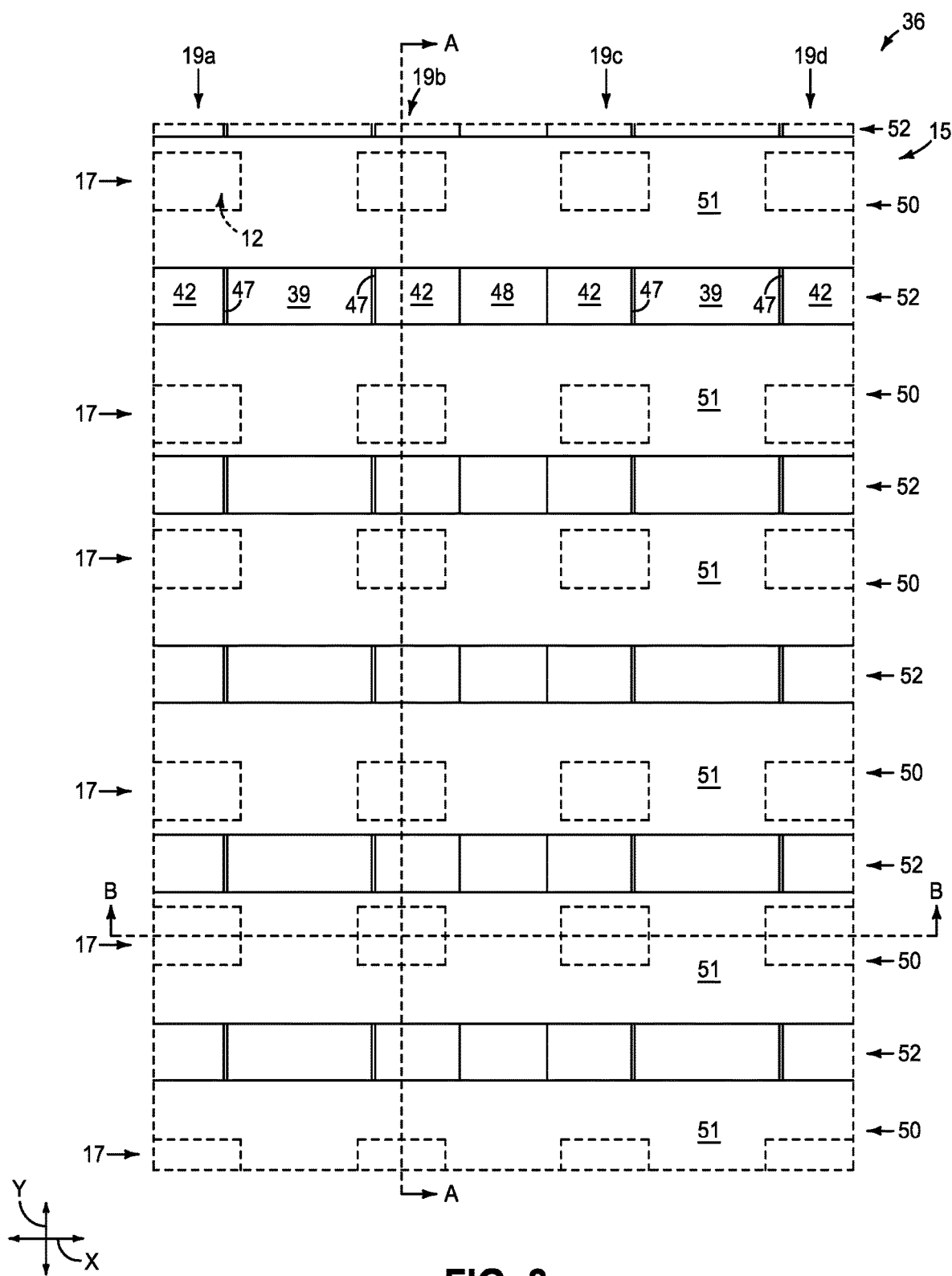
FIGS. 8-8B are diagrammatic views of the region of FIGS. 1-1B at an example process stage following that of FIGS. 7-7B.
Figure 8B:
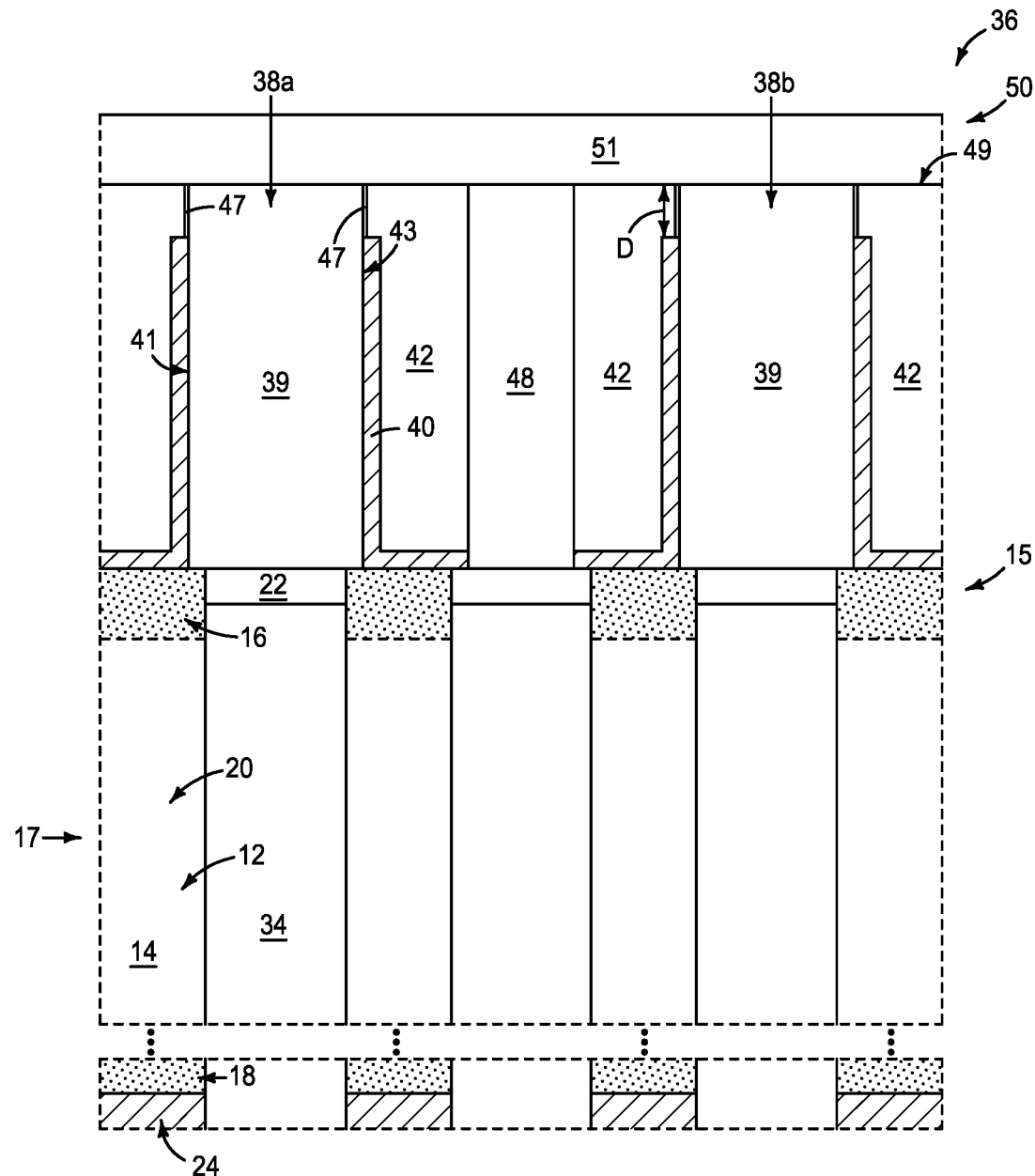

Referring to FIGS. 8-8B, mask structures (beams, rails) 50 are formed on the planar surface 49, and extend along the row direction (the illustrated x-axis direction). The mask structures 50 may comprise any suitable composition(s) 51; and in some embodiments may comprise, consist essentially of, or consist of carbon-containing material (e.g., amorphous carbon, resist, etc.).

The mask structures 50 are spaced from one another by intervening gaps 52.

The mask structures 50 may have any suitable dimensions; and may, for example, have widths $W_3$ along the cross-section of FIG. 8A within a range of from about 10 nm to about 30 nm.

The embodiment of FIGS. 8 and 8A shows the spacings 52 to all be of about the same width along the y-axis direction. In other embodiments (not shown), some of the spacings 52 may vary in width relative to others along the y-axis direction.

Figure 9:
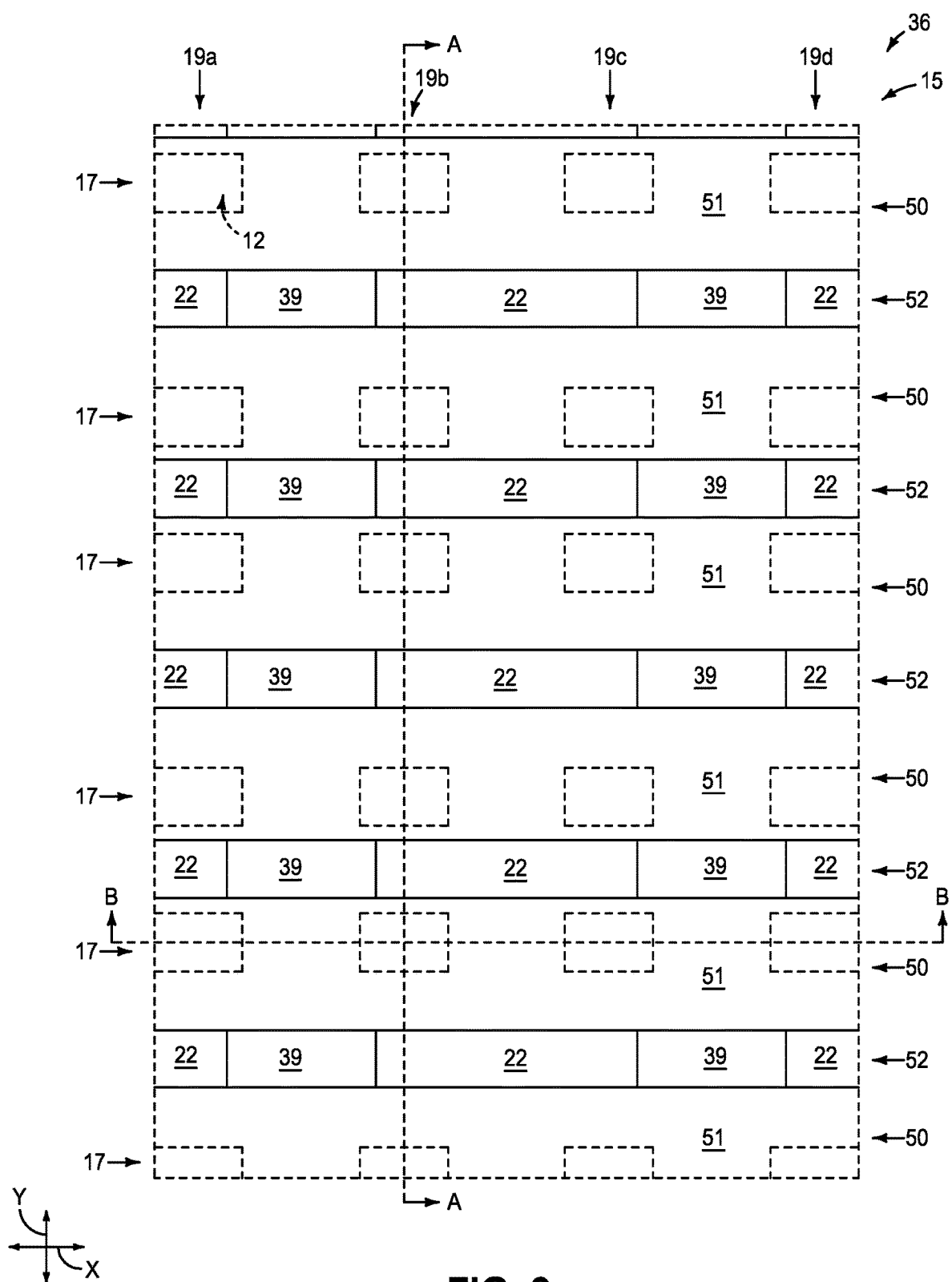
FIGS. 9-9B are diagrammatic views of the region of FIGS. 1-1B at an example process stage following that of FIGS. 8-8B.
Figure 9A:
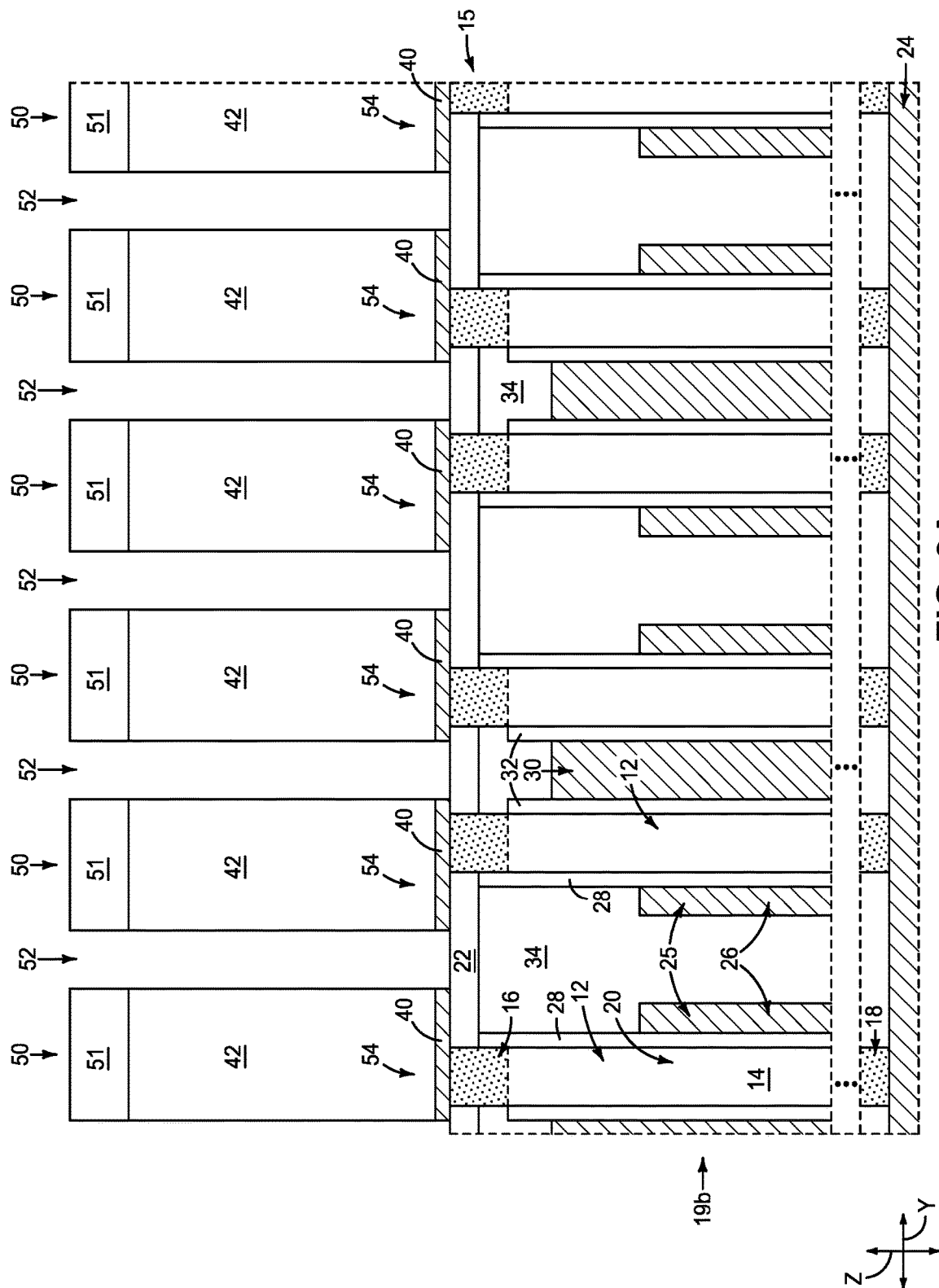
Figure 9B:
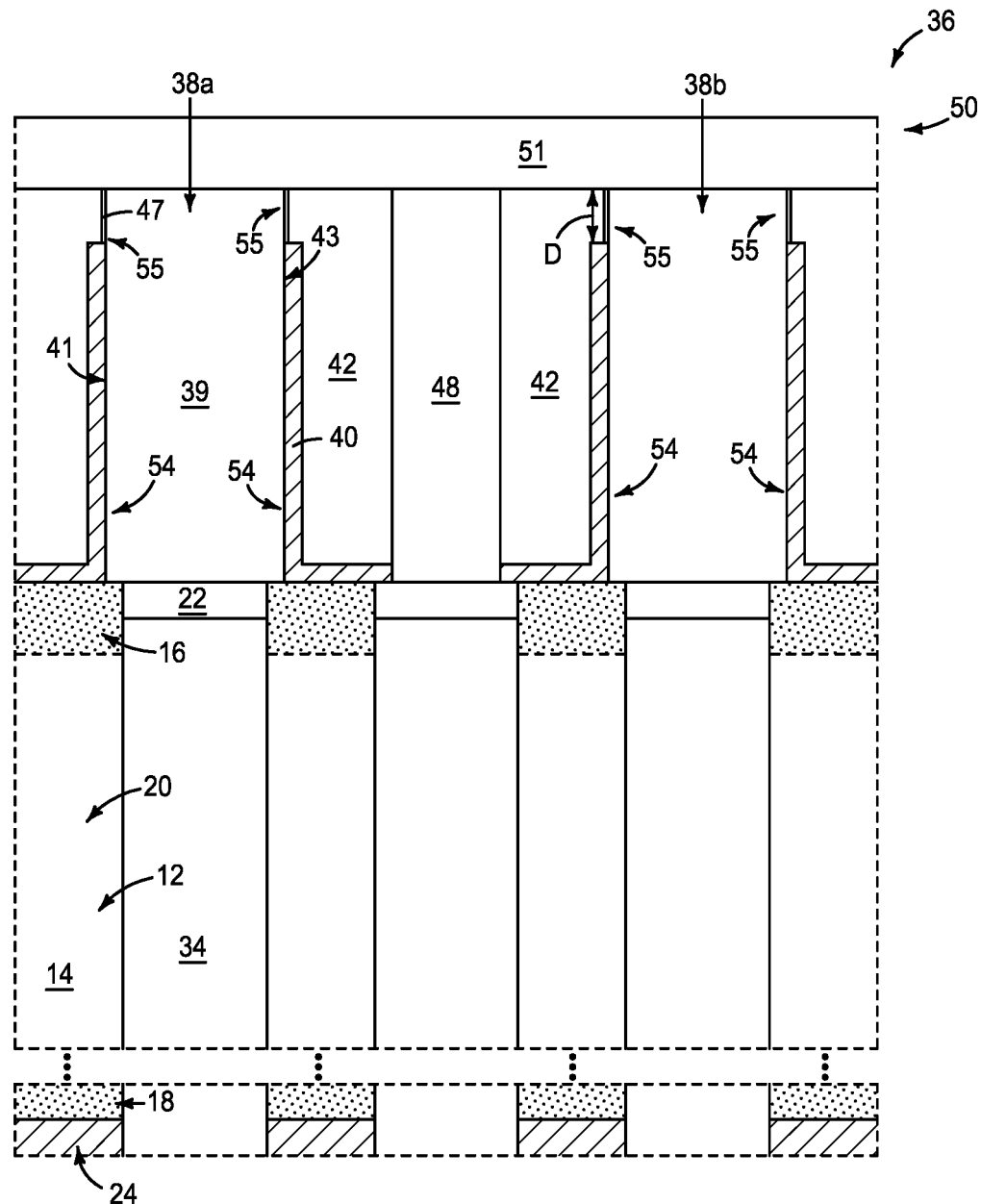

Referring to FIGS. 9-9B, the gaps 52 are extended through the materials 40, 42, 47 and 48, and to an upper surface of the insulative material 22. In other embodiments (not shown), the gaps 52 may punch into the material 22, or even through the material 22 and into the underlying insulative material 34.

The gaps 52 may be extended through the materials 42, 47, 48 and 40 with any suitable processing, including, for example, dry etching to anisotropically etch through the materials 42, 47, 48 and 40. In some embodiments, dry etching may be utilized to anisotropically etch through the materials 42, 47 and 48, and then a wet etch may be utilized to extend the openings 52 through the thin layer corresponding to the bottom-electrode-material 40.

The patterning of the bottom-electrode-material 40 at the process stage of FIGS. 6-6B (which forms the bottom-electrode-material 40 into strips extending along the y-axis direction), and the subsequent processing shown in FIGS. 9-9B (which subdivides the strips utilizing the trenches 52 that extend along the x-axis direction) may be considered to pattern the bottom-electrode-material 40 into bottom-electrode-structures (bottom electrodes) 54. Each of the bottom-electrode-structures is over one of the source/drain regions 16, and may be considered to be associated with such one of the vertically-extending pillars 12.

The processing of FIGS. 9-9B may also be considered to pattern strips of the leaker-device-material 47 (such strips are shown in the top-down view of FIG. 6) into leaker-device-structures 55 (shown in FIG. 9B). The leaker-device-structures 55 are along the sidewalls 41 and 43 of the insulative structures 38, and are over (and directly against) the bottom-electrode-structures 54. The leaker-device-structures 55 may have any suitable vertical dimensions (vertical lengths) D, and in some embodiments such vertical dimensions may be less than or equal to about 10 nm.

Figure 10:
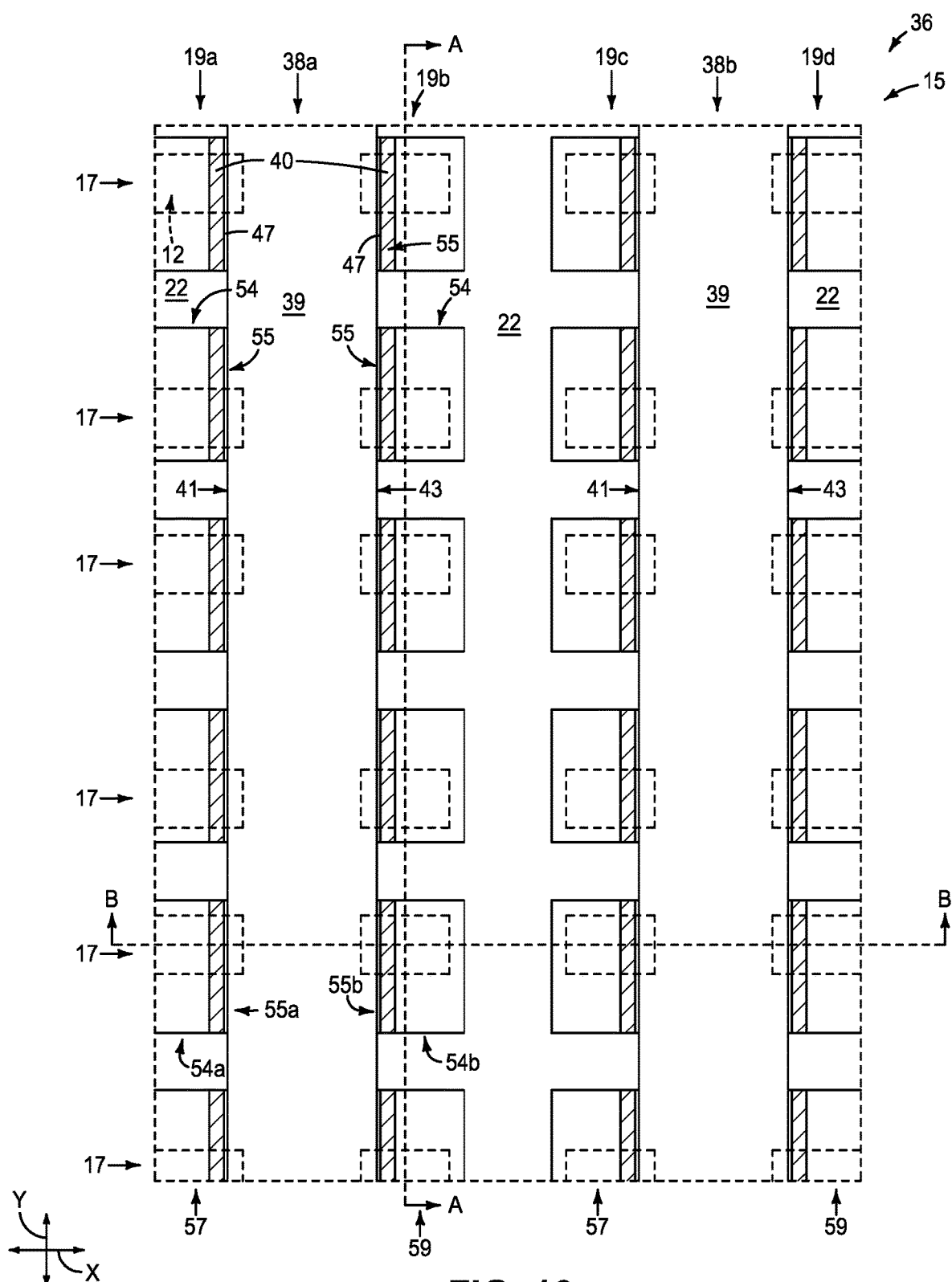
FIGS. 10-10C are diagrammatic views of the region of FIGS. 1-1B at an example process stage following that of FIGS. 9-9B.
Figure 10A:
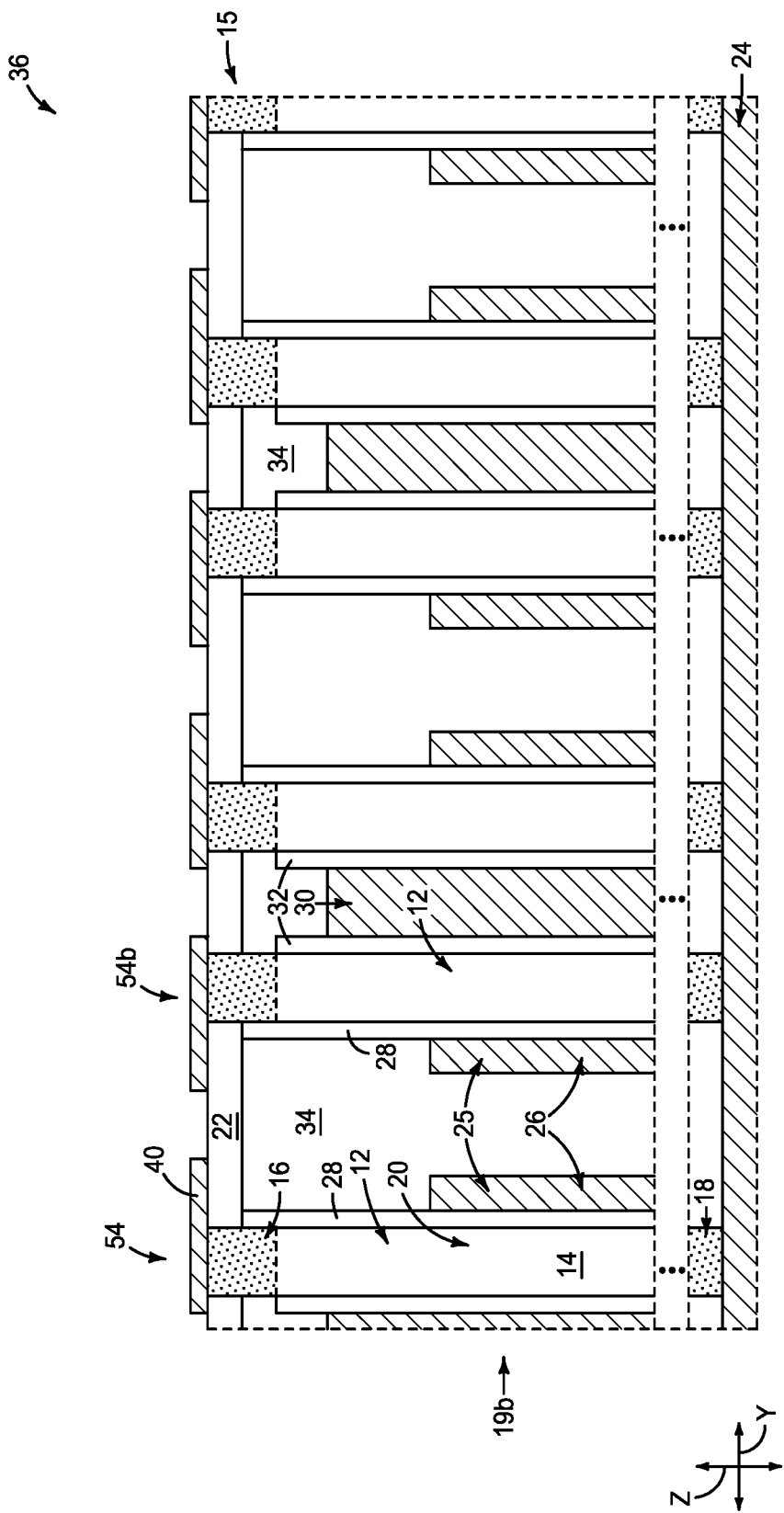
FIGS. 10A and 10B are cross-sectional side views along the lines A-A and B-B, respectively, of FIG. 10.
Figure 10B:
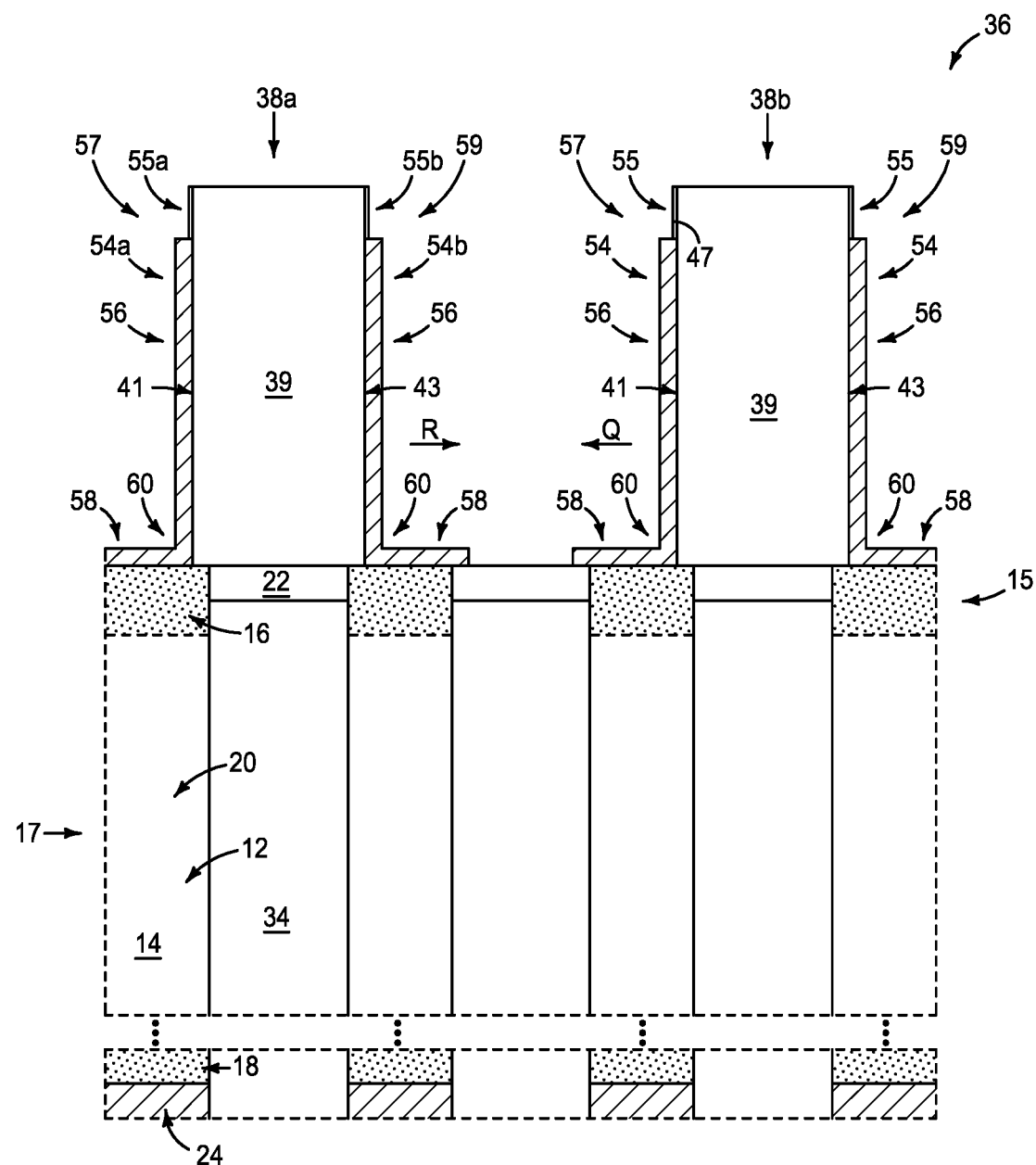
Figure 10C:
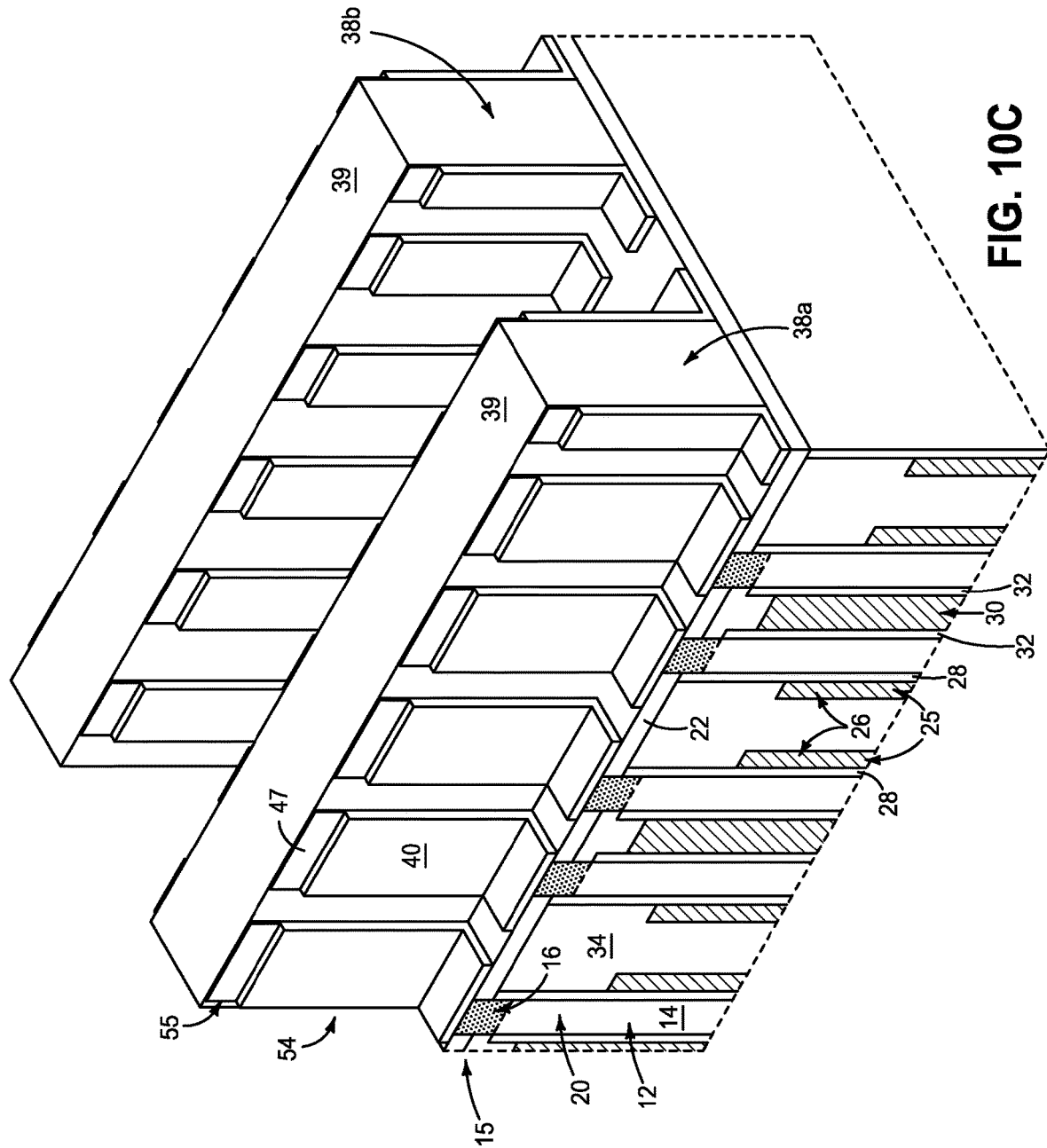

Referring to FIGS. 10-10C, the materials 51, 42 and 48 are removed with one or more suitable etches. The bottom electrodes 54 remain along the linear structures 38, as do the leaker-device-structures 55.

Each of the bottom-electrode-structures 54 has a vertical segment 56 along one of sidewalls (41, 43) of a linear structure (insulative structure) 38, and has a horizontal segment 58 along a source/drain region 16. The horizontal segments 58 join to the vertical segments 56 at corners 60. The corners 60 may be about 90° (i.e., may be approximately right angles), with the term "about 90°" meaning 90° to within reasonable tolerances of fabrication and measurement. In some embodiments, the term about 90° may mean 90°±10°.

In some embodiments, the horizontal segments 58 may be referred to as first segments, and the vertical segments 56 may be referred to as second segments. The first and second segments 58 and 56 may or may not be substantially orthogonal to one another, depending on whether the sidewalls (41, 43) are vertical (as shown) or tapered.

In the illustrated embodiment, the vertical segments 56 are longer than the horizontal segments 58. In other embodiments, the segments 56 and 58 may be about the same length as one another, or the horizontal segments 58 may be longer than the vertical segments 56.

The bottom-electrode-structures 54 may be considered to be configured as angle plates, and in the shown embodiment are in one-to-one correspondence with the upper source/drain regions 16. Each of the bottom electrodes 54 may be considered to be electrically coupled with an associated source/drain region 16 of an associated pillar 12.

The bottom-electrode-structures 54 adjacent the first lateral sides 41 of the linear structures 38 may be considered to correspond to a first set 57 of the bottom-electrode-structures 54, and the bottom-electrode-structures 54 adjacent the second lateral sides 43 of the linear structures 38 may be considered to correspond to a second set 59 of the bottom-electrode-structures 54. The horizontal segments 58 of the bottom electrodes 54 within the first set 57 project in a first direction Q (with direction Q being shown in FIG. 10B), and the horizontal segments 58 of the bottom electrodes 54 within the second set 59 project in a second direction R (with direction R being shown in FIG. 10B). The direction R is opposite to the direction Q. In some embodiments, the bottom electrodes of the first set 57 may be considered to be substantially mirror images of the bottom electrodes of the second set 59, where the term "substantial mirror image" means a mirror image to within reasonable tolerances of fabrication and measurement.

Two of the bottom electrodes 54 of FIGS. 10-10B are labeled as 54a and 54b, and such may be referred to as first and second bottom electrodes, respectively. The leaker-device-structures extending upwardly from the bottom electrodes 54a and 54b are labeled as 55a and 55b, and may be referred to as first and second leaker-device-structures, respectively.

FIG. 10C shows a three-dimensional view of the configuration of FIGS. 10-10B to assist the reader in visualizing such example configuration.

Figure 11:
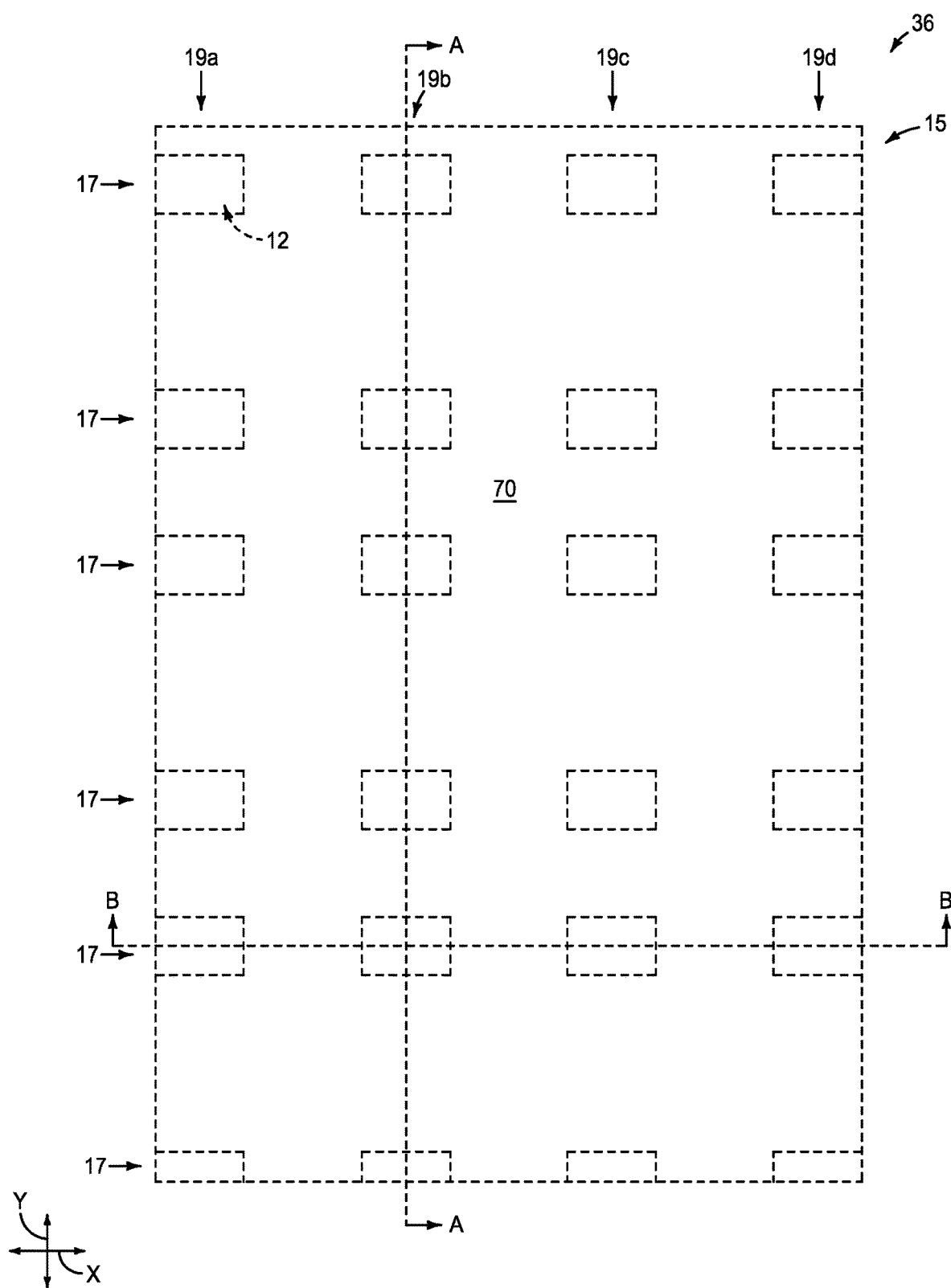
FIGS. 11-11B are diagrammatic views of the region of FIGS. 1-1B at an example process stage following that of FIGS. 10-10C.
Figure 11A:
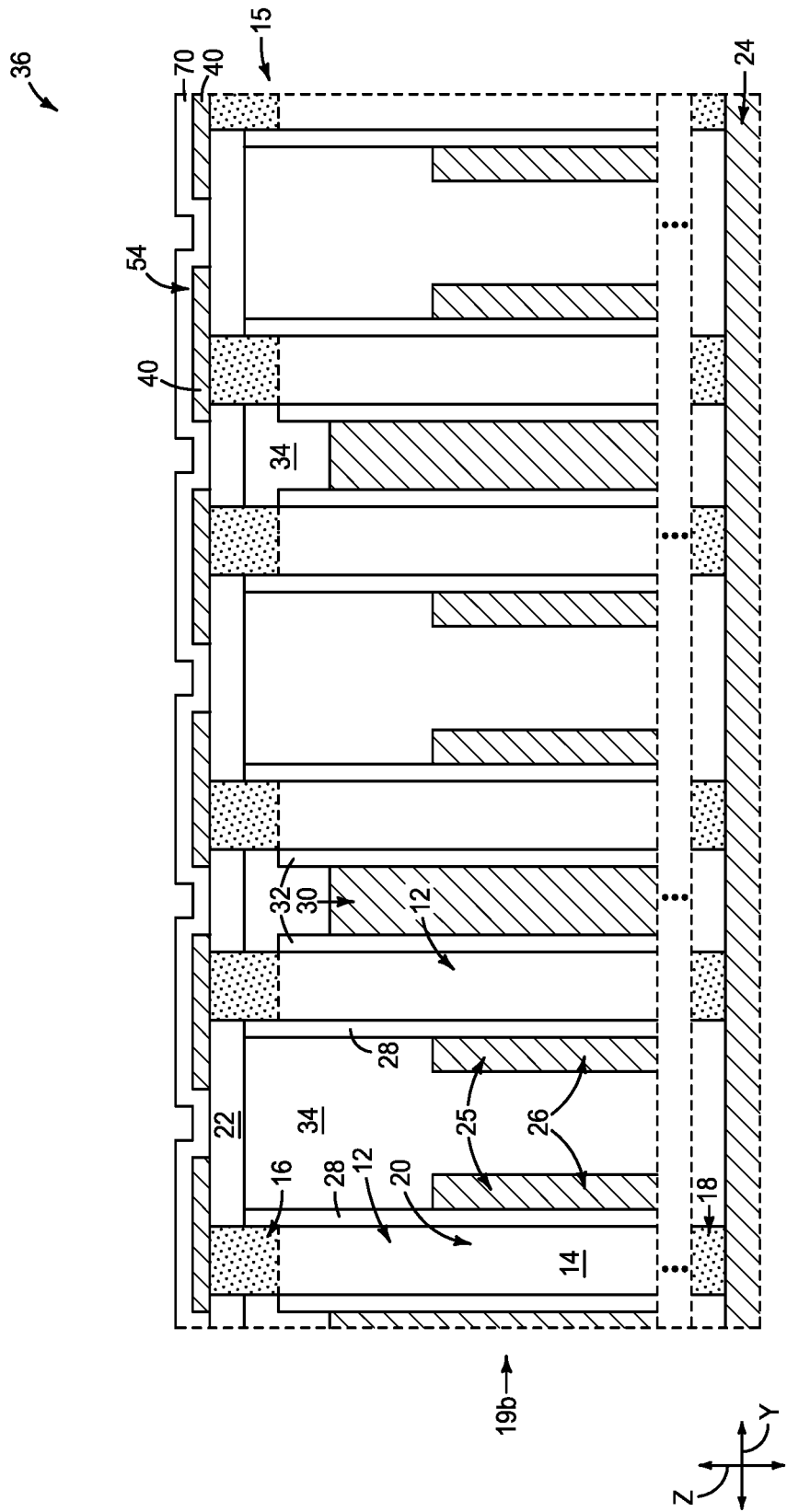
Figure 11B:
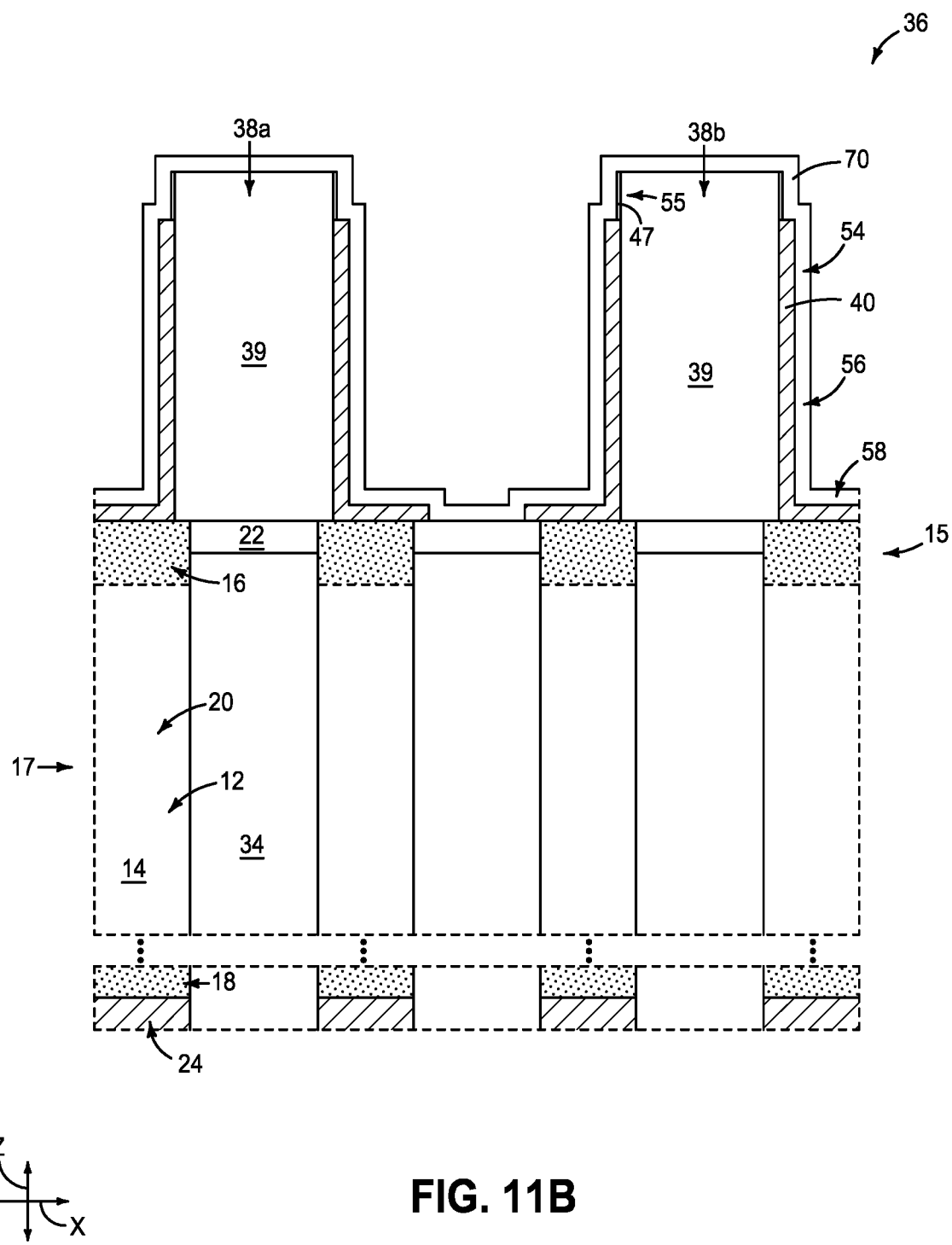

Referring to FIGS. 11-11B, ferroelectric-insulative-material 70 is formed over the bottom-electrode-structures 54, and is directly against the bottom-electrode-structures 54. In the shown embodiment, the ferroelectric-insulative-material 70 extends across the material 22 between the bottom electrodes 54, extends over the bottom electrodes, and extends over the linear features 38. The ferroelectric-insulative-material 70 is laterally adjacent to the leaker-device-structures 55, is laterally adjacent to the vertical segments 56 of the bottom electrodes, and is over the horizontal segments 58 of the bottom electrodes.

The ferroelectric-insulative-material 70 may comprise any suitable composition or combination of compositions; and in some example embodiments may include one or more of transition metal oxide, zirconium, zirconium oxide, niobium, niobium oxide, hafnium, hafnium oxide, lead zirconium titanate, and barium strontium titanate. Also, in some example embodiments the ferroelectric-insulative-material may have dopant therein which comprises one or more of silicon, aluminum, lanthanum, yttrium, erbium, calcium, magnesium, strontium, and a rare-earth element.

The ferroelectric-insulative-material 70 may be formed to any suitable thickness; and in some embodiments may be formed to a thickness within a range of from about 30 Å to about 250 Å.

Figure 12:
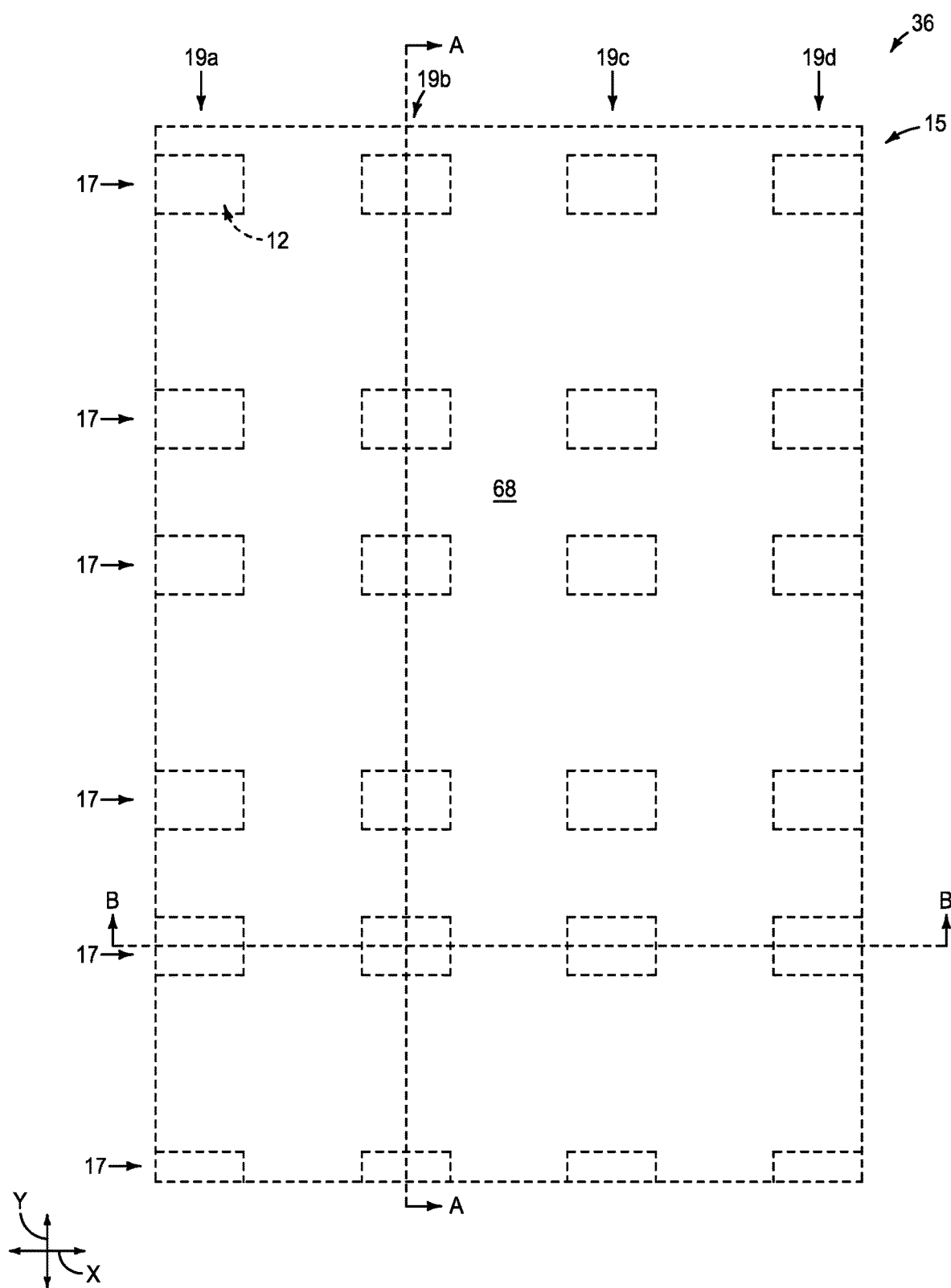
FIGS. 12-12B are diagrammatic views of the region of FIGS. 1-1B at an example process stage following that of FIGS. 11-11B.
Figure 12A:
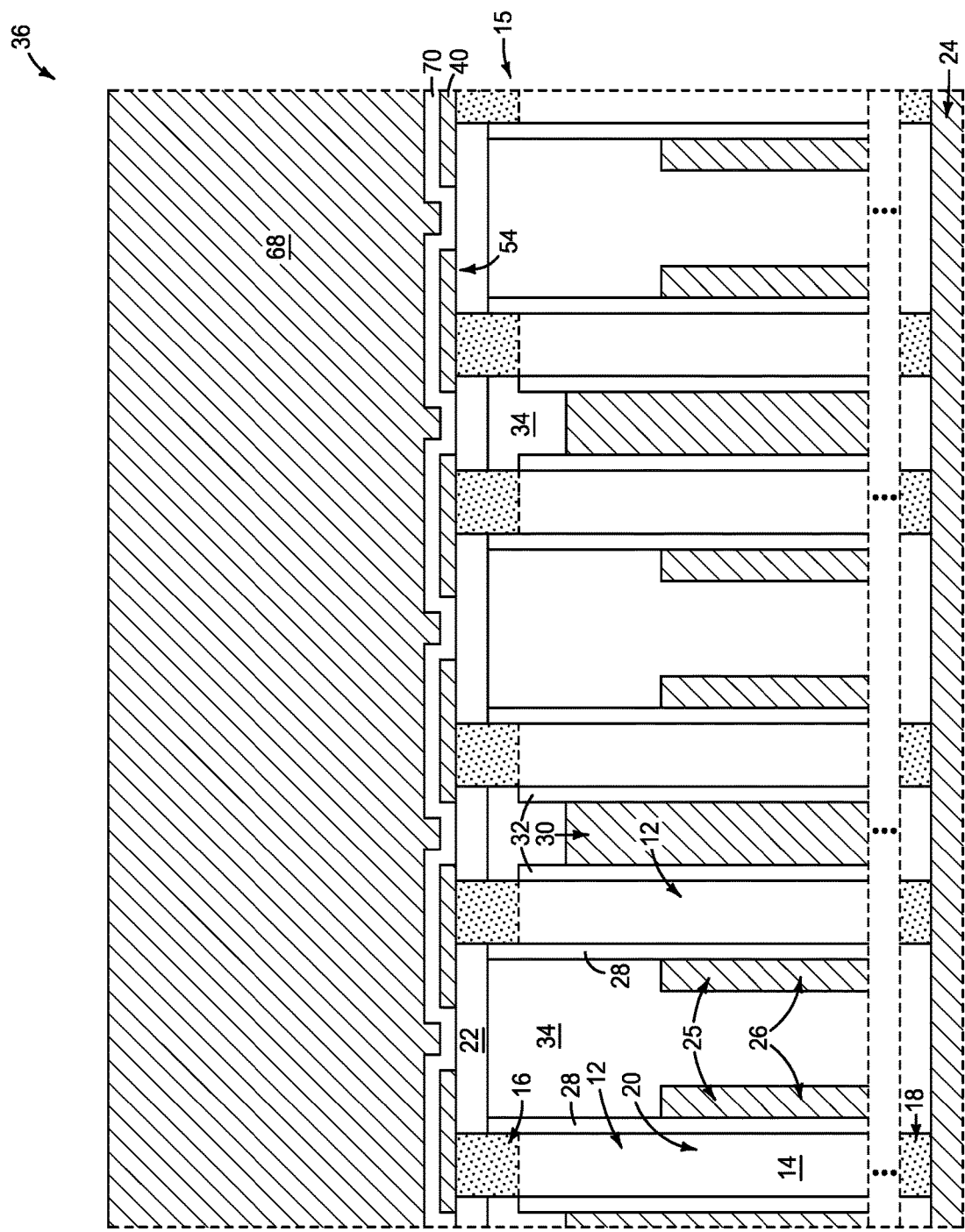
Figure 12B:
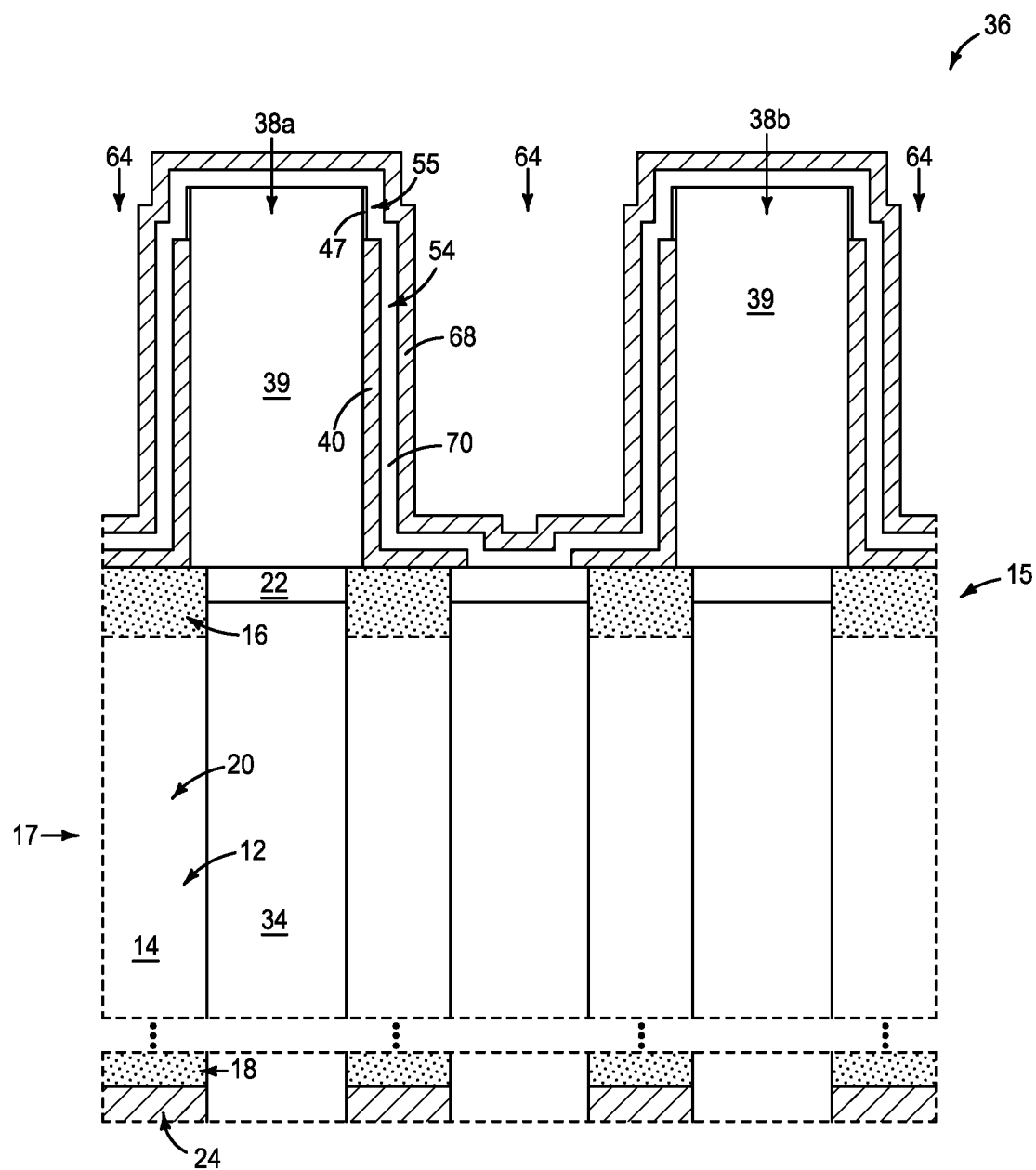

Referring to FIGS. 12-12B, top-electrode-material 68 is formed over the ferroelectric-insulative-material 70. The top-electrode-material 68 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the top-electrode-material 68 may comprise, consist essentially of, or consist of one or more of molybdenum silicide, titanium nitride, titanium silicon nitride, ruthenium silicide, ruthenium, molybdenum, tantalum nitride, tantalum silicon nitride and tungsten. In some embodiments, the top-electrode-material 68 may comprise, consist essentially of, or consist of titanium nitride.

The top-electrode-material 68 may have any suitable thickness, and in some embodiments may have a thickness of at least about 10 Å, at least about 100 Å, at least about 500 Å, etc.

The electrode materials 40 and 68 may comprise a same composition as one another in some embodiments, or may comprise different compositions relative to one another. In some embodiments, the electrode materials 40 and 68 may both comprise, consist essentially of, or consist of titanium nitride.

The embodiment of FIGS. 12-12B shows gaps 64 (FIG. 12B) in regions between the structures 38a and 38b. In some embodiments, the electrode material 68 may be formed thick enough to fill such gaps.

Figure 13:
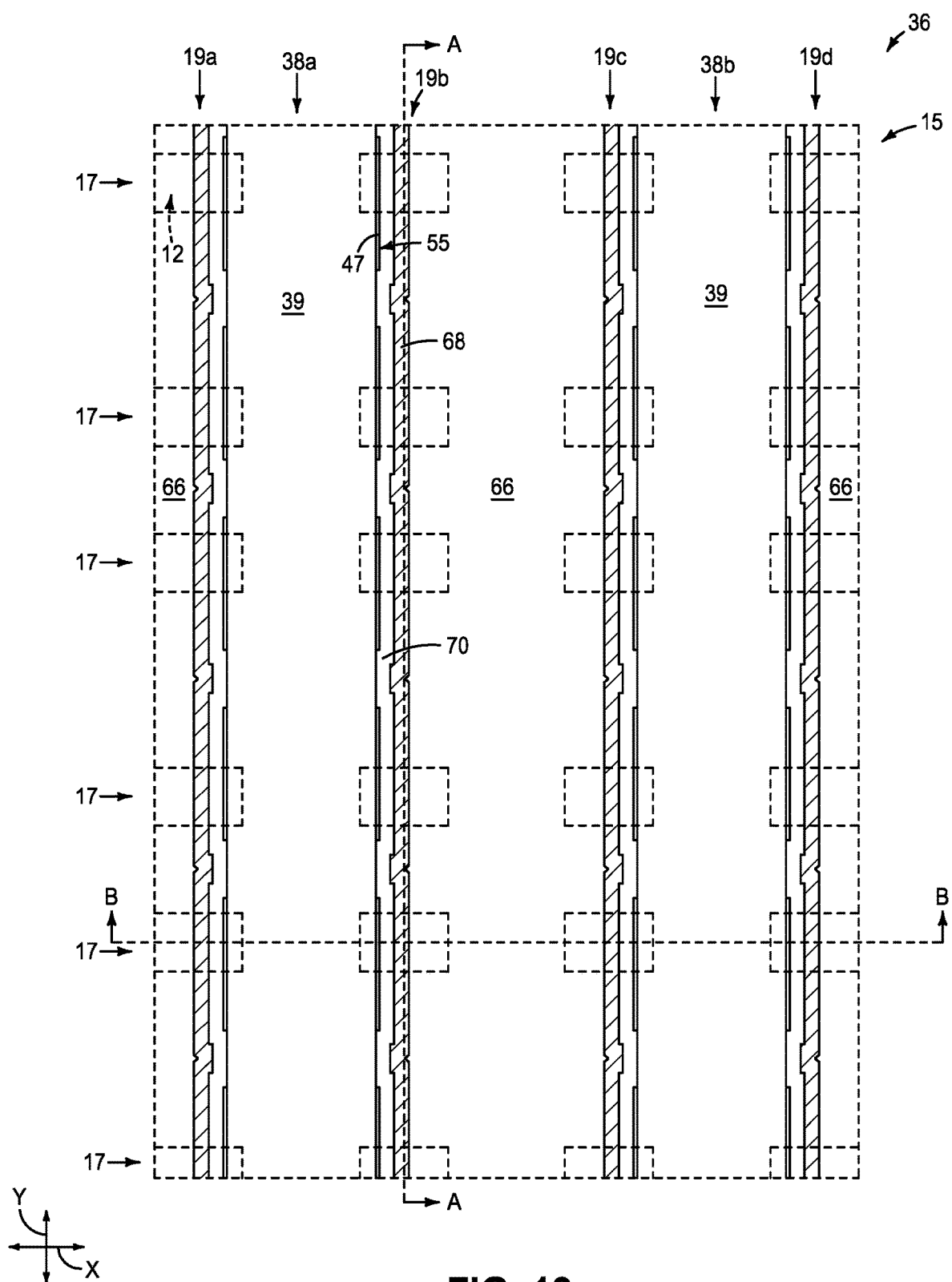
FIGS. 13-13B are diagrammatic views of the region of FIGS. 1-1B at an example process stage following that of FIGS. 12-12B.
Figure 13A:
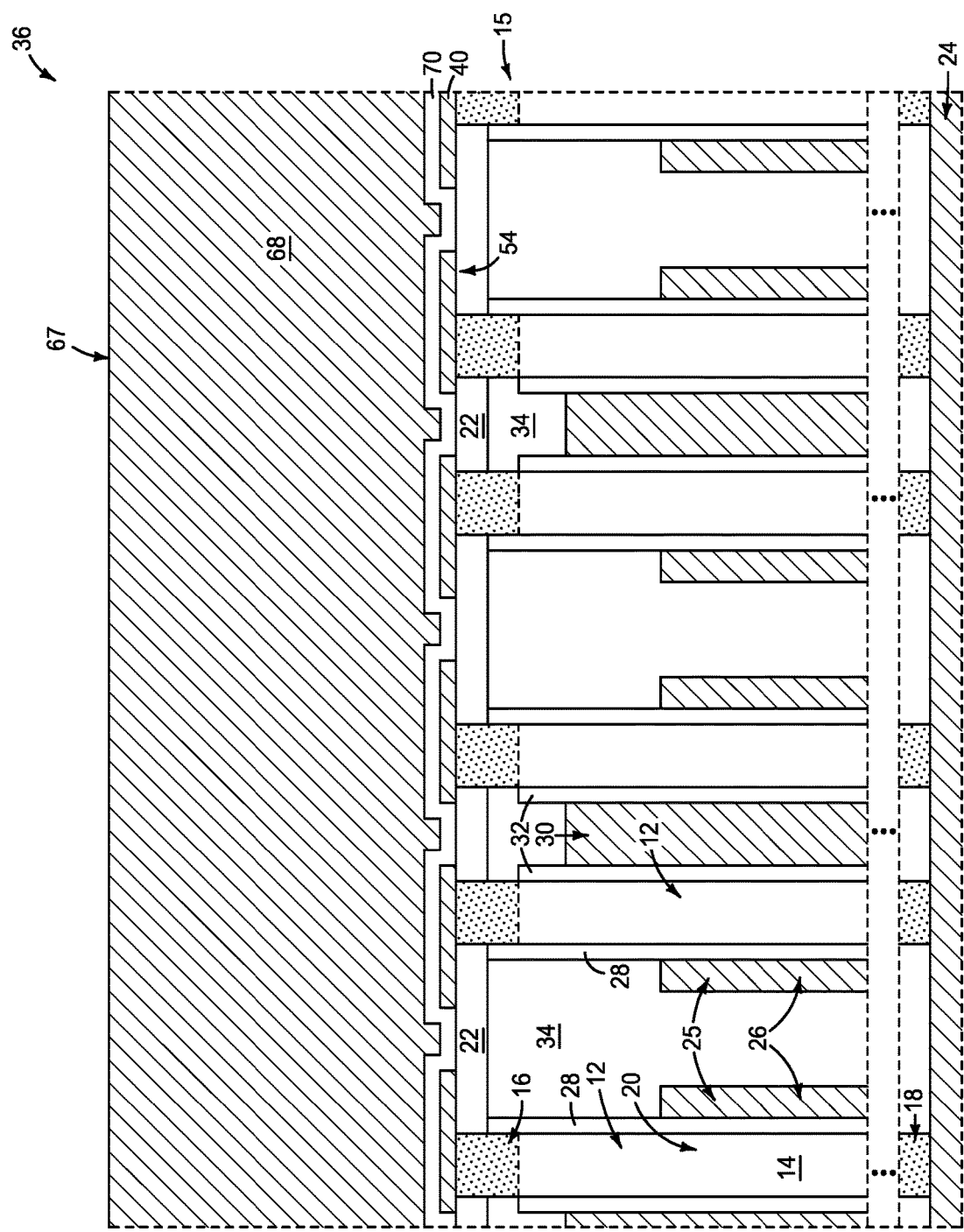
Figure 13B:
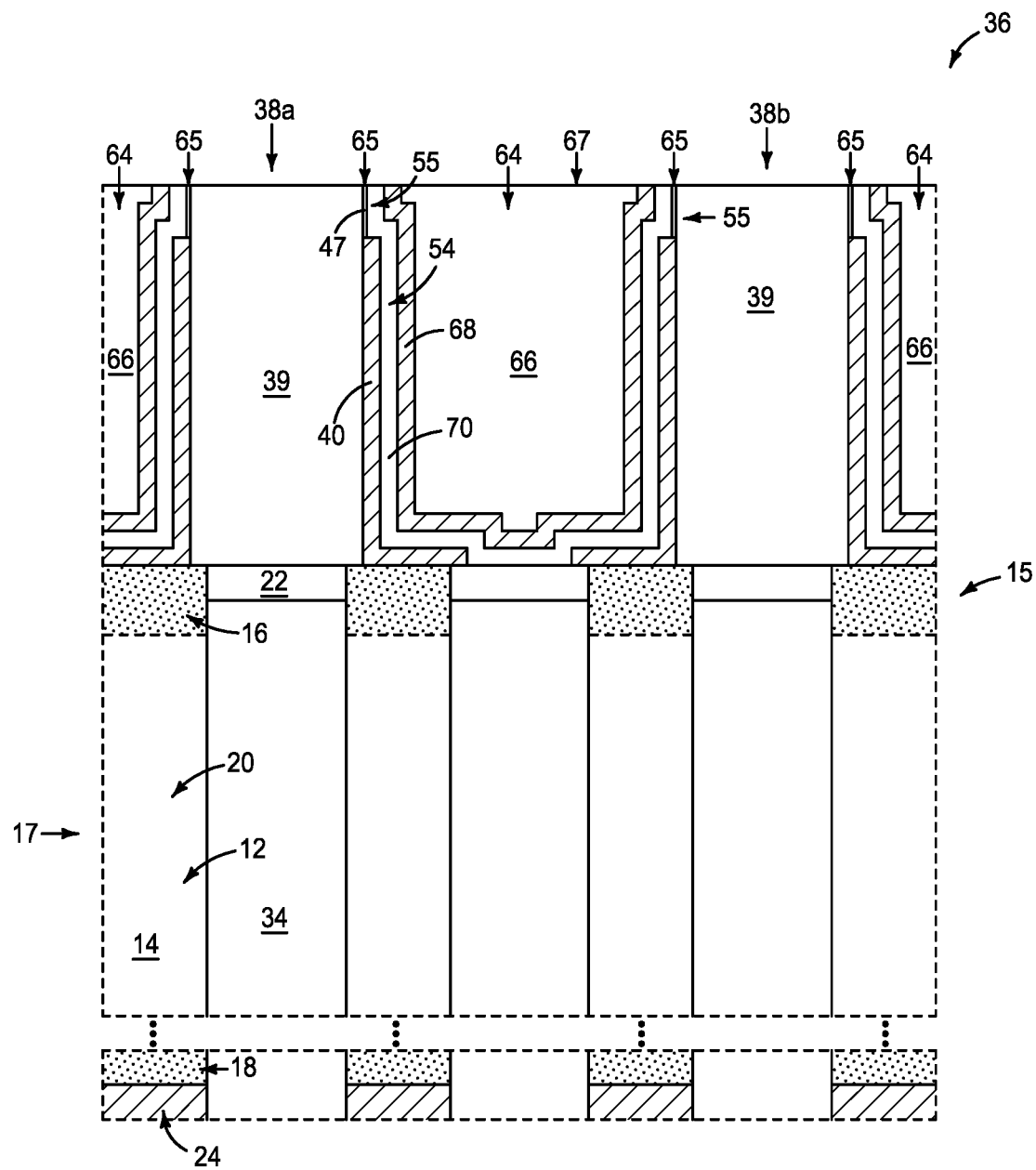

Referring to FIGS. 13-13B, protective material 66 is formed within the gaps 64, and subsequently planarization (e.g., CMP) is utilized to form a planarized surface 67. Upper edges 65 of the leaker-device-structures 55 are exposed along the surface 67.

The protective material 66 may comprise any suitable composition(s), such as, for example, silicon dioxide, silicon nitride, carbon, photoresist, etc. If the material 68 fills the gaps 64 at the process stage of FIGS. 12-12B, the protective material 66 of FIGS. 13-13B may be omitted.

Figure 14:
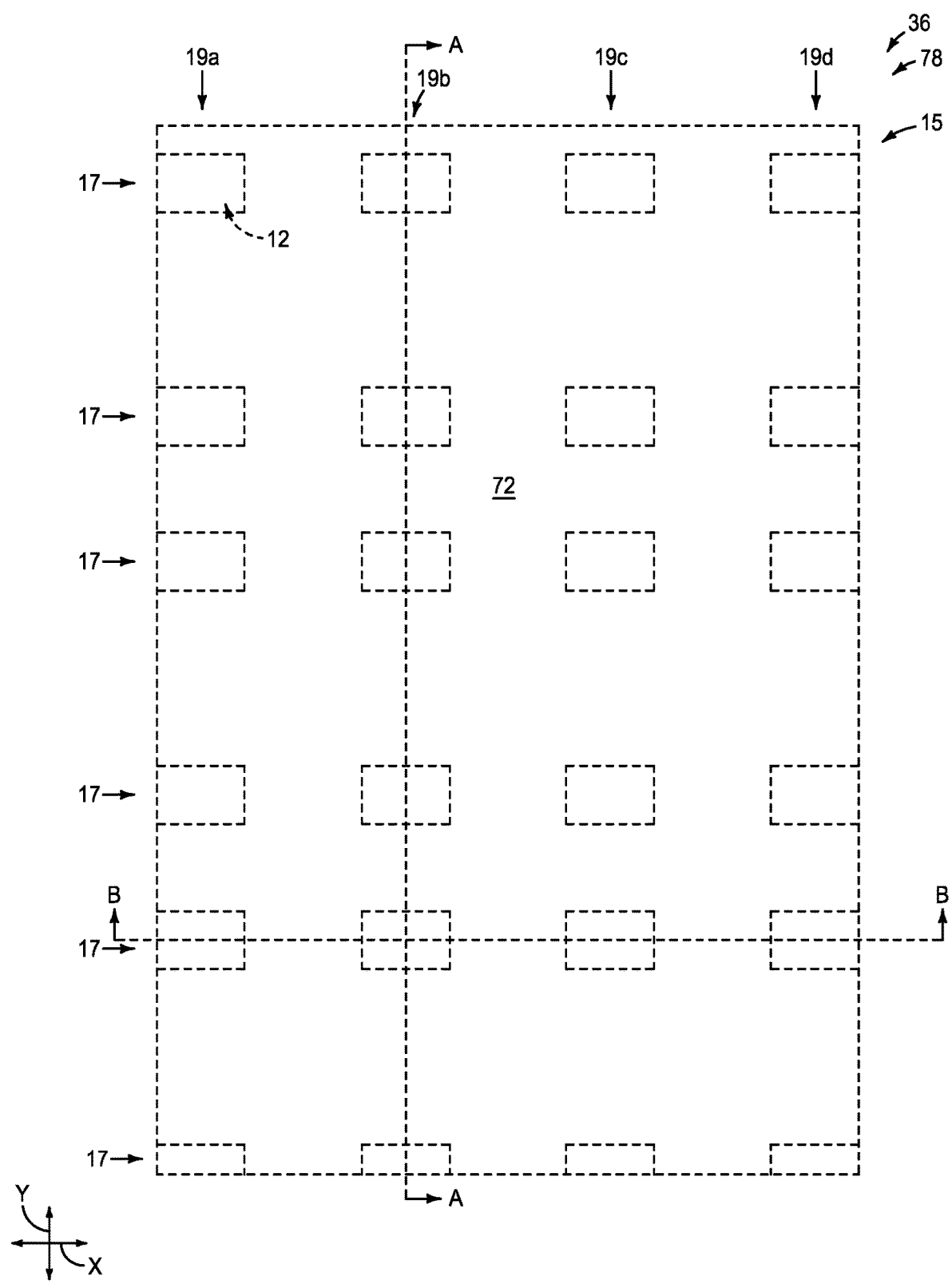
FIGS. 14-14B are diagrammatic views of the region of FIGS. 1-1B at an example process stage following that of FIGS. 13-13B.
Figure 14A:
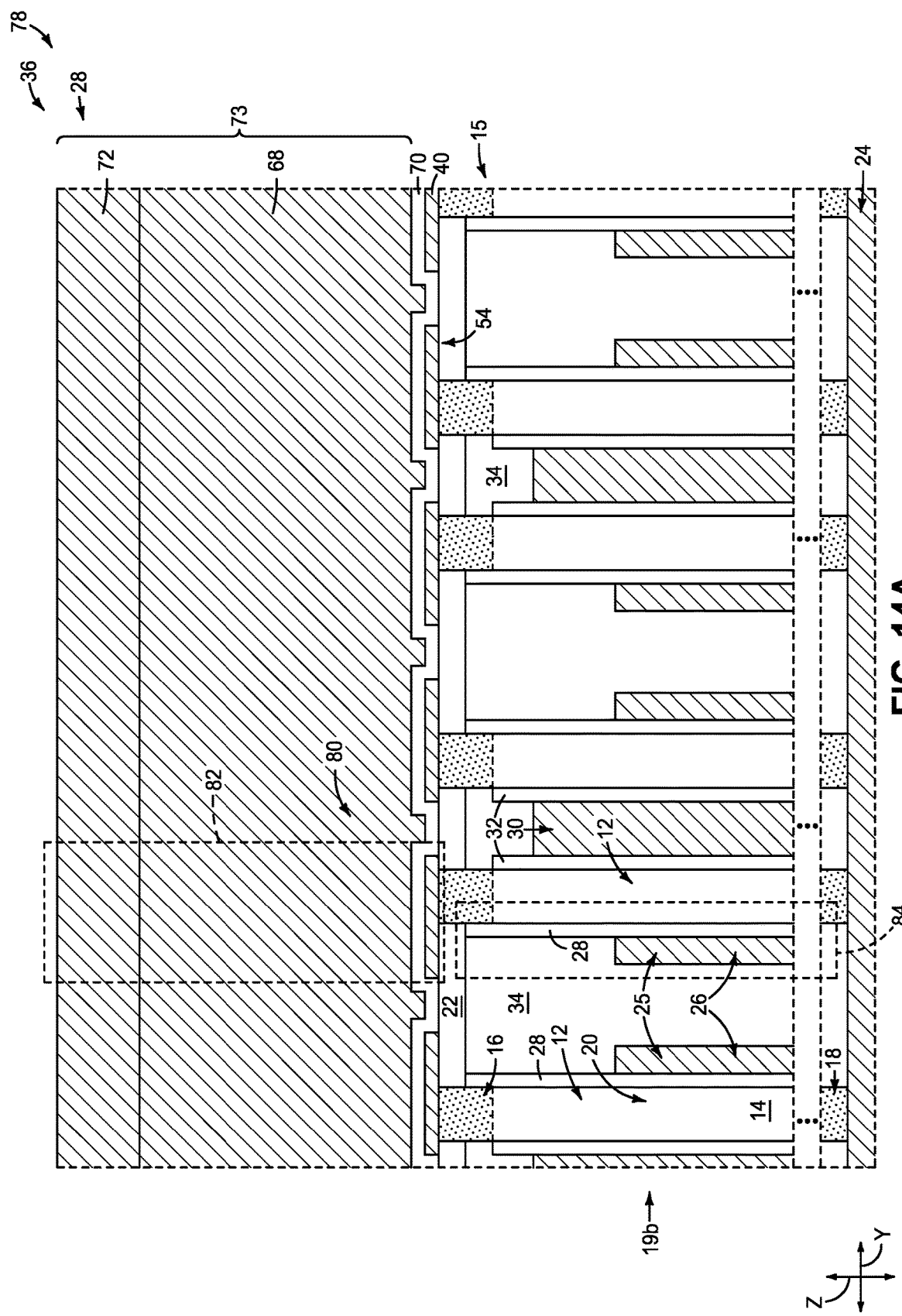
Figure 14B:
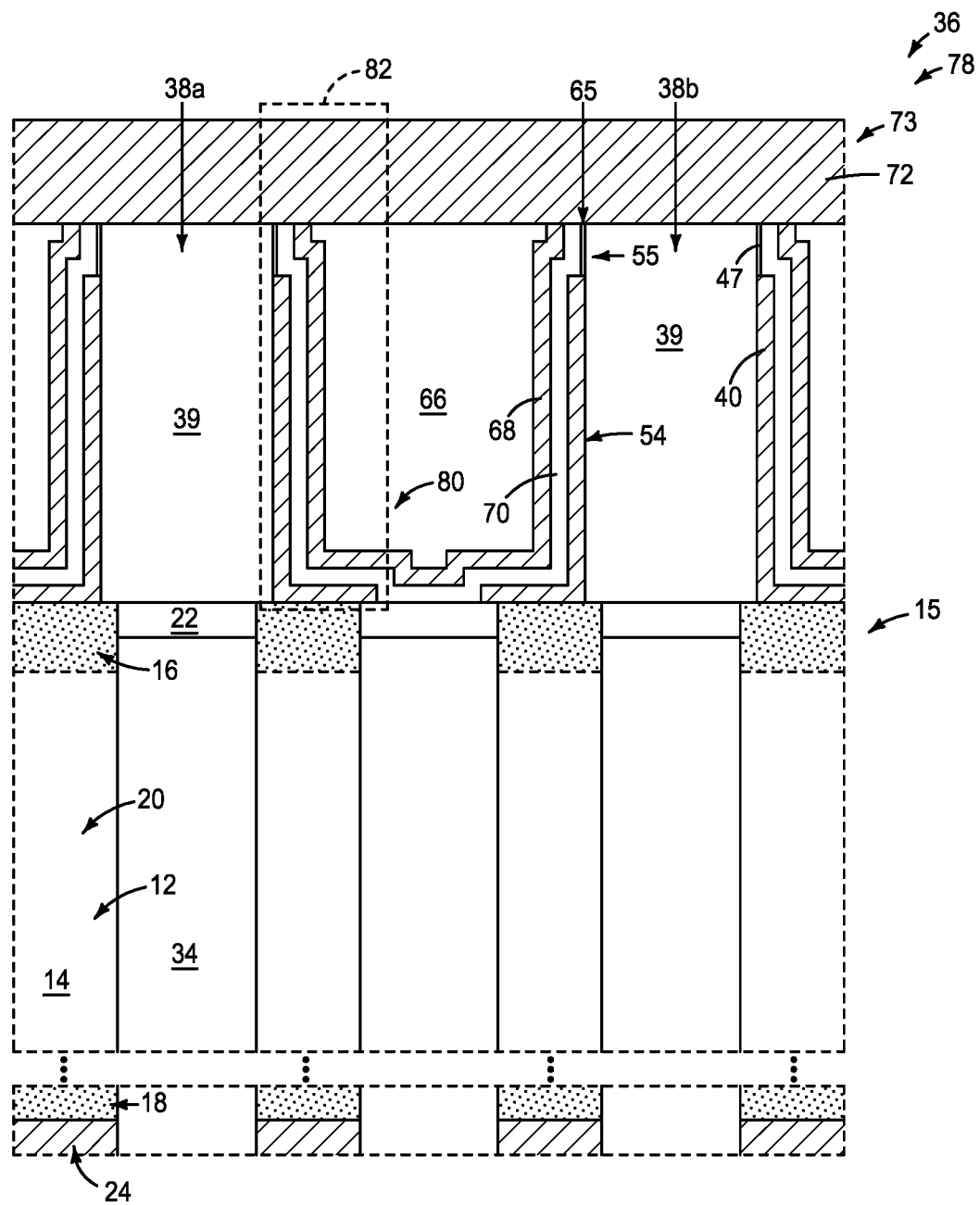

Referring to FIGS. 14-14B, additional top-electrode-material 72 is formed over the top-electrode-material 68. The material 72 may be referred to as plate material. The material 72 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The material 72 may or may not comprise a same composition as the material 68. In some embodiments, the material 68 comprises, consists essentially of, or consists of titanium nitride, and the material 72 comprises, consists essentially of, or consists of tungsten.

The conductive materials 68 and 72 together form a top electrode (or a plate electrode) 73.

The top-electrode-material 72 is directly against the upper edges 65 (FIG. 14B) of the leaker-device-structures 55. Accordingly, the leaker-device-structures 55 extend between the bottom electrodes 54 and the plate electrode 73, and are directly against the bottom electrodes 54 and the plate electrode 73.

The bottom electrodes 54, ferroelectric material 70, and plate electrode (top electrode) 73 together form capacitors 82 (one of which is labeled in each of FIGS. 14A and 14B). The capacitors are incorporated into memory cells 80 (one of which is labeled in each of FIGS. 14A and 14B), with the memory cells forming a memory array 78.

In some embodiments, the leaker-device-structures (leaker devices) 55 may be considered to be resistive interconnects coupling bottom electrodes 54 to the top electrode 73 within the individual capacitors 82, and may be utilized to drain excess charge from the bottom electrodes 54 to alleviate or prevent undesired charge build-up. If the leaker devices 55 are too leaky, then one or more memory cells 80 may experience cell-to-cell disturb. If the leaker devices 55 are not leaky (conductive) enough, then excess charge from the bottom electrodes 54 may not be adequately drained. Persons of ordinary skill in the art will recognize how to calculate the resistance desired for the leaker devices 55 for a given memory array. In some embodiments, the leaker devices 55 may have resistance within a range of from about 0.1 megaohms to about 5 megaohms. Factors such as separation between adjacent memory cells, physical dimensions of the memory cells, the amount of charge placed in the memory cells, a size of the memory array, a frequency of operations conducted by the memory array, etc., may be considered when making a determination of the resistance appropriate for the leaker devices 55.

The integrated assembly 36 of FIGS. 14-14B may be considered to correspond to a portion of the memory array (memory device) 78. Such memory array includes the memory cells 80 which each include a capacitor 82. The capacitors each include one of the bottom electrodes 54, and each include regions of the insulative material 70 and the top electrode (plate electrode) 73.

The individual memory cells 80 each include an access transistor 84 coupled with the capacitor 82 (one of the access transistors 84 is diagrammatically indicated in FIG. 14A). Each of the access transistors 84 includes a pillar 12 and a region of a transistor gate 26 adjacent such pillar.

Each of the memory cells 80 is uniquely addressed by one of the wordlines 25 in combination with one of the digit lines 24. In some embodiments, the memory cells 80 may be considered to be substantially identical to one another, and to be representative of a large number of substantially identical memory cells which may be formed across the memory array 78. For instance, the memory array may comprise hundreds, thousands, hundreds of thousands, millions, hundreds of millions, etc., of the memory cells. The wordlines 25 may be representative of a large number of substantially identical wordlines that may extend along rows of the memory array, and the digit lines 24 may be representative of a large number of substantially identical digit lines that may extend along columns of the memory array. The term "substantially identical" means identical to within reasonable tolerances of fabrication and measurement.

The capacitors 82 are ferroelectric capacitors comprising the ferroelectric-insulative-material. Accordingly, the memory array 78 may comprise FeRAM.

Some embodiments include recognition that it may be advantageous to sub-divide the top electrode 73 into multiple plates. Voltage to the individual plates may be independently controlled, which may enable the electric field across the ferroelectric material 70 to be tailored within specific regions of the memory array 78 during memory operations (e.g., READ/WRITE operations). Such may enable charge/discharge rates of the capacitors 82 to be increased, which may improve operational speeds associated with memory cells 80 of the memory array 78. It may be particularly advantageous for the top-electrode-material to be subdivided with slits extending along the column direction (i.e., the y-axis direction of the figures).

Figure 15:
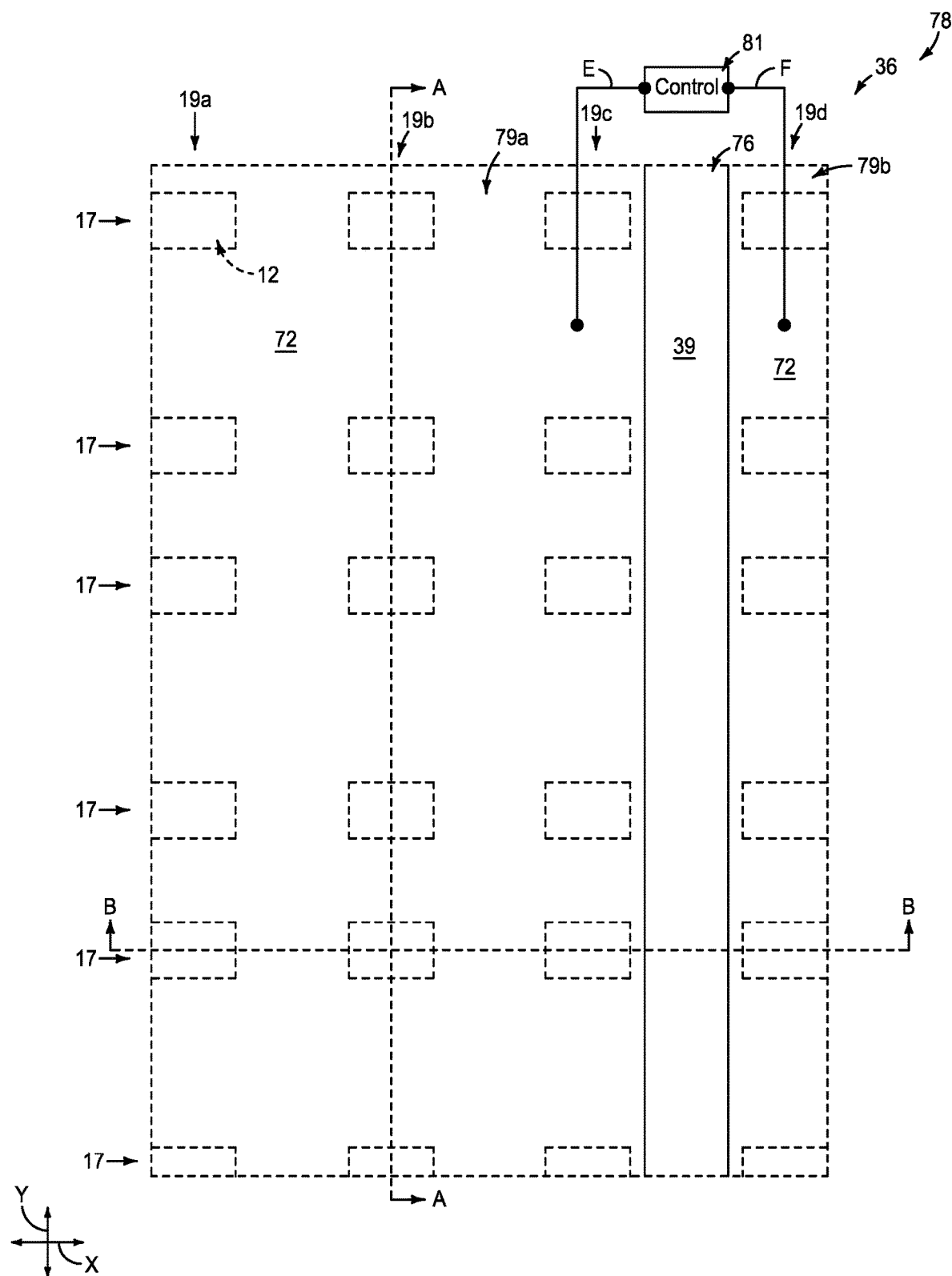
FIGS. 15-15B are diagrammatic views of the region of FIGS. 1-1B at an example process stage following that of FIGS. 14-14B.
Figure 15A:
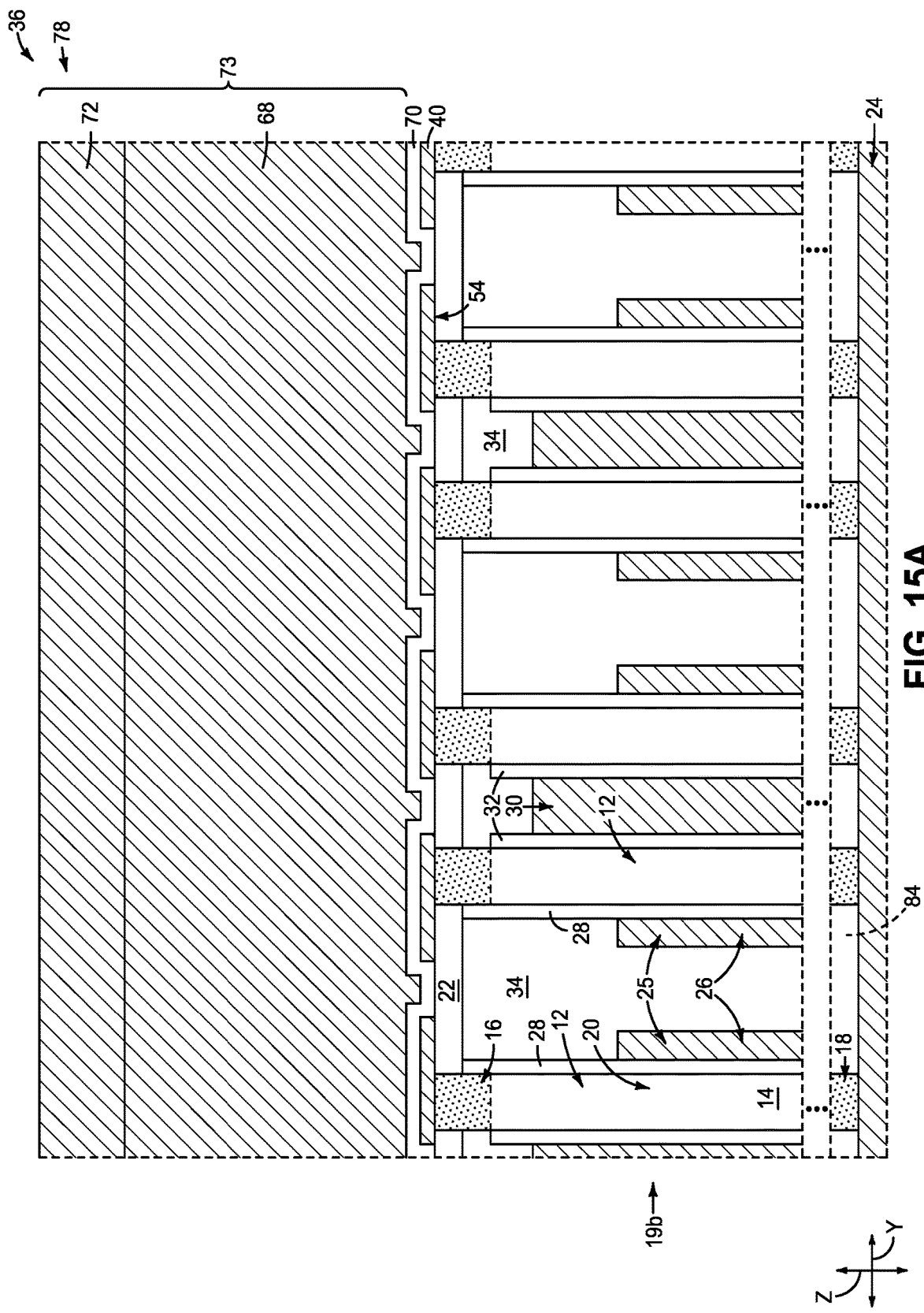
Figure 15B:
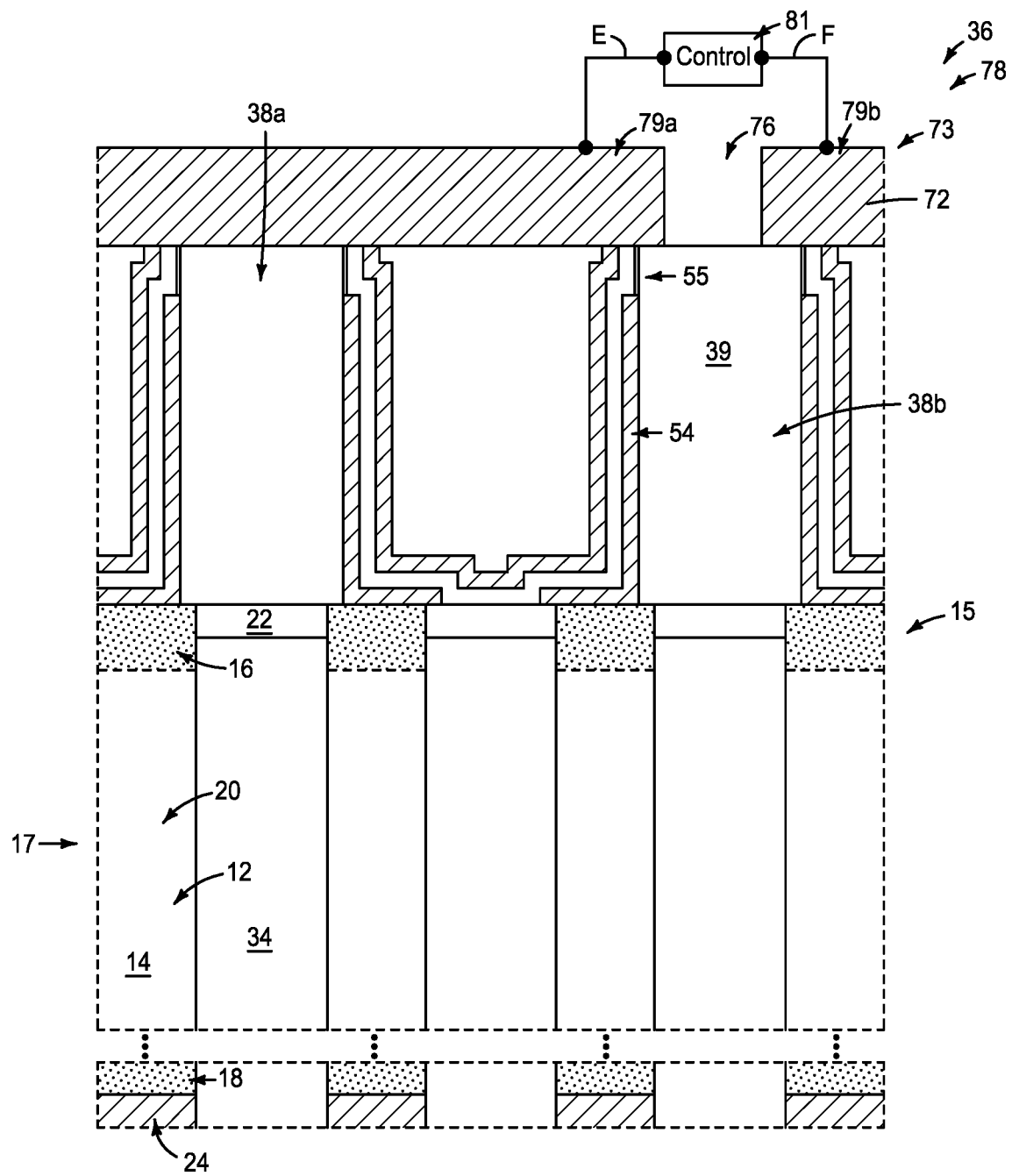

FIGS. 15-15B show the assembly 36 after a slit 76 is formed to extend through the top-electrode-material 72, and is thereby formed to extend through the plate electrode 73. In the shown embodiment, the slit 76 stops at the insulative material 39 of the insulative structure 38b. In other embodiments, the slit may penetrate into (or even through) the insulative material 39.

The slit 76 may be patterned with any suitable processing. For instance, a photoresist mask (not shown) may be used to define the location of the slit, one or more etches may be used to etch through the material 72 and form the slit in such location, and then the mask may be removed to leave the configuration of FIGS. 15-15B.

The illustrated slit 76 extends along the column direction (i.e., the illustrated y-axis direction) and is directly over the linear structure 38b. Although one slit 76 is shown, there may be additional slits formed in other embodiments.

The slit 76 subdivides the top electrode 73 into plate structures (plates) 79a and 79b. Although two of the plates 79 are formed in the shown embodiment, in other embodiments there may be a different number of plates formed depending on the number of the slits 76 formed. Generally, there will be at least two of the plates 79 formed utilizing the slit(s) 76.

Control circuitry 81 (which may also be referred to as a control circuit) may be utilized to provide desired voltages to the plates 79 (i.e., to independently control voltages to the different plates 79).

The illustrated plates 79a and 79b may be at a different voltage relative to one another. Specifically, one of the plates may be at a first voltage, and the other of the plates may be at a second voltage which is different than the first voltage. In the shown embodiment, the control circuitry 81 provides voltages E and F to the separate plates 79a and 79b of FIG. 15B. If there are more than two of the plates 79, the control circuitry 81 may provide a different voltage to at least one of the plates relative to at least one other of the plates.

The memory array 78 of FIGS. 15-15B may have any suitable configuration. An example FeRAM array 78 is described schematically with reference to FIG. 16. The memory array includes a plurality of substantially identical memory cells 80, which each include a ferroelectric capacitor 82 and an access transistor 84. Wordlines 25 extend along rows of the memory array, and digit lines 24 extend along columns of the memory array. Each of the memory cells is uniquely addressed utilizing a combination of a wordline and a digit line. The wordlines extend to driver circuitry (Wordline Driver Circuitry) 110, and the digit lines 24 extend to detecting (sensing) circuitry (Sense Amplifier Circuitry) 112. The top electrodes of the capacitors 82 are shown coupled with plate structures 79, and the plate structures are shown to be coupled with the control circuitry 81.

At least some of the circuitry 110, 112 and 81 may be directly under the memory array 78. One or more of the circuitries 110, 112 and 81 may include CMOS, and accordingly some embodiments may include CMOS-under-array architecture.

Figure 16:
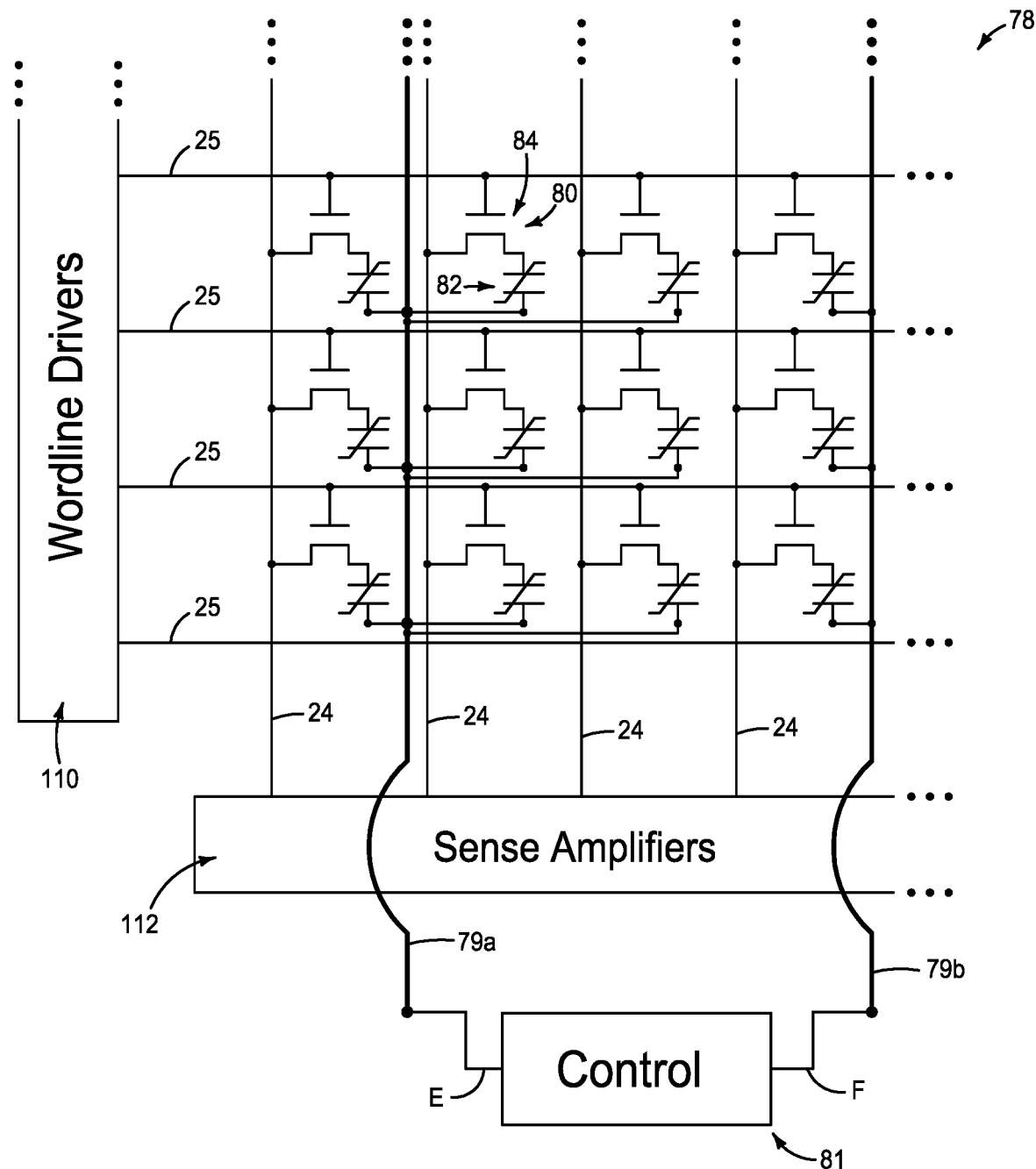
FIG. 16 is a schematic diagram of an example memory array comprising ferroelectric capacitors.
Figure 17:
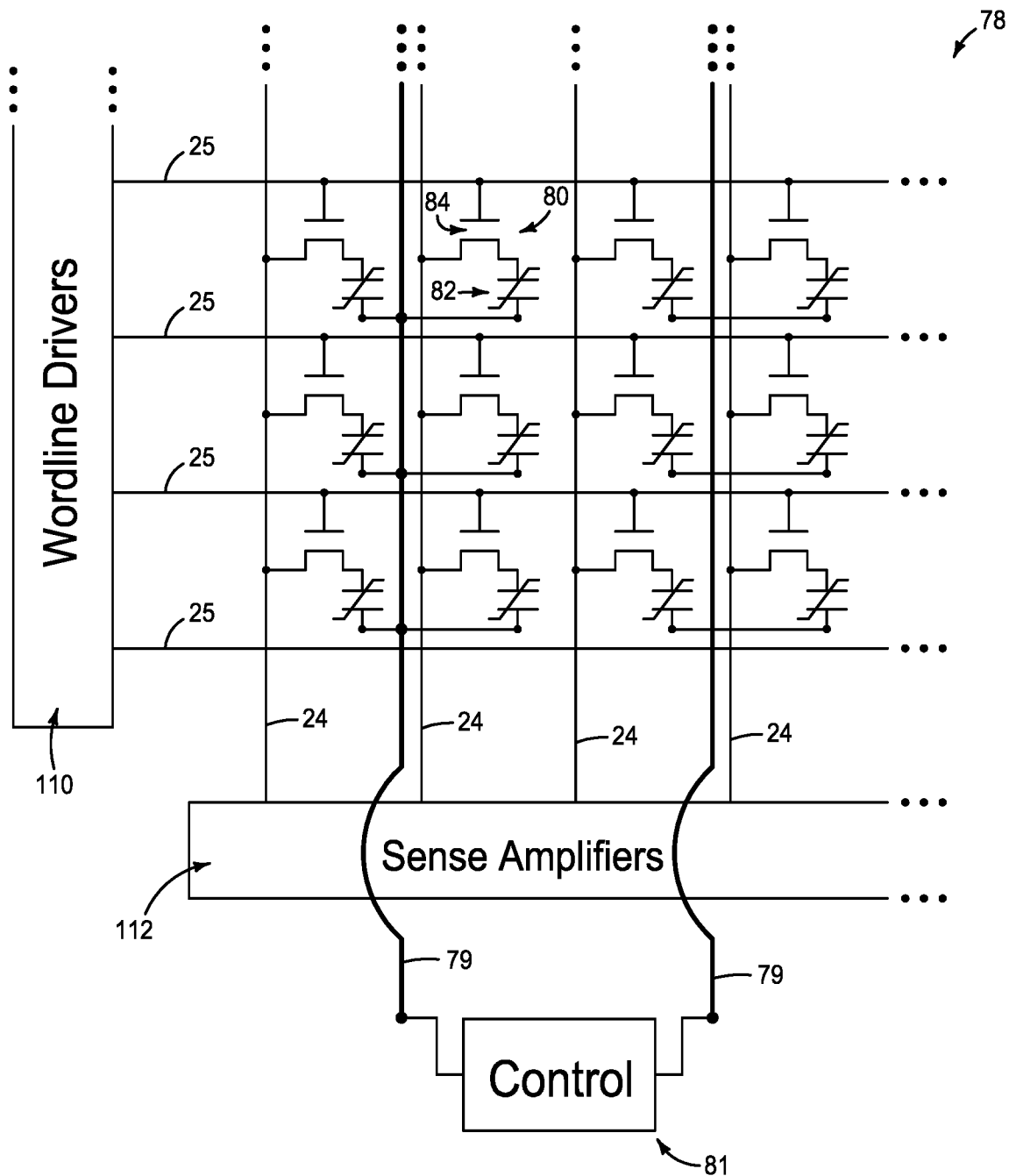
FIG. 17 is a schematic diagram of another example memory array comprising ferroelectric capacitors.

FIGS. 15 and 16 show an embodiment in which a plate structure is shared by three columns of memory cells. In other embodiments, a different number of memory cells may share a plate structure, depending on the number of slits 76 that are formed. For instance, FIG. 17 schematically illustrates a region of the memory array 78 similar to that of FIG. 16, except that two columns memory cells 80 share each of the plate structures 79.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly comprising a first pillar of semiconductor material, a second pillar of the semiconductor material proximate the first pillar and a gating structure adjacent the first pillar and extending along a first direction. An insulative structure extends along a second direction which is substantially orthogonal to the first direction. A first bottom electrode has a horizontal segment adjacent the first pillar and a vertical segment extending upwardly from the horizontal segment. A second bottom electrode has a horizontal segment adjacent the second pillar and a vertical segment extending upwardly from the horizontal segment of the second bottom electrode. The second bottom electrode is substantially a mirror image of the first bottom electrode. The vertical segments of the first and second bottom electrodes are adjacent lateral sides of the insulative structure. First and second leaker-device-structures extend upwardly from the vertical segments of the first and second bottom electrodes, respectively. Insulative-material is laterally adjacent the first and second leaker device-structures, laterally adjacent the vertical segments of the first and second bottom electrodes, and over the horizontal segments of the first and second bottom electrodes. Top-electrode-material is over the insulative-material and is directly against a top surface of the first leaker-device-structure and a top surface of the second leaker-device-structure.

Some embodiments include an integrated assembly having a first pillar of semiconductor material, and having a second pillar of the semiconductor material proximate to the first pillar. The first pillar has a first upper source/drain region and a first channel region under the first upper source/drain region, and the second pillar has a second upper source/drain region and a second channel region under the second upper source/drain region. Gating structures pass across the first and second channel regions, and extend along a first direction. An insulative structure extends along a second direction which is substantially orthogonal to the first direction. A first bottom electrode is coupled with the first upper source/drain region, and a second bottom electrode is coupled with the second upper source/drain region. The first and second bottom electrodes are configured as first and second angle plates, respectively. The second angle plate is substantially a mirror image of the first angle plate. The first and second angle plates have horizontal segments adjacent to the first and second upper source/drain regions, respectively, and have vertical segments which extend upwardly from the horizontal segments. The vertical segments of the first and second angle plates are adjacent to lateral sides of the insulative structure. First and second leaker-device-structures extend upwardly from the vertical segments of the first and second bottom electrodes, respectively. Ferroelectric-insulative-material is laterally adjacent to the first and second leaker-device-structures, laterally adjacent to the vertical segments of the first and second bottom electrodes, and over the horizontal segments of the first and second bottom electrodes. Top-electrode-material is over the ferroelectric-insulative-material and is directly against the first and second leaker-device-structures.

Some embodiments include an integrated assembly having pillars arranged in an array. The array includes a row direction and a column direction. The pillars have upper source/drain regions, lower source/drain regions, and channel regions between the upper and lower source/drain regions. Gating structures are proximate to the channel regions and extend along the row direction. Conductive structures are beneath the pillars and are coupled with the lower source/drain regions. The conductive structures extend along the column direction. Insulative structures ae above the pillars and extend along the column direction. Each of the insulative structures has a first lateral side and an opposing second lateral side, and is associated with a pair of the columns of the pillars along the first and second lateral sides. Bottom electrodes are electrically coupled with the upper source/drain regions. The bottom electrodes are configured as angle plates. The angle plates have horizontal segments adjacent to the upper source/drain regions, and have vertical segments which extend upwardly from the horizontal segments. The vertical segments are adjacent to the lateral sides of the insulative structures. The bottom electrodes include a first set adjacent the first lateral sides and a second set adjacent the second lateral sides. The first set of the bottom electrodes has their horizontal segments projecting in a first direction from their vertical segments, and the second set of the bottom electrodes has their horizontal segments projecting in a second direction from their vertical segments. The second direction is opposite to the first direction. Ferroelectric-insulative-material is over the bottom electrodes. Top-electrode-material is over the ferroelectric-insulative-material. Leaker-device-structures extend between the top-electrode-material and the bottom electrodes.

Some embodiments include a method of forming an integrated assembly. A construction is formed to have an array of pillars. The pillars comprise semiconductor material. The array comprises rows and columns, with the rows extending along a row direction and with the columns extending along a column direction. The pillars have upper source/drain regions, lower source/drain regions, and channel regions between the upper and lower source/drain regions. The construction includes gating structures which extend along the row direction, and which are proximate to the channel regions; and includes conductive structures which extend along the column direction, and which are coupled with the lower source/drain regions. The construction includes a first insulative material between the upper source/drain regions of the pillars. An upper surface of the construction extends across the first insulative material and across upper surfaces of the upper source/drain regions. Linear structures are formed over the upper surface and extend along the column direction. Each of the linear structures has a first lateral side and an opposing second lateral side, and is associated with a pair of columns of the pillars along said first and second lateral sides. Bottom-electrode-material is formed conformally along the linear structures and along regions of the upper surface between the linear structures. The bottom-electrode-material is patterned into bottom-electrode-structures. The bottom-electrode-structures have first segments along the upper surfaces of the upper source/drain regions and have second segments along the sides of the linear structures. Leaker-device-structures are formed over the bottom-electrode-structures and along the sides of the linear structures. Ferroelectric-insulative-material is formed over regions of the bottom-electrode-structures and adjacent to the leaker-device-structures. Top-electrode-material is formed over the ferroelectric-insulative-material and over the leaker-device-structures. The top-electrode-material is directly against the leaker-device-structures.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
 a first pillar of semiconductor material;
 a second pillar of the semiconductor material proximate the first pillar;
 a gating structure adjacent the first pillar and extending along a first direction;
 an insulative structure extending along a second direction which is substantially orthogonal to the first direction;
 a first bottom electrode having a horizontal segment adjacent the first pillar and a vertical segment extending upwardly from the horizontal segment;
 a second bottom electrode having a horizontal segment adjacent the second pillar and a vertical segment extending upwardly from the horizontal segment of the second bottom electrode, the second bottom electrode being substantially a mirror image of the first bottom electrode; the vertical segments of the first and second bottom electrodes being adjacent lateral sides of the insulative structure;
 first and second leaker-device-structures extending upwardly from the vertical segments of the first and second bottom electrodes, respectively;

insulative-material laterally adjacent the first and second leaker device-structures, laterally adjacent the vertical segments of the first and second bottom electrodes, and over the horizontal segments of the first and second bottom electrodes; and top-electrode-material over the insulative-material and directly against a top surface of the first leaker-device-structure and a top surface of the second leaker-device-structure.

2. The integrated assembly of claim 1, wherein the first and second bottom electrodes are L-shaped.

3. The integrated assembly of claim 1, wherein the first and second bottom electrodes are configured as angle plates.

4. The integrated assembly of claim 1, wherein the insulative-material comprises ferroelectric-insulative-material.

5. The integrated assembly of claim 1, wherein the first pillar comprises a first upper source/drain region and a first channel region under the first upper source/drain region, and wherein the first bottom electrode is coupled with the first upper source/drain region.

6. An integrated assembly, comprising:
a first pillar of semiconductor material, the semiconductor material comprising silicon;
a gating structure extending along a first direction and having a gating region operatively proximate a region of the first pillar;
a second pillar of the semiconductor material proximate the first pillar;
an insulative structure extending along a second direction which is substantially orthogonal to the first direction;
a first bottom electrode coupled with a portion of the first pillar, and a second bottom electrode coupled with a portion of the second pillar; the first and second bottom electrodes being configured as first and second angle plates, respectively; the second angle plate being substantially a mirror image of the first angle plate; the first and second angle plates having horizontal segments adjacent the portions of the first and second pillars, respectively, and having vertical segments extending from the horizontal segments; the vertical segments of the first and second angle plates being adjacent lateral sides of the insulative structure;
first and second leaker-device-structures extending upwardly from the vertical segments of the first and second bottom electrodes, respectively;
ferroelectric-insulative-material laterally adjacent the first and second leaker-device-structures, laterally adjacent the vertical segments of the first and second bottom electrodes, and over the horizontal segments of the first and second bottom electrodes; and
top-electrode-material over the ferroelectric-insulative-material and directly against the first and second leaker-device-structures.

7. The integrated assembly of claim 6 further comprising a slit passing through the top-electrode-material and extending along the second direction, the slit being directly over the insulative structure.

8. An integrated assembly, comprising:
a first pillar of semiconductor material; the first pillar comprising a first upper source/drain region and a first channel region under the first upper source/drain region;
a gating structure extending along a first direction and having a gating region operatively proximate the first channel region;
a second pillar of the semiconductor material proximate the first pillar; the second pillar comprising a second upper source/drain region and a second channel region under the second upper source/drain region;
an insulative structure extending along a second direction which is substantially orthogonal to the first direction;
a first bottom electrode coupled with the first upper source/drain region, and a second bottom electrode coupled with the second upper source/drain region; the first and second bottom electrodes being configured as first and second angle plates, respectively; the second angle plate being substantially a mirror image of the first angle plate; the first and second angle plates having horizontal segments adjacent the first and second upper source/drain regions, respectively, and having vertical segments extending upwardly from the horizontal segments; the vertical segments of the first and second angle plates being adjacent lateral sides of the insulative structure;
first and second leaker-device-structures extending upwardly from the vertical segments of the first and second bottom electrodes, respectively;
ferroelectric-insulative-material laterally adjacent the first and second leaker-device-structures, laterally adjacent the vertical segments of the first and second bottom electrodes, and over the horizontal segments of the first and second bottom electrodes; and
top-electrode-material over the ferroelectric-insulative-material and directly against the first and second leaker-device-structures.

9. The integrated assembly of claim 8 further comprising a slit passing through the top-electrode-material and extending along the second direction, the slit being directly over the insulative structure.

10. The integrated assembly of claim 8 wherein the vertical segments are longer than the horizontal segments.

11. The integrated assembly of claim 8 wherein the first and second leaker-device-structures are less than or equal to about 10 nm in vertical length.

12. The integrated assembly of claim 8 wherein the first and second leaker-device-structures have lateral thicknesses within a range of from about 2 Å to about 20 Å.

13. The integrated assembly of claim 8 wherein the first and second leaker-device-structures have lateral thicknesses within a range of from about 6 Å to about 15 Å.

14. The integrated assembly of claim 8 wherein the first and second leaker-device-structures comprise one or more of Ti, Ni and Nb, in combination with one or more of Ge, Si, O, N and C.

15. The integrated assembly of claim 8 wherein the first and second leaker-device-structures comprise one or more of Si, Ge, SiN, TiSiN, TiO, TiN, NiO, NiON and TiON, where the chemical formulas indicate primary constituents rather than particular stoichiometries.

16. The integrated assembly of claim 8 wherein the first and second leaker-device-structures comprise titanium, oxygen and nitrogen.

17. An integrated assembly, comprising:
pillars arranged in an array; the array comprising a row direction and a column direction; the pillars having upper source/drain regions, lower source/drain regions, and channel regions between the upper and lower source/drain regions;
gating structures proximate the channel regions and extending along the row direction;

conductive structures beneath the pillars and coupled with the lower source/drain regions; the conductive structures extending along the column direction;

insulative structures above the pillars and extending along the column direction; each of the insulative structures having a first lateral side and an opposing second lateral side, and being associated with a pair of the columns of the pillars along said first and second lateral sides;

bottom electrodes coupled with the upper source/drain regions; the bottom electrodes being configured as angle plates; the angle plates having horizontal segments adjacent the upper source/drain regions and having vertical segments extending upwardly from the horizontal segments; the vertical segments being adjacent the lateral sides of the insulative structures;

the bottom electrodes including a first set adjacent the first lateral sides and a second set adjacent the second lateral sides; the first set of the bottom electrodes having their horizontal segments projecting in a first direction from their vertical segments; the second set of the bottom electrodes having their horizontal segments projecting in a second direction from their vertical segments; the second direction being opposite to the first direction;

insulative-material over the bottom electrodes;

top-electrode-material over the insulative-material; and leaker-device-structures extending between the top-electrode-material and the bottom electrodes.

18. The integrated assembly of claim 17 further comprising one or more slits passing through the top-electrode-material and extending along the column direction; each of said one or more slits being directly over an associated one of the insulative structures.

19. The integrated assembly of claim 18 wherein said one or more slits subdivide the top-electrode-material into two or more plate structures; and wherein a first voltage associated with at least one of said two or more plate structures is independently controlled relative to a second voltage associated with at least one other of said two or more plate structures.

20. The integrated assembly of claim 19 the first and second voltages are controlled with a control circuit which is coupled with said two or more plate structures.

21. The integrated assembly of claim 17 wherein the insulative structures comprise silicon dioxide.

22. The integrated assembly of claim 17 wherein the insulative structures comprise silicon nitride.

23. The integrated assembly of claim 17 wherein the vertical segments are longer than the horizontal segments.

24. The integrated assembly of claim 17 wherein the insulative-material is ferroelectric-insulative-material.

25. The integrated assembly of claim 24 wherein the ferroelectric-insulative-material is directly against the bottom electrodes.

26. The integrated assembly of claim 24 wherein the ferroelectric-insulative-material comprises one or more of zirconium, zirconium oxide, niobium, niobium oxide, hafnium, hafnium oxide, lead zirconium titanate, and barium strontium titanate.

27. The integrated assembly of claim 24 wherein the ferroelectric-insulative-material further includes dopant comprising one or more of silicon, aluminum, lanthanum, yttrium, erbium, calcium, magnesium and strontium.

28. A method of forming an integrated assembly, comprising:

forming a construction having an array of pillars comprising semiconductor material; the array comprising rows and columns, with the rows extending along a row direction and with the columns extending along a column direction; the pillars having upper source/drain regions, lower source/drain regions, and channel regions between the upper and lower source/drain regions; the construction including gating structures extending along the row direction and being proximate the channel regions, and including conductive structures extending along the column direction and being coupled with the lower source/drain regions; the construction including a first insulative material between the upper source/drain regions of the pillars; an upper surface of the construction extending across the first insulative material and across upper surfaces of the upper source/drain regions;

forming linear structures over the upper surface and extending along the column direction; each of the linear structures having a first lateral side and an opposing second lateral side, and being associated with a pair of columns of the pillars along said first and second lateral sides;

forming bottom-electrode-material along the linear structures;

patterning the bottom-electrode-material into bottom-electrode-structures; the bottom-electrode-structures having first segments along the upper surfaces of the upper source/drain regions and having second segments along the lateral sides of the linear structures;

forming leaker-device-structures over the bottom-electrode-structures and along the lateral sides of the linear structures;

forming ferroelectric-insulative-material over regions of the bottom-electrode-structures and adjacent the leaker-device-structures; and forming top-electrode-material over the ferroelectric-insulative-material and over the leaker-device-structures, the top-electrode-material being directly against the leaker-device-structures.

29. The method of claim 28 further comprising forming one or more slits to pass through the top-electrode-material; said one or more slits extending along the column direction and being directly over one or more of the linear structures; said one or more slits dividing the top-electrode-material into two or more plates.

30. The method of claim 29 further comprising coupling said two or more plates with control circuitry configured to selectively control voltage to the two or more plates.

31. The method of claim 28 wherein the linear structures laterally overlap the upper source/drain regions of the associated columns of the pillars.

32. The method of claim 28 wherein the first segments are substantially orthogonal to the second segments.

33. The method of claim 28 wherein the linear structures comprise silicon dioxide.

34. The method of claim 28 wherein the linear structures comprise silicon nitride.

35. The method of claim 28 further comprising:

forming leaker-device-material to extend over tops of the linear structures and along the lateral sides of the linear structures; and removing the leaker-device-material from over the tops of the linear structures and patterning the leaker-device-material into the leaker-device-structures.

36. The method of claim 35 wherein the leaker-device-material is continuous and has a thickness within a range of from about 6 Å to about 15 Å.

37. The method of claim 35 wherein the leaker-device-material comprises one or more of Ti, Ni and Nb, in combination with one or more of Ge, Si, O, N and C.

38. The method of claim 35 wherein the leaker-device-material comprises one or more of Si, Ge, SiN, TiSiN, TiO, TiN, NiO, NiON and TiON, where the chemical formulas indicate primary constituents rather than particular stoichiometries.

39. The method of claim 28 wherein the ferroelectric-insulative-material comprises one or more of zirconium, zirconium oxide, niobium, niobium oxide, hafnium, hafnium oxide, lead zirconium titanate, and barium strontium titanate.

40. The method of claim 39 wherein the ferroelectric-insulative-material further includes dopant comprising one or more of silicon, aluminum, lanthanum, yttrium, erbium, calcium, magnesium and strontium.

* * * * *

UNITED STATES PATENT AND TRADEMARK OFFICE
CERTIFICATE OF CORRECTION

PATENT NO. : 11,695,072 B2
APPLICATION NO. : 17/371506
DATED : July 4, 2023
INVENTOR(S) : Marcello Mariani and Giorgio Servalli It is certified that error appears in the above-identified patent and that said Letters Patent is hereby corrected as shown below:

In the Claims

Column 21, Line 6, in Claim 38, – Replace "NiON and TION," with --NiON and TiON,--

Signed and Sealed this
Twenty-ninth Day of August, 2023

*Katherine Kelly Vidal*

Katherine Kelly Vidal
*Director of the United States Patent and Trademark Office*